US011935959B2

United States Patent
Koezuka et al.

(10) Patent No.: US 11,935,959 B2
(45) Date of Patent: Mar. 19, 2024

(54) SEMICONDUCTOR DEVICE COMPRISING OXIDE SEMICONDUCTOR FILM COMPRISING NANOCRYSTAL

(71) Applicant: Semiconductor Energy Laboratory Co., Ltd., Atsugi (JP)

(72) Inventors: Junichi Koezuka, Tochigi (JP); Toshinari Sasaki, Shinagawa (JP); Katsuaki Tochibayashi, Isehara (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/964,203

(22) Filed: Oct. 12, 2022

(65) Prior Publication Data

US 2023/0044086 A1 Feb. 9, 2023

Related U.S. Application Data

(63) Continuation of application No. 16/897,586, filed on Jun. 10, 2020, now Pat. No. 11,515,426, which is a (Continued)

(30) Foreign Application Priority Data

Jul. 20, 2012 (JP) ................... 2012-161688

(51) Int. Cl.
*H01L 29/786* (2006.01)
*H01L 27/12* (2006.01)
(Continued)

(52) U.S. Cl.
CPC .... *H01L 29/78606* (2013.01); *H01L 27/1225* (2013.01); *H01L 27/1248* (2013.01);
(Continued)

(58) Field of Classification Search
CPC ............ H01L 27/1225; H01L 27/1248; H01L 29/66742; H01L 29/7869; H01L 27/14612;
(Continued)

(56) References Cited

U.S. PATENT DOCUMENTS 5,336,626 A  8/1994 Lee
5,731,856 A  3/1998 Kim et al.
(Continued)

FOREIGN PATENT DOCUMENTS

CN  102544026 A  7/2012
EP  1737044 A  12/2006
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
(Continued)

*Primary Examiner* — Jami Valentine Miller
(74) *Attorney, Agent, or Firm* — Eric J. Robinson; Robinson Intellectual Property Law Office, P.C.

(57) ABSTRACT

A change in electrical characteristics of a semiconductor device including an interlayer insulating film over a transistor including an oxide semiconductor as a semiconductor film is suppressed. The structure includes a first insulating film which includes a void portion in a step region formed by a source electrode and a drain electrode over the semiconductor film and contains silicon oxide as a component, and a second insulating film containing silicon nitride, which is provided in contact with the first insulating film to cover the void portion in the first insulating film. The
(Continued)

structure can prevent the void portion generated in the first insulating film from expanding outward.

4 Claims, 27 Drawing Sheets

Related U.S. Application Data continuation of application No. 16/413,860, filed on May 16, 2019, now Pat. No. 10,693,010, which is a continuation of application No. 15/872,154, filed on Jan. 16, 2018, now Pat. No. 10,347,768, which is a continuation of application No. 15/450,391, filed on Mar. 6, 2017, now Pat. No. 9,905,696, which is a continuation of application No. 15/351,775, filed on Nov. 15, 2016, now Pat. No. 9,780,219, which is a continuation of application No. 14/861,289, filed on Sep. 22, 2015, now Pat. No. 9,548,393, which is a continuation of application No. 13/942,504, filed on Jul. 15, 2013, now Pat. No. 9,184,297.

(51) Int. Cl.

| | | |
|---|---|---|
| *H01L 27/146* | (2006.01) | |
| *H01L 29/66* | (2006.01) | |
| *G02F 1/133* | (2006.01) | |
| *G02F 1/1333* | (2006.01) | |
| *G02F 1/1339* | (2006.01) | |
| *G02F 1/1343* | (2006.01) | |
| *G02F 1/1362* | (2006.01) | |
| *G02F 1/1368* | (2006.01) | |
| *G06F 3/041* | (2006.01) | |
| *H01L 27/15* | (2006.01) | |
| *H10K 59/121* | (2023.01) | |
| *H10K 59/124* | (2023.01) | |

(52) U.S. Cl.
CPC .. *H01L 27/14616* (2013.01); *H01L 29/66742* (2013.01); *H01L 29/7869* (2013.01); *G02F 1/13306* (2013.01); *G02F 1/133345* (2013.01); *G02F 1/1339* (2013.01); *G02F 1/134309* (2013.01); *G02F 1/13439* (2013.01); *G02F 1/136227* (2013.01); *G02F 1/1368* (2013.01); *G02F 2201/121* (2013.01); *G06F 3/0412* (2013.01); *H01L 27/14612* (2013.01); *H01L 27/15* (2013.01); *H10K 59/1213* (2023.02); *H10K 59/124* (2023.02)

(58) Field of Classification Search
CPC .............. H10K 59/1213; H10K 59/124; G02F 1/136227; G02F 1/1368
USPC .......................................................... 257/43
See application file for complete search history.

(56) References Cited

U.S. PATENT DOCUMENTS

| | | | |
|---|---|---|---|
| 5,744,864 | A | 4/1998 | Cillessen et al. |
| 6,071,809 | A | 6/2000 | Zhao |
| 6,294,274 | B1 | 9/2001 | Kawazoe et al. |
| 6,309,958 | B1 | 10/2001 | Okada |
| 6,518,144 | B2 | 2/2003 | Nitta et al. |
| 6,563,174 | B2 | 5/2003 | Kawasaki et al. |
| 6,727,522 | B1 | 4/2004 | Kawasaki et al. |
| 6,849,546 | B1 | 2/2005 | Tu et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,262,142 | B2 | 8/2007 | Nakata et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 8,293,595 | B2 | 10/2012 | Yamazaki et al. |
| 8,319,218 | B2 | 11/2012 | Yamazaki et al. |
| 8,324,027 | B2 | 12/2012 | Yamazaki et al. |
| 8,324,625 | B2 | 12/2012 | Aburaya et al. |
| 8,324,626 | B2 | 12/2012 | Kimura et al. |
| 8,378,351 | B2 | 2/2013 | Fukumoto et al. |
| 8,421,067 | B2 | 4/2013 | Yamazaki et al. |
| 8,427,595 | B2 | 4/2013 | Yamazaki et al. |
| 8,441,011 | B2 | 5/2013 | Yamazaki et al. |
| 8,502,225 | B2 | 8/2013 | Yamazaki et al. |
| 8,546,161 | B2 | 10/2013 | Yamazaki et al. |
| 8,624,239 | B2 | 1/2014 | Nishijima |
| 8,729,550 | B2 | 5/2014 | Yamazaki et al. |
| 8,759,132 | B2 | 6/2014 | Kimura et al. |
| 8,790,960 | B2 | 7/2014 | Yamazaki |
| 8,792,260 | B2 | 7/2014 | Fujita |
| 8,835,920 | B2 | 9/2014 | Yamazaki et al. |
| 8,841,710 | B2 | 9/2014 | Yamazaki et al. |
| 8,854,583 | B2 | 10/2014 | Kubota et al. |
| 8,865,534 | B2 | 10/2014 | Yamazaki |
| 8,884,651 | B2 | 11/2014 | Yamazaki et al. |
| 8,952,726 | B2 | 2/2015 | Yamazaki et al. |
| 8,957,411 | B2 | 2/2015 | Yamazaki et al. |
| 8,987,048 | B2 | 3/2015 | Yamazaki et al. |
| 9,054,138 | B2 | 6/2015 | Yamazaki et al. |
| 9,147,754 | B2 | 9/2015 | Yamazaki |
| 9,171,867 | B2 | 10/2015 | Kimura et al. |
| 9,184,185 | B2 | 11/2015 | Yamazaki et al. |
| 9,184,297 | B2 | 11/2015 | Koezuka et al. |
| 9,190,524 | B2 | 11/2015 | Miyamoto |
| 9,245,484 | B2 | 1/2016 | Yamazaki et al. |
| 9,257,082 | B2 | 2/2016 | Kimura et al. |
| 9,306,072 | B2 | 4/2016 | Yamazaki et al. |
| 9,431,465 | B2 | 8/2016 | Yamazaki et al. |
| 9,449,852 | B2 | 9/2016 | Yamazaki |
| 9,490,277 | B2 | 11/2016 | Yamazaki et al. |
| 9,548,393 | B2 | 1/2017 | Koezuka et al. |
| 9,553,583 | B2 | 1/2017 | Yamazaki et al. |
| 9,754,974 | B2 | 9/2017 | Yamazaki et al. |
| 9,780,219 | B2 | 10/2017 | Koezuka et al. |
| 9,905,696 | B2 | 2/2018 | Koezuka et al. |
| 9,911,856 | B2 | 3/2018 | Yamazaki et al. |
| 9,947,695 | B2 | 4/2018 | Yamazaki et al. |
| 9,954,005 | B2 | 4/2018 | Kimura et al. |
| 10,002,891 | B2 | 6/2018 | Yamazaki et al. |
| 10,134,912 | B2 | 11/2018 | Kimura et al. |
| 10,157,936 | B2 | 12/2018 | Yamazaki et al. |
| 10,347,768 | B2 | 7/2019 | Koezuka et al. |
| 10,522,568 | B2 | 12/2019 | Yamazaki et al. |
| 10,593,710 | B2 | 3/2020 | Yamazaki et al. |
| 10,672,915 | B2 | 6/2020 | Yamazaki et al. |
| 10,693,010 | B2 | 6/2020 | Koezuka et al. |
| 10,700,215 | B2 | 6/2020 | Kimura et al. |
| 10,916,566 | B2 | 2/2021 | Yamazaki et al. |
| 11,024,747 | B2 | 6/2021 | Yamazaki et al. |
| 11,056,515 | B2 | 7/2021 | Yamazaki et al. |
| 11,069,817 | B2 | 7/2021 | Kimura et al. |
| 11,430,899 | B2 | 8/2022 | Kimura et al. |
| 11,515,426 | B2 | 11/2022 | Koezuka et al. |
| 11,652,174 | B2 | 5/2023 | Kimura et al. |
| 2001/0009801 | A1 | 7/2001 | Mouli et al. |
| 2001/0046027 | A1 | 11/2001 | Tai et al. |
| 2002/0028584 | A1 | 3/2002 | Oku et al. |

(56) References Cited

U.S. PATENT DOCUMENTS

| | | |
|---|---|---|
| 2002/0036349 A1 | 3/2002 | Saito et al. |
| 2002/0056838 A1 | 5/2002 | Ogawa |
| 2002/0132454 A1 | 9/2002 | Ohtsu et al. |
| 2003/0015764 A1 | 1/2003 | Raaijmakers et al. |
| 2003/0189401 A1 | 10/2003 | Kido et al. |
| 2003/0218222 A1 | 11/2003 | Wager, III et al. |
| 2004/0005751 A1 | 1/2004 | Cha |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0128166 A1 | 6/2006 | Nakata et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0019126 A1 | 1/2007 | Rhee et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0153152 A1 | 7/2007 | Wang et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0001480 A1 | 1/2009 | Cheng |
| 2009/0065759 A1 | 3/2009 | Kim |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0242893 A1* | 10/2009 | Tomiyasu ......... G02F 1/136286 438/459 |
| 2009/0278122 A1 | 11/2009 | Hosono et al. |
| 2009/0280600 A1 | 11/2009 | Hosono et al. |
| 2009/0321853 A1 | 12/2009 | Cheng |
| 2010/0025675 A1 | 2/2010 | Yamazaki et al. |
| 2010/0025678 A1 | 2/2010 | Yamazaki et al. |
| 2010/0025679 A1 | 2/2010 | Yamazaki et al. |
| 2010/0051940 A1* | 3/2010 | Yamazaki ......... H01L 29/78696 257/E29.296 |
| 2010/0065844 A1 | 3/2010 | Tokunaga |
| 2010/0092800 A1 | 4/2010 | Itagaki et al. |
| 2010/0102311 A1 | 4/2010 | Ito et al. |
| 2010/0109002 A1 | 5/2010 | Itagaki et al. |
| 2010/0133525 A1 | 6/2010 | Arai et al. |
| 2010/0308324 A1 | 12/2010 | Kim et al. |
| 2011/0001916 A1 | 1/2011 | Wang et al. |
| 2011/0014745 A1 | 1/2011 | Miyanaga |
| 2011/0068336 A1 | 3/2011 | Yamazaki et al. |
| 2011/0079778 A1 | 4/2011 | Yamazaki et al. |
| 2011/0092017 A1 | 4/2011 | Akimoto et al. |
| 2011/0101335 A1 | 5/2011 | Yamazaki et al. |
| 2011/0114999 A1 | 5/2011 | Yamazaki et al. |
| 2011/0117698 A1 | 5/2011 | Suzawa et al. |
| 2011/0127524 A1 | 6/2011 | Yamazaki et al. |
| 2011/0220879 A1 | 9/2011 | Im et al. |
| 2011/0240988 A1 | 10/2011 | Yano et al. |
| 2011/0263091 A1 | 10/2011 | Yamazaki |
| 2012/0012836 A1 | 1/2012 | Sasagawa et al. |
| 2012/0043523 A1 | 2/2012 | Tu et al. |
| 2012/0061671 A1 | 3/2012 | Hatano |
| 2012/0132903 A1 | 5/2012 | Yamazaki et al. |
| 2012/0138922 A1 | 6/2012 | Yamazaki et al. |
| 2012/0146029 A1 | 6/2012 | Choi et al. |
| 2012/0161132 A1 | 6/2012 | Yamazaki |
| 2012/0248433 A1 | 10/2012 | Nakano et al. |
| 2012/0319113 A1 | 12/2012 | Yamazaki |
| 2013/0270550 A1 | 10/2013 | Okazaki et al. |
| 2013/0299820 A1* | 11/2013 | Miyamoto ......... H01L 29/66742 257/43 |
| 2014/0264896 A1 | 9/2014 | Lu et al. |
| 2015/0060850 A1 | 3/2015 | Yamazaki et al. |
| 2016/0118412 A1 | 4/2016 | Yamazaki et al. |
| 2016/0201187 A1 | 7/2016 | Yano et al. |
| 2017/0005182 A1 | 1/2017 | Yamazaki |
| 2017/0221932 A1 | 8/2017 | Yamazaki et al. |
| 2018/0026140 A1* | 1/2018 | Yamazaki ........... H01L 21/4757 257/43 |
| 2020/0091200 A1 | 3/2020 | Yamazaki et al. |
| 2021/0074862 A1 | 3/2021 | Yamazaki et al. |
| 2021/0104556 A1 | 4/2021 | Yamazaki et al. |
| 2021/0296371 A1 | 9/2021 | Yamazaki et al. |
| 2021/0391479 A1* | 12/2021 | Yamazaki ......... H01L 29/78693 |
| 2023/0299209 A1 | 9/2023 | Kimura et al. |

FOREIGN PATENT DOCUMENTS

| | | |
|---|---|---|
| EP | 2226847 A | 9/2010 |
| EP | 3249698 A | 11/2017 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-027794 A | 1/1998 |
| JP | 11-505377 | 5/1999 |
| JP | 11-233510 A | 8/1999 |
| JP | 2000-044236 A | 2/2000 |
| JP | 2000-150900 A | 5/2000 |
| JP | 2001-250954 A | 9/2001 |
| JP | 2002-075987 A | 3/2002 |
| JP | 2002-076356 A | 3/2002 |
| JP | 2002-289859 A | 10/2002 |
| JP | 2003-086000 A | 3/2003 |

(56) References Cited

FOREIGN PATENT DOCUMENTS

| | | |
|---|---|---|
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-128469 A | 5/2006 |
| JP | 2006-165528 A | 6/2006 |
| JP | 2006-190962 A | 7/2006 |
| JP | 2007-027664 A | 2/2007 |
| JP | 2007-183633 A | 7/2007 |
| JP | 2010-056546 A | 3/2010 |
| JP | 2010-191283 A | 9/2010 |
| JP | 2011-018786 A | 1/2011 |
| JP | 2011-035388 A | 2/2011 |
| JP | 2011-049550 A | 3/2011 |
| JP | 2011-054951 A | 3/2011 |
| JP | 2011-076079 A | 4/2011 |
| JP | 2011-100979 A | 5/2011 |
| JP | 2011-100981 A | 5/2011 |
| JP | 2011-103453 A | 5/2011 |
| JP | 2011-107697 A | 6/2011 |
| JP | 2011-171407 A | 9/2011 |
| JP | 2011-222767 A | 11/2011 |
| JP | 2011-237778 A | 11/2011 |
| JP | 2011-243973 A | 12/2011 |
| JP | 2011-249788 A | 12/2011 |
| JP | 2012-004552 A | 1/2012 |
| JP | 2012-079691 A | 4/2012 |
| JP | 2012-084866 A | 4/2012 |
| JP | 2012-095522 A | 5/2012 |
| JP | 2012-124463 A | 6/2012 |
| JP | 2012-133374 A | 7/2012 |
| JP | 2012-253375 A | 12/2012 |
| KR | 2006-0062702 A | 6/2006 |
| KR | 2011-0076916 A | 7/2011 |
| KR | 2011-0101771 A | 9/2011 |
| KR | 2012-0049886 A | 5/2012 |
| KR | 2012-0063809 A | 6/2012 |
| KR | 2012-0071395 A | 7/2012 |
| KR | 2013-0045418 A | 5/2013 |
| KR | 2013-0055607 A | 5/2013 |
| TW | I325077 | 5/2010 |
| TW | 201203388 | 1/2012 |
| TW | 201214712 | 4/2012 |
| TW | I570927 | 2/2017 |
| TW | 201804621 | 2/2018 |
| TW | 201907569 | 2/2019 |
| WO | WO-2004/114391 | 12/2004 |
| WO | WO-2010/023889 | 3/2010 |
| WO | WO-2010/032639 | 3/2010 |
| WO | WO-2011/004755 | 1/2011 |
| WO | WO-2011/010544 | 1/2011 |
| WO | WO-2011/013502 | 2/2011 |
| WO | WO-2011/027661 | 3/2011 |
| WO | WO-2011/043176 | 4/2011 |
| WO | WO-2011/043206 | 4/2011 |
| WO | WO-2011/046015 | 4/2011 |
| WO | WO-2011/048923 | 4/2011 |
| WO | WO-2011/132556 | 10/2011 |
| WO | WO-2011/132625 | 10/2011 |
| WO | WO-2012/032749 | 3/2012 |
| WO | WO-2014/013959 | 1/2014 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID

(56) References Cited

OTHER PUBLICATIONS

Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits, 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel, YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects In ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies In ZnO", Appl. Phys. Lett. (Applied Physics Letters), 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

International Search Report (Application No. PCT/JP2013/069232) dated Aug. 20, 2013.

Written Opinion (Application No. PCT/JP2013/069232) dated Aug. 20, 2013.

Void, http://search.credoreference.com/content/entry/hmdictenglang/void/0, 2011, p. 3, The American Heritage Dictionary of the English language.

Physical Constants of Inorganic Compounds, CRC Handbook of Chemistry and Physics 97th Edition, pp. 4-84.

Taiwanese Office Action (Application No. 106125761) dated Nov. 28, 2017.

Taiwanese Office Action (Application No. 106125761) dated Dec. 13, 2018.

Taiwanese Office Action (Application No. 106125761) dated Nov. 7, 2019.

Taiwanese Office Action (Application No. 107122525) dated Nov. 7, 2019.

Taiwanese Office Action (Application No. 108122347) dated Apr. 20, 2020.

Taiwanese Office Action (Application No. 109124556) dated Apr. 26, 2021.

Taiwanese Office Action (Application No. 110126383) dated Mar. 16, 2023.

* cited by examiner

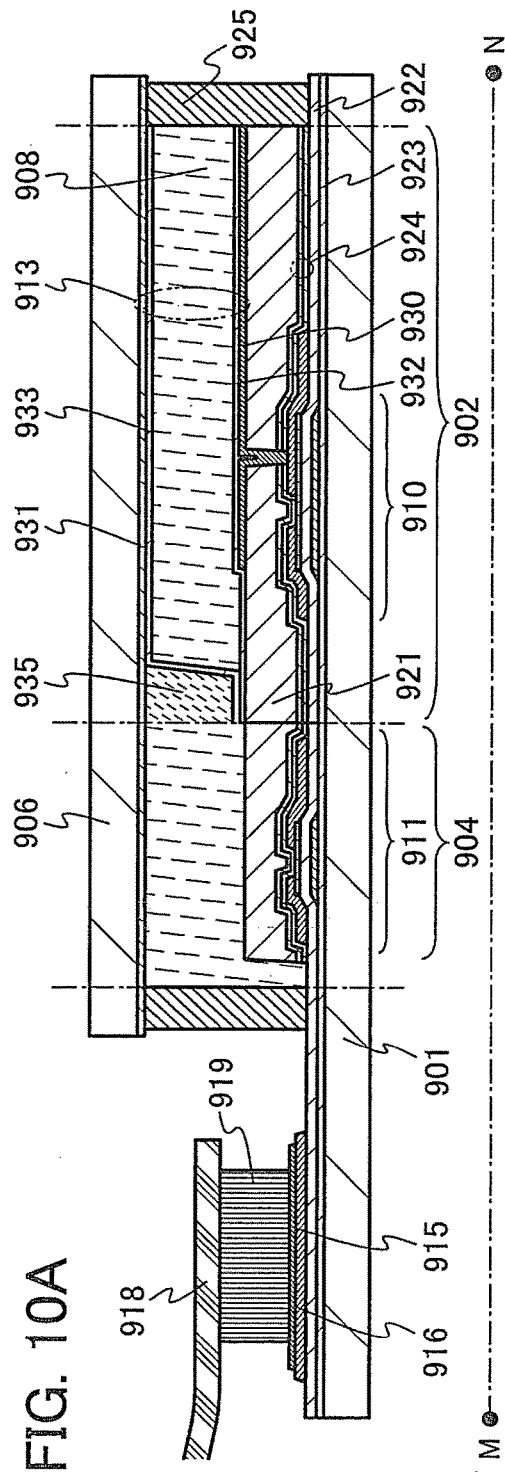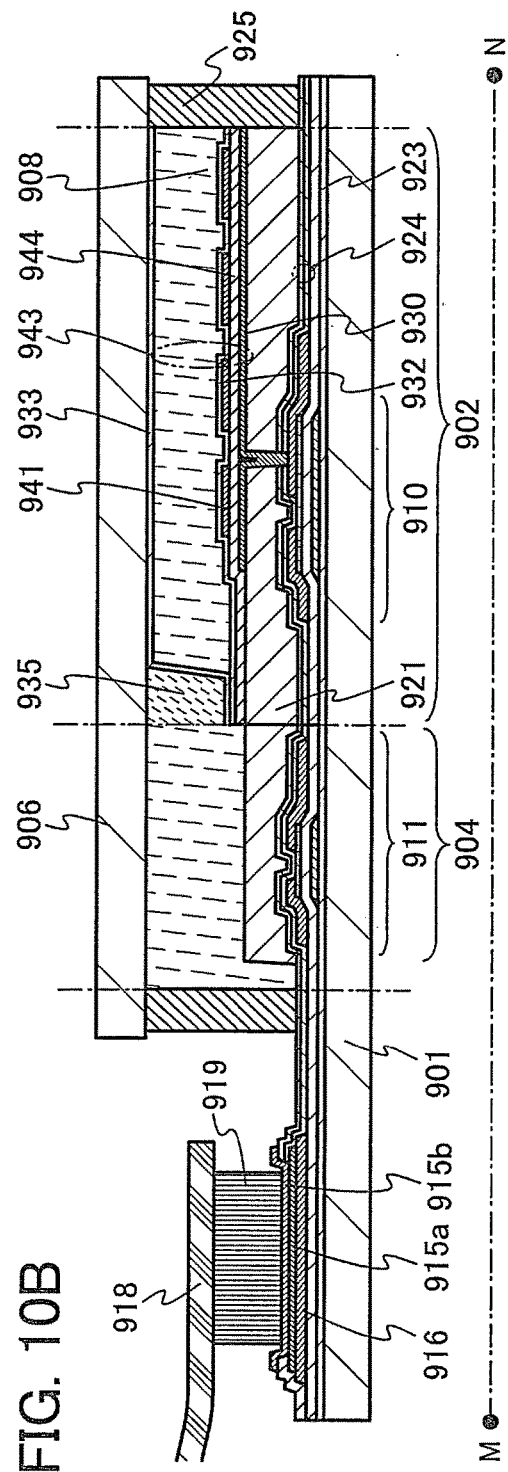

Sample A1

Sample A2

Sample A3

Sample A4

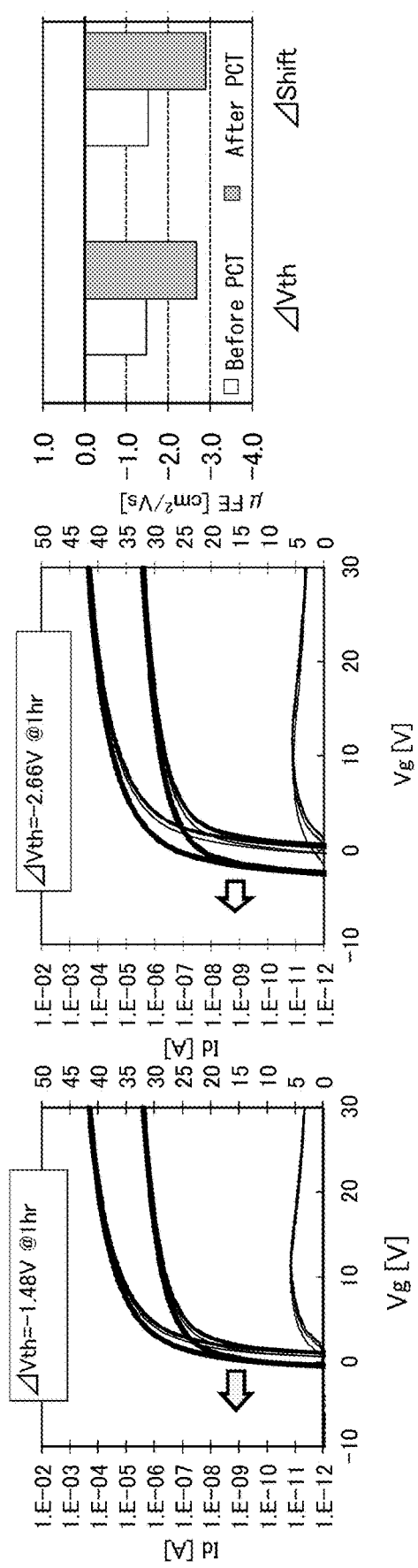
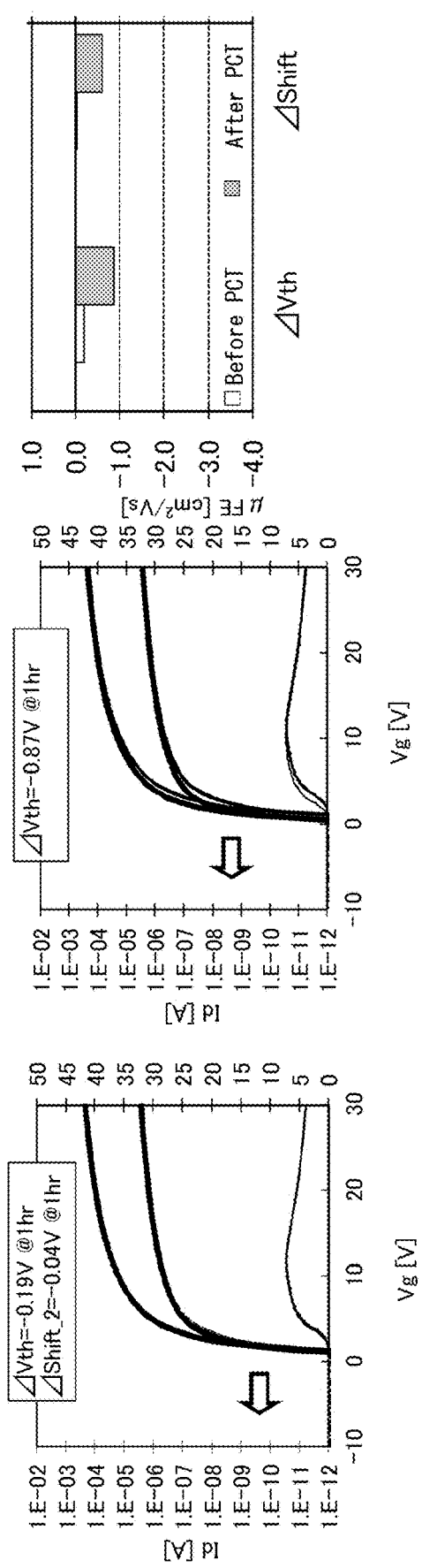
FIG. 20A1  FIG. 20A2  FIG. 20A3
FIG. 20B1  FIG. 20B2  FIG. 20B3

SEMICONDUCTOR DEVICE COMPRISING OXIDE SEMICONDUCTOR FILM COMPRISING NANOCRYSTAL

TECHNICAL FIELD

The invention disclosed in this specification and the like relates to a semiconductor device and a method for manufacturing the semiconductor device.

In this specification and the like, a "semiconductor device" generally refers to a device which can function by utilizing semiconductor characteristics: an electro-optical device, an image display device, a semiconductor circuit, and an electronic device are all semiconductor devices.

BACKGROUND ART

A technique by which transistors are formed using semiconductor thin films formed over a substrate having an insulating surface has been attracting attention. Such transistors are applied to a wide range of electronic devices such as integrated circuits (IC) and image display devices (also simply referred to as display devices). A silicon-based semiconductor material is widely known as a material for a semiconductor thin film applicable to a transistor. As another material, an oxide semiconductor has been attracting attention.

For example, a technique for forming a transistor using zinc oxide or an In—Ga—Zn-based oxide semiconductor as an oxide semiconductor is disclosed (see Patent Document 1).

REFERENCE

Patent Document

[Patent Document 1] Japanese Published Patent Application No. 2006-165528

DISCLOSURE OF INVENTION

For example, in the case where a semiconductor device (e.g., a liquid crystal panel) is manufactured using a transistor including an oxide semiconductor, it is necessary to provide an interlayer insulating film over the transistor including an oxide semiconductor.

The interlayer insulating film is a very important factor not only for insulation between the transistor and a wiring or between wirings, but also for stabilization of characteristics of the transistor.

Thus, an object of the present invention is to suppress a change in electrical characteristics of a semiconductor device in which an interlayer insulating film is provided over a transistor including an oxide semiconductor.

One embodiment of the present invention is a structure including a void portion in a first insulating film, in a step region formed by a source electrode and a drain electrode over a semiconductor film, the first insulating film containing silicon oxide as a component, and a second insulating film containing silicon nitride as a component, the second insulating film being provided in contact with the first insulating film to cover the void portion in the first insulating film. The structure can prevent the void portion generated in the first insulating film from expanding outward. Specifically, the following structure can be employed for example.

One embodiment of the present invention is a semiconductor device including a semiconductor film at least partly overlapping with a gate electrode with a gate insulating film interposed therebetween, a source electrode and a drain electrode each including a region in contact with part of a top surface portion of the semiconductor film, a first insulating film containing silicon oxide as a component, which covers the source electrode, the drain electrode, and the semiconductor film and includes a void portion in a step portion formed by the source electrode and the drain electrode over the semiconductor film, and a second insulating film containing silicon nitride as a component, which is provided in contact with the first insulating film to cover the void portion in the first insulating film.

Another embodiment of the present invention is a semiconductor device including a semiconductor film, a source electrode and a drain electrode each including a region in contact with part of a top surface portion of the semiconductor film, a first insulating film containing silicon oxide as a component, which covers the source electrode, the drain electrode, and the semiconductor film and includes a void portion in a step portion formed by the source electrode and the drain electrode over the semiconductor film, a second insulating film containing silicon nitride as a component, which is provided in contact with the first insulating film to cover the void portion in the first insulating film, and a gate electrode overlapping with the semiconductor film with the second insulating film interposed therebetween.

Another embodiment of the present invention is a semiconductor device with the above structure, in which the source electrode and the drain electrode each have a stacked structure including a first conductive film in contact with the semiconductor film and a second conductive film over the first conductive film, and a side end surface of the second conductive film is positioned on a top surface of the first conductive film.

Another embodiment of the present invention is a semiconductor device with the above structure, in which the film density of the first insulating film is preferably higher than or equal to 2.26 g/cm$^3$ and lower than or equal to 2.50 g/cm$^3$.

Another embodiment of the present invention is a semiconductor device with the above structure, in which it is preferable that the first insulating film be a silicon oxynitride film and the second insulating film be a silicon nitride film.

Another embodiment of the present invention is a semiconductor device with the above structure, in which the thickness of the first insulating film is larger than the thickness of the second insulating film.

Another embodiment of the present invention is a semiconductor device with the above structure, in which the semiconductor film is preferably an oxide semiconductor film.

Another embodiment of the present invention is a method for manufacturing a semiconductor device including the steps of forming a semiconductor film at least partly overlapping with a gate electrode with a gate insulating film interposed therebetween, forming a source electrode and a drain electrode each including a region in contact with part of a top surface portion of the semiconductor film, forming a first insulating film containing silicon oxide as a component, which covers the source electrode, the drain electrode, and the semiconductor film and includes a void portion in a step portion formed by the source electrode and the drain electrode over the semiconductor film, and forming a second insulating film containing silicon nitride as a component to be in contact with the first insulating film to cover the void portion in the first insulating film.

Another embodiment of the present invention is a method for manufacturing a semiconductor device including the steps of forming a semiconductor film, forming a source electrode and a drain electrode each including a region in contact with part of a top surface portion of the semiconductor film, forming a first insulating film containing silicon oxide as a component, which covers the source electrode, the drain electrode, and the semiconductor film and includes a void portion in a step portion formed by the source electrode and the drain electrode over the semiconductor film, forming a second insulating film containing silicon nitride as a component to be in contact with the first insulating film to cover the void portion in the first insulating film, and forming a gate electrode overlapping with the semiconductor film with the second insulating film interposed therebetween.

Another embodiment of the present invention is a method for manufacturing a semiconductor device with the above structure, in which the source electrode and the drain electrode each have a stacked structure including a first conductive film in contact with the semiconductor film and a second conductive film over the first conductive film, etching treatment is performed on the first conductive film and the second conductive film, and a side end surface of the second conductive film is positioned on a top surface of the first conductive film by the etching treatment.

Another embodiment of the present invention is a method for manufacturing a semiconductor device with the above structure, in which the film density of the first insulating film is preferably higher than or equal to 2.26 g/cm$^3$ and lower than or equal to 2.50 g/cm$^3$.

Another embodiment of the present invention is a method for manufacturing a semiconductor device with the above structure, in which it is preferable that the first insulating film be a silicon oxynitride film and the second insulating film be a silicon nitride film.

Another embodiment of the present invention is a method for manufacturing a semiconductor device with the above structure, in which the thickness of the first insulating film is larger than the thickness of the second insulating film.

Another embodiment of the present invention is a method for manufacturing a semiconductor device with the above structure, in which the semiconductor film is preferably an oxide semiconductor film.

With one embodiment of the present invention, a semiconductor device with high reliability, in which a change in electrical characteristics is suppressed, can be provided.

BRIEF DESCRIPTION OF DRAWINGS

In the accompanying drawings:

FIGS. 10A and 10B are cross-sectional views each illustrating one embodiment of a display device;

FIGS. 20A1 to 20A3 and FIGS. 20B1 to 20B3 show electrical characteristics of example samples in Example;

BEST MODE FOR CARRYING OUT THE INVENTION

Figure 1A:
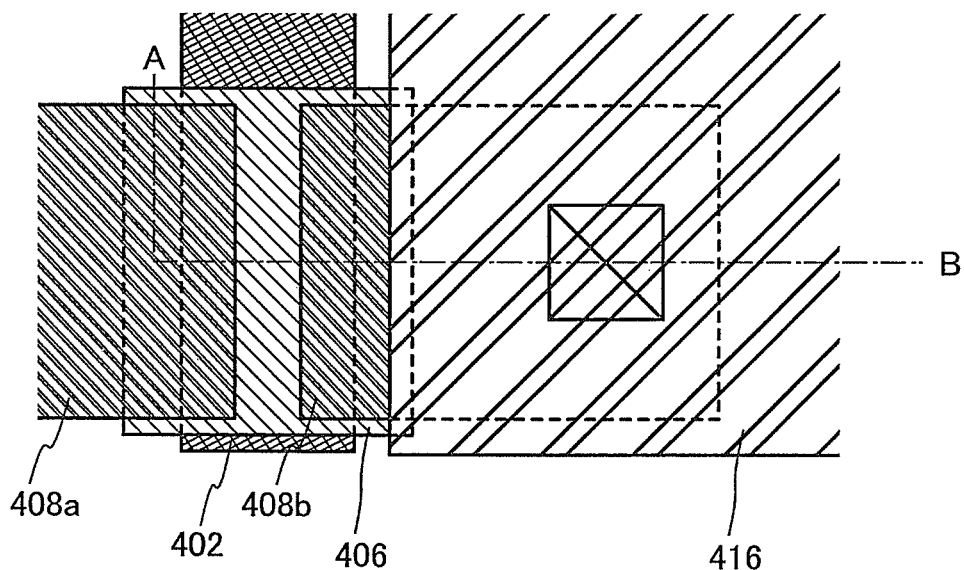
FIGS. 1A and 1B are a plan view and a cross-sectional view illustrating one embodiment of a semiconductor device.

Hereinafter, embodiments of the present invention are described in detail with reference to the accompanying drawings. Note that the present invention is not limited to the description below, and it is easily understood by those skilled in the art that modes and details of the present invention can be modified in various ways without departing from the spirit and scope of the present invention. Accordingly, the present invention should not be construed as being limited to the description of the embodiments below.

Note that the functions of the "source" and "drain" may replace each other in the case, for example, where transistors of different conductivity types are used, or where the direction of a current flow changes in a circuit operation. Therefore, the terms "source" and "drain" can replace each other in this specification.

The meaning of "electrically connected" includes "connected through an object having any electric function". The "object having any electric function" may be any object which allows electric signals to be transmitted and received between the components connected through the object.

The position, size, and area of each component in the drawings and the like are not accurately represented in some cases to facilitate understanding, and thus are not necessarily limited to those in the drawings and the like in the disclosed invention.

The ordinal number such as "first", "second", and "third" are used to avoid confusion among components.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

Embodiment 1

Figure 1B:
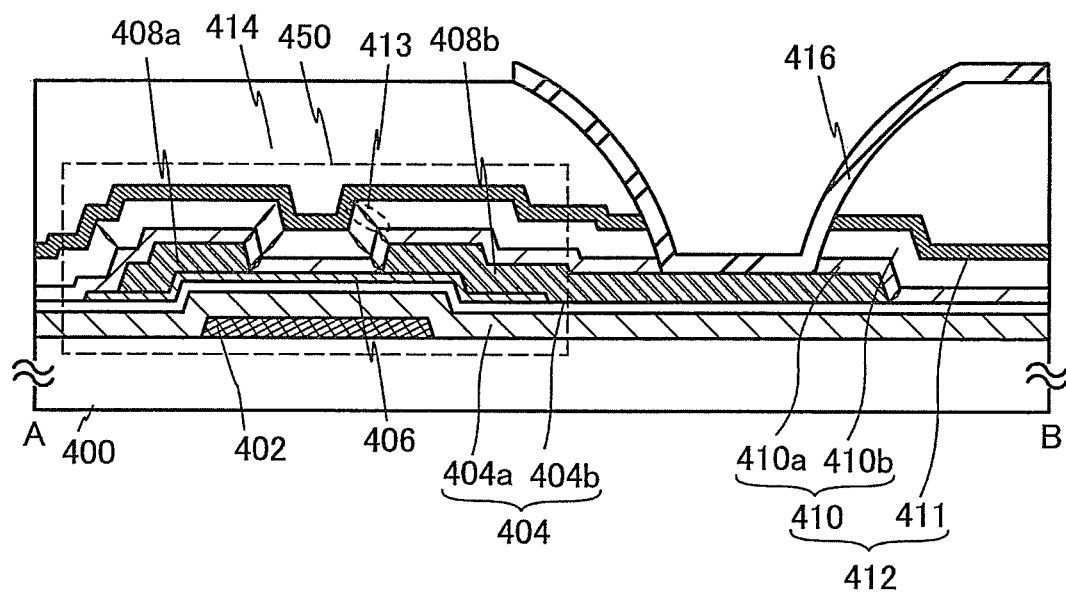

In this embodiment, a semiconductor device which is one embodiment of the present invention is described with reference to drawings. FIGS. 1A and 1B show a top view and a cross-sectional view of a transistor 450 that is a semiconductor device of one embodiment of the present invention. FIG. 1A shows the top view of the transistor 450, and FIG. 1B shows the cross-sectional view taken along dashed-dotted line A-B in FIG. 1A.

The transistor 450 in FIGS. 1A and 1B includes a gate electrode 402 provided over a substrate 400 having an insulating surface, a gate insulating film 404 provided over the gate electrode 402, a semiconductor film 406 which is provided over the gate insulating film 404 and overlaps with the gate electrode 402, and a source electrode 408a and a drain electrode 408b which are provided over the semiconductor film 406.

Further, an insulating film 412 which covers the source electrode 408a and the drain electrode 408b and is in contact with the semiconductor film 406 may be included in the transistor 450 as a component. In addition, an interlayer insulating film 414 covering the insulating film 412 is provided, and an electrode 416 which is electrically connected to the drain electrode 408b through an opening formed in the insulating film 412 and the interlayer insulating film 414 is provided over the interlayer insulating film 414. Note that in this embodiment, the electrode 416 is electrically connected to the drain electrode 408b; however, the present invention is not limited thereto, and the electrode 416 may be electrically connected to the source electrode 408a.

In this embodiment, the gate insulating film 404 is a stack of a gate insulating film 404a which is in contact with the gate electrode 402 and a gate insulating film 404b which is in contact with the gate insulating film 404a and the semiconductor film 406. The insulating film 412 is a stack of an oxide insulating film 410 which is a first insulating film in contact with the semiconductor film 406, the source electrode 408a, and the drain electrode 408b and a nitride insulating film 411 over the oxide insulating film 410, which is a second insulating film functioning as a protective film. The oxide insulating film 410 is a stack of an oxide insulating film 410a which is in contact with the semiconductor film 406, the source electrode 408a, and the drain electrode 408b, formed under a low power condition, and has high coverage and an oxide insulating film 410b over the oxide insulating film 410a.

Void portions 413 due to steps of the side end surfaces of the source electrode 408a and the drain electrode 408b are generated in portions of the oxide insulating film 410 which cover the steps. The void portion 413 has a lower dielectric constant than a film in which the void portion 413 is formed; thus, capacitance generated between wirings due to miniaturization of a semiconductor device can be reduced, so that the semiconductor device can operate at high speed while high degree of integration is kept. Although moisture might enter the semiconductor film 406 through the void portion 413 and characteristics of the transistor 450 might be adversely affected, the nitride insulating film 411 is provided over the oxide insulating film 410, whereby a void portion generated in the oxide insulating film 410 can be covered.

When the void portion 413 is covered with the nitride insulating film 411, the void portion 413 can be prevented from expanding to the outside of the oxide insulating film 410. Alternatively, the void portion 413 may be filled with the nitride insulating film 411. Further, the nitride insulating film 411 functions as a barrier film which suppresses entry of hydrogen or a compound containing hydrogen (e.g., water) from the outside or the interlayer insulating film 414 formed later to the semiconductor film 406.

Next, a method for manufacturing the transistor 450 is described with reference to FIGS. 2A to 2C and FIGS. 3A to 3C.

First, the gate electrode 402 (including a wiring formed with the same layer) is formed over the substrate 400 having an insulating surface.

There is no particular limitation on the substrate that can be used as the substrate 400 having an insulating surface as long as it has heat resistance high enough to withstand heat treatment performed later. For example, a glass substrate such as barium borosilicate glass or aluminoborosilicate glass, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 400. Still alternatively, any of these substrates further provided with a semiconductor element may be used as the substrate 400.

The gate electrode 402 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode 402.

The material of the gate electrode 402 may be a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added.

Alternatively, as the material of the gate electrode 402, an In—Ga—Zn-based oxide containing nitrogen, an In—Sn-based oxide containing nitrogen, an In—Ga-based oxide containing nitrogen, an In—Zn-based oxide containing nitrogen, an Sn-based oxide containing nitrogen, an In-based oxide containing nitrogen, or a metal nitride film (such as an indium nitride film, a zinc nitride film, a tantalum nitride film, or a tungsten nitride film) may be used. These materials have a work function of 5 eV or more. Therefore, when the gate electrode 402 is formed using any of these materials, the threshold voltage can be positive in the electrical characteristics of the transistor, so that the transistor can be a normally-off switching transistor. The gate electrode 402 may have either a single-layer structure or a stacked-layer structure, for example, in which copper is formed over tantalum nitride. The gate electrode 402 may have a tapered shape with a taper angle greater than or equal to 15° and less than or equal to 70° for example. Here, the taper angle refers to an angle formed between a side end surface of a layer having a tapered shape and a bottom surface of the layer.

Figure 2A:
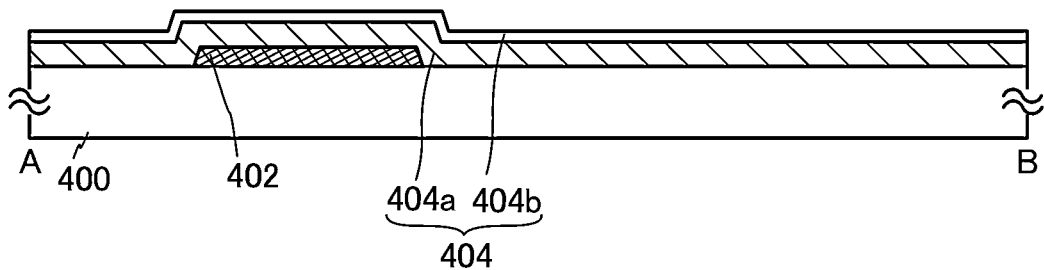
FIGS. 2A to 2C illustrate an example of a method for manufacturing a semiconductor device.

Next, the gate insulating film 404 is formed so as to cover the gate electrode 402 (see FIG. 2A). As the gate insulating film 404, a single layer or a stack of layers including at least one of the following films formed by a plasma CVD method, a sputtering method, or the like is used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. It is preferable that microwave plasma treatment for repairing oxygen vacancies be performed after the film formation of the gate insulating film 404, and then radical oxidation treatment be performed.

Note that in this specification and the like, "oxynitride" such as silicon oxynitride contains more oxygen than nitrogen.

Further, in this specification and the like, "nitride oxide" such as silicon nitride oxide contains more nitrogen than oxygen.

Note that it is preferable that a region which is included in the gate insulating film 404 and is in contact with the semiconductor film 406 formed later (in this embodiment, the gate insulating film 404b) be formed using an oxide insulating film.

Figure 2B:
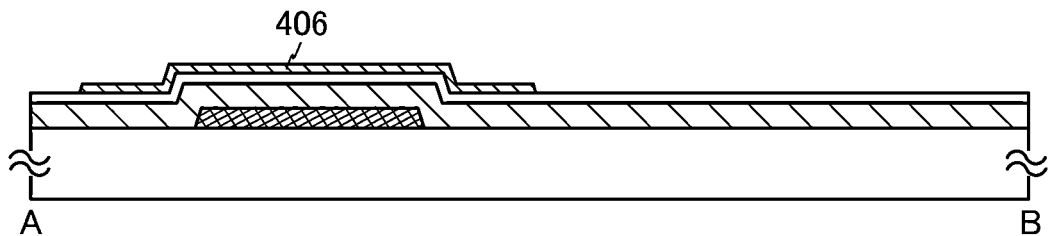

Next, the semiconductor film 406 is formed over the gate insulating film 404 (see FIG. 2B).

Any of an amorphous semiconductor film, a polycrystalline semiconductor film, and a microcrystalline semiconductor film may be used as the semiconductor film 406. As a material of the amorphous semiconductor film, silicon, silicon-germanium (SiGe) alloy, or the like can be used. Further, an oxide semiconductor film can be used as the semiconductor film 406.

Figure 2C:
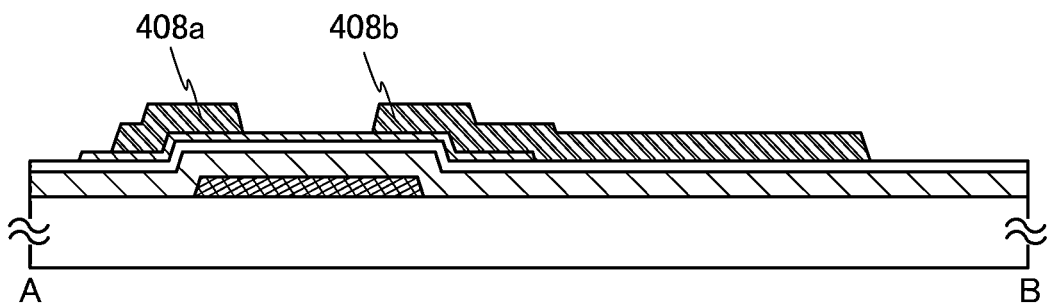

Then, a conductive film is formed over the semiconductor film 406 and processed by etching treatment to form the source electrode 408a and the drain electrode 408b (including a wiring formed with the same layer) (see FIG. 2C).

For the source electrode 408a and the drain electrode 408b, for example, a conductive film containing an element selected from Al, Cr, Cu, Ta, Ti, Mo, and W, or a metal nitride film containing any of the above elements as a component (a titanium nitride film, a molybdenum nitride film, or a tungsten nitride film) can be used. A conductive film having a high melting point of Ti, Mo, W, or the like or a metal nitride film of any of these elements (a titanium nitride film, a molybdenum nitride film, or a tungsten nitride film) may be stacked on one of or both a lower side and an upper side of a conductive film of Al, Cu, or the like. Alternatively, the source electrode 408a and the drain electrode 408b may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), an indium oxide-zinc oxide ($In_2O_3$—ZnO), or any of these metal oxide materials in which silicon oxide is contained can be used.

For the source electrode 408a and the drain electrode 408b, a metal nitride film such as an In—Ga—Zn—O film containing nitrogen, an In—Sn—O film containing nitrogen, an In—Ga—O film containing nitrogen, an In—Zn—O film containing nitrogen, a Sn—O film containing nitrogen, or an In—O film containing nitrogen can be used. Further, end portions of the source electrode 408a and the drain electrode 408b preferably have tapered shapes. In this manner, coverage with the insulating film can be increased and disconnection can be prevented. Here, the taper angle is, for example, greater than or equal to 30° and less than or equal to 70°, preferably, greater than or equal to 30° and less than or equal to 60°.

Figure 8A:
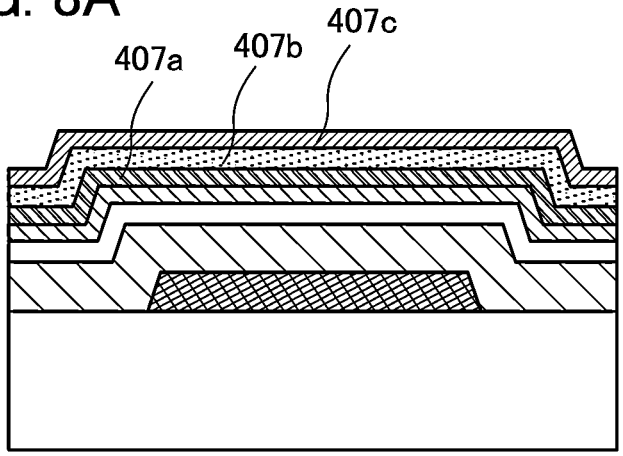
FIGS. 8A to 8C are cross-sectional views illustrating a process of generating a void portion.
Figure 8B:
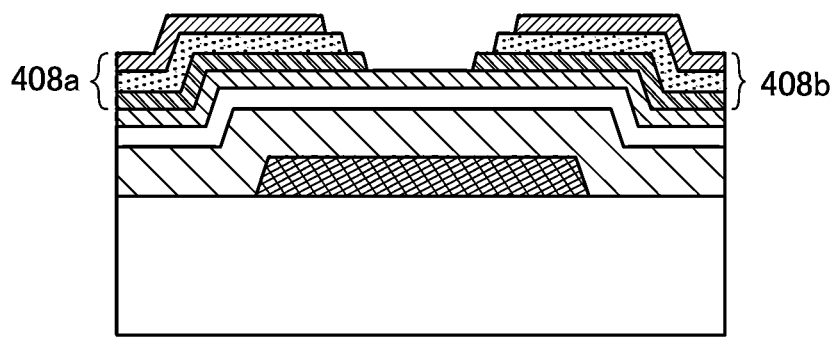

For example, in the case where the source electrode 408a and the drain electrode 408b are formed to have a stacked-layer structure of a conductive film 407a, a conductive film 407b, and a conductive film 407c as illustrated in FIG. 8A in consideration of disadvantages of interface characteristics such as adhesion or conductivity of a film, when the stacked conductive films are processed by etching treatment, the etching rate varies depending on the kind of the conductive films. As a result, as illustrated in FIG. 8B, the side end surface of the conductive film 407c is in contact with the top surface of the conductive film 407b and the side end surface of the conductive film 407b is in contact with the top surface of the conductive film 407a, whereby steps are generated at the side end surfaces of the source electrode 408a and the drain electrode 408b.

Figure 8C:
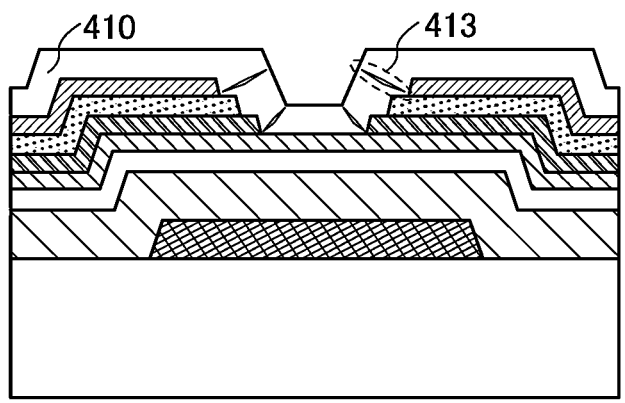

As illustrated in FIG. 8C, void portions are generated in the oxide insulating film 410 formed later due to the steps. Although, in this embodiment, a stacked-layer structure of a conductive film in which steps of the side end surfaces of the source electrode 408a and the drain electrode 408b are apparent is used for description, the present invention is not limited thereto, and also in a single-layer conductive film, a void portion is generated in the oxide insulating film 410 formed later due to a corner portion of a side end surface. The void portion in the oxide insulating film 410 is described later.

Figure 3A:
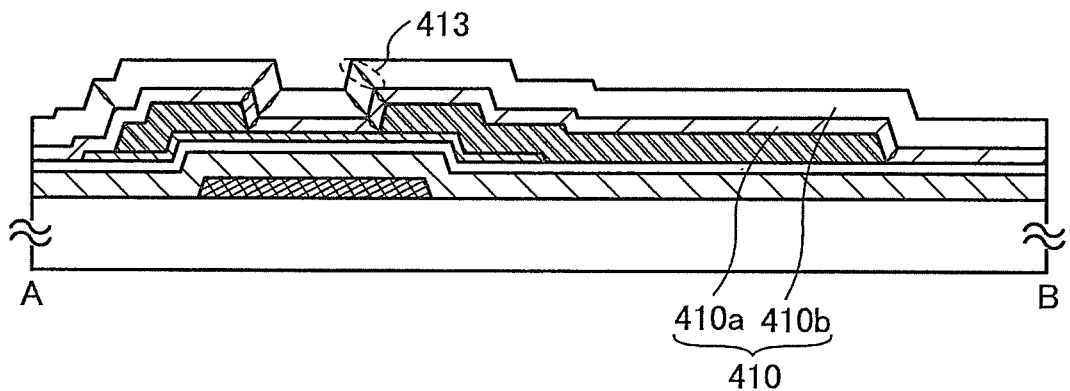
FIGS. 3A to 3C illustrate an example of a method for manufacturing a semiconductor device.

Next, the oxide insulating film 410 which is part of the insulating film 412 is formed to cover the gate insulating film 404, the semiconductor film 406, the source electrode 408a, and the drain electrode 408b (see FIG. 3A).

The oxide insulating film 410 is a stacked-layer film of the oxide insulating film 410a and the oxide insulating film 410b and can be formed by a plasma CVD method or a sputtering method. The oxide insulating film 410 is preferably a film which can supply oxygen to the semiconductor film 406 because the oxide insulating film 410 is in contact with the semiconductor film 406. The oxide insulating film 410 can be formed using a single layer of a silicon oxide film, a silicon oxynitride film, or the like or a stacked layer thereof. Alternatively, as the oxide insulating film 410, a gallium oxide film, an aluminum oxide film, an aluminum oxynitride film, or the like can be used.

As the oxide insulating film 410a, a silicon oxide film or a silicon oxynitride film can be formed under the following conditions: the substrate placed in a treatment chamber of the plasma CVD apparatus, which is vacuum-evacuated, is held at a temperature higher than or equal to 300° C. and lower than or equal to 400° C., preferably higher than or equal to 320° C. and lower than or equal to 370° C.; the pressure is greater than or equal to 100 Pa and less than or equal to 250 Pa with introduction of the source gas into the treatment chamber; and high-frequency power is supplied to an electrode provided in the treatment chamber.

Under the above film formation conditions, the bonding strength of silicon and oxygen becomes strong in the above substrate temperature range. Consequently, as the oxide insulating film 410a, a dense and hard oxide insulating film through which oxygen is permeated, typically, a silicon oxide film or a silicon oxynitride film having an etching rate lower than or equal to 10 nm/min, preferably lower than or equal to 8 nm/min when etching is performed at 25° C. with 0.5 weight % of hydrofluoric acid can be formed.

Here, as the oxide insulating film 410a, a 50-nm-thick silicon oxynitride film is formed by a plasma CVD method under the following conditions: silane with a flow rate of 30 sccm and dinitrogen monoxide with a flow rate of 4000 sccm are used as the source gas; the pressure in the treatment chamber is 200 Pa; the substrate temperature is 220° C.; and a high-frequency power of 150 W is supplied to parallel plate electrodes with the use of a 27.12 MHz high-frequency power source. Under the above conditions, a silicon oxynitride film through which oxygen is permeated can be formed.

As the oxide insulating film 410b, a silicon oxide film or a silicon oxynitride film can be formed under the following conditions: the substrate placed in a treatment chamber of the plasma CVD apparatus, which is vacuum-evacuated, is held at a temperature higher than or equal to 180° C. and lower than or equal to 260° C., preferably higher than or equal to 200° C. and lower than or equal to 240° C.; the pressure is greater than or equal to 100 Pa and less than or equal to 250 Pa, preferably greater than or equal to 100 Pa and less than or equal to 200 Pa with introduction of the source gas into the treatment chamber; and a high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

A deposition gas containing silicon and an oxidizing gas are preferred to be used as the source gas of the oxide insulating film 410b. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

As the film formation conditions of the oxide insulating film 410b, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content of the oxide insulating film 410b becomes higher than in the stoichiometric composition. However, in the case where the substrate temperature is within the above temperature range, the bond between silicon and oxygen is weak, and accordingly, part of oxygen is released by heating. Thus, it is possible to form an oxide insulating film which contains oxygen at a higher proportion than the stoichiometric composition and from which part of oxygen is released by heating. Further, the oxide insulating film 410a is provided over the semiconductor film 406. Thus, in the formation step of the oxide insulating film 410b, the oxide insulating film 410a serves as a protective film of the semiconductor film 406. Consequently, the oxide insulating film 410b can be formed using the high-frequency power having a high power density while damage to the semiconductor film 406 is reduced.

In this manner, it is preferable that the oxide insulating film 410 be in contact with the semiconductor film 406, the source electrode 408a, and the drain electrode 408b, be formed under a low power condition, and be a stacked-layer structure of the oxide insulating film 410a with high coverage and the oxide insulating film 410b over the oxide insulating film 410a.

In the case where the steps are generated at the side end surfaces of the source electrode 408a and the drain electrode 408b, the void portions 413 as illustrated in FIG. 8C are generated when the oxide insulating film 410 is formed. Such the void portion 413 can be seen by observing a cross-sectional shape of the insulating film 412 by scanning transmission electron microscopy (STEM). The void portion 413 has a lower dielectric constant than a film in which the void portion 413 is formed; thus, capacitance generated between wirings due to miniaturization of a semiconductor device can be reduced, so that the semiconductor device can operate at high speed while high degree of integration is kept.

The oxide insulating film 410 is a film with low density including a void portion. The oxide insulating film 410 has a void portion (a low-density region), so that the oxide insulating film 410 as a whole has a low film density.

The film density of the entire insulating film 412 measured by X-ray reflectometry (XRR) is preferably higher than or equal to 2.26 g/cm$^3$ and lower than or equal to 2.50 g/cm$^3$.

After the oxide insulating film 410 is formed, heat treatment may be performed. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C.

Figure 3B:
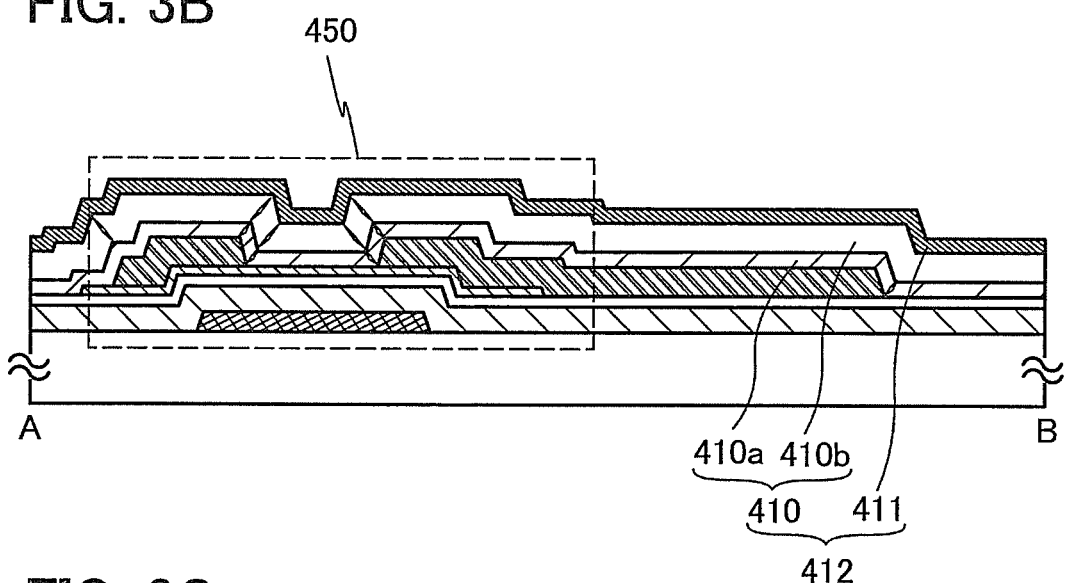

Next, the nitride insulating film 411 is formed to cover the oxide insulating film 410 (see FIG. 3B).

The nitride insulating film 411 can be formed by a plasma CVD method or a sputtering method and using a single layer of silicon nitride, silicon nitride oxide, or the like or a stacked layer thereof. Alternatively, as the nitride insulating film 411, an aluminum nitride, an aluminum nitride oxide, or the like can be used. Further, the nitride insulating film 411 is a film with high coverage, whereby the steps of the side end surface of the source electrode 408a and the drain electrode 408b become gentler (the step portions are planarized) and a void portion due to the step is not easily generated, which is preferable. Alternatively, aluminum oxide can be used instead of the nitride insulating film 411.

The nitride insulating film 411 has a function of covering the void portions generated in the oxide insulating film 410 due to the steps of the side end surfaces of the source electrode 408a and the drain electrode 408b. When the void portion is covered with the nitride insulating film 411, the void portion can be prevented from expanding to the outside of the oxide insulating film 410. Alternatively, the void portion may be filled with the nitride insulating film 411. Further, the nitride insulating film 411 functions as a barrier film which suppresses entry of hydrogen or a compound containing hydrogen (e.g., water) from the outside or the interlayer insulating film 414 formed later to the semiconductor film 406; thus, the reliability of the transistor can be improved.

Through the above steps, the transistor 450 in this embodiment can be manufactured.

Next, an interlayer insulating film 414 is formed over the transistor 450.

For the interlayer insulating film 414, an organic material such as an acrylic resin, an epoxy resin, a benzocyclobutene-based resin, polyimide, and polyamide can be used. Other than such organic materials, it is possible to use a silicone resin or the like. Note that the interlayer insulating film 414 may be formed by stacking a plurality of insulating films formed using these materials.

Figure 3C:
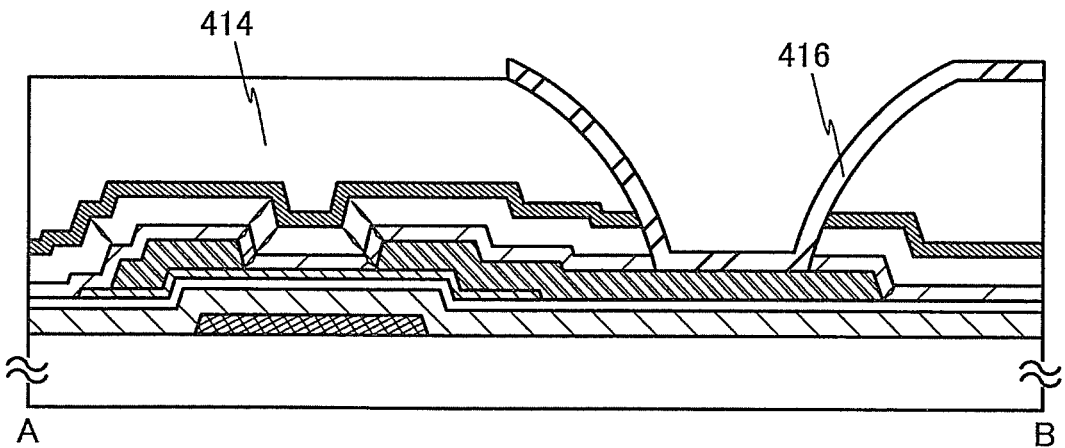

Next, an opening is provided in the insulating film 412 and the interlayer insulating film 414, and an electrode 416 electrically connected to the drain electrode 408b through the opening is formed over the interlayer insulating film 414 (see FIG. 3C).

For the electrode 416, a material used for the source electrode 408a or the drain electrode 408b can be used as appropriate. The electrode 416 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Thus, the void portion in the oxide insulating film 410 has a lower dielectric constant than a film in which the void portion is formed; thus, capacitance generated between wirings due to miniaturization of a semiconductor device can be reduced, so that the semiconductor device can operate at high speed while high degree of integration is kept. When the void portion is covered with the nitride insulating film 411, the void portion can be prevented from expanding to the outside of the oxide insulating film 410. Alternatively, the void portion may be filled with the nitride insulating film 411. Further, the nitride insulating film 411 functions as a barrier film which suppresses entry of hydrogen or a compound containing hydrogen (e.g., water) from the outside or the interlayer insulating film 414 formed later to the semiconductor film 406; thus, the reliability of the transistor 450 can be improved.

The structures, methods, and the like described in this embodiment can be combined as appropriate with any of the structures, methods, and the like described in the other embodiments.

Embodiment 2

Figure 4A:
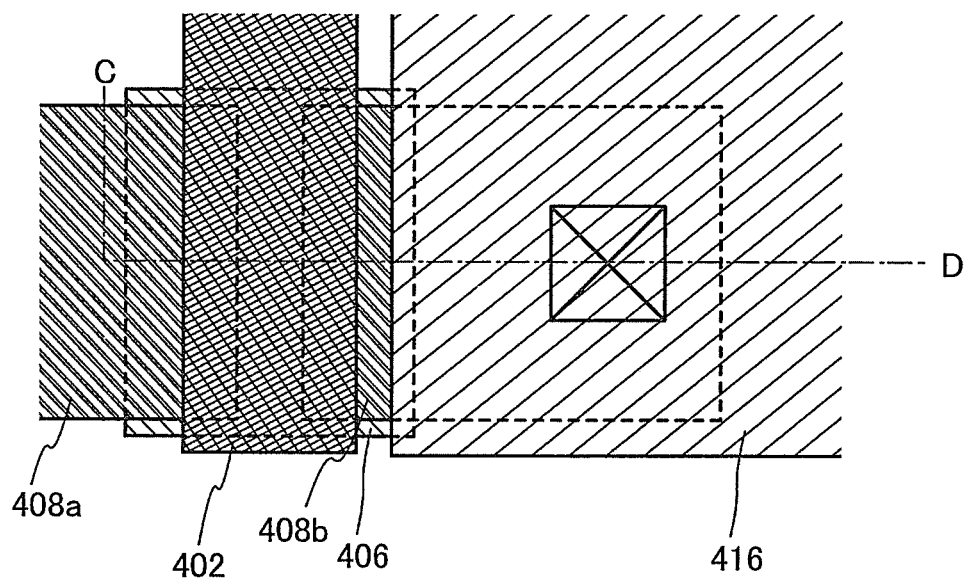
FIGS. 4A and 4B are a plan view and a cross-sectional view illustrating one embodiment of a semiconductor device.
Figure 4B:
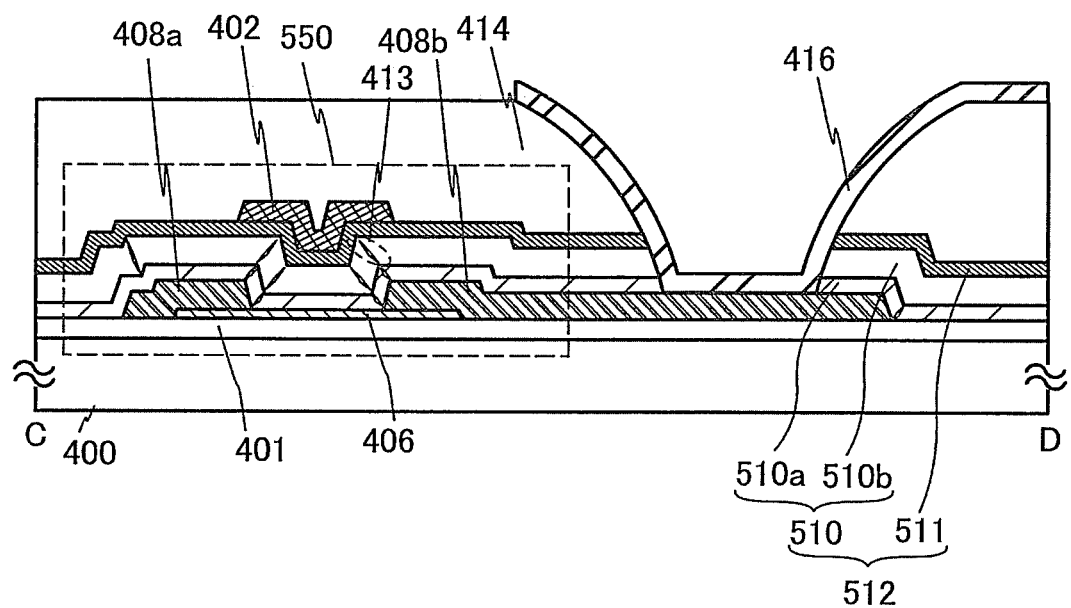

In this embodiment, a semiconductor device which is different from Embodiment 1 is described with reference to drawings. FIGS. 4A and 4B show a top view and a cross-sectional view of a transistor 550 that is a semiconductor device of one embodiment of the present invention. FIG. 4A shows the top view of the transistor 550, and FIG. 4B shows the cross-sectional view taken along dashed-dotted line C-D in FIG. 4A. A transistor 550 shown in this embodiment is a top-gate transistor, which is different from the transistor 450 Embodiment 1.

The transistor 550 in FIGS. 4A and 4B includes a base insulating film 401 provided over the substrate 400 having an insulating surface, the semiconductor film 406 provided over the base insulating film 401, the source electrode 408a and the drain electrode 408b which are provided over the base insulating film 401 and the semiconductor film 406, a gate insulating film 512 which covers the source electrode 408a and the drain electrode 408b and is in contact with the semiconductor film 406, and the gate electrode 402 which is provided over the gate insulating film 512 and overlaps with the semiconductor film 406. In addition, the interlayer insulating film 414 covering the transistor 550 is provided, and the electrode 416 which is electrically connected to the drain electrode 408b through an opening formed in the insulating film 412 and the interlayer insulating film 414 is provided over the interlayer insulating film 414. Note that in this embodiment, the electrode 416 is electrically connected to the drain electrode 408b; however, the present invention is not limited thereto, and the electrode 416 may be electrically connected to the source electrode 408a.

In this embodiment, the gate insulating film 512 is a stack of an oxide insulating film 510 which is a first insulating film in contact with the semiconductor film 406, the source electrode 408a, and the drain electrode 408b and a nitride insulating film 511 over the oxide insulating film 510, which is a second insulating film functioning as a protective film. The oxide insulating film 510 is a stack of an oxide insulating film 510a which is in contact with the semiconductor film 406, the source electrode 408a, and the drain electrode 408b, formed under a low power condition, and has high coverage and an oxide insulating film 510b over the oxide insulating film 510a.

Void portions 413 due to steps of the side end surfaces of the source electrode 408a and the drain electrode 408b are generated in portions of the oxide insulating film 510 which cover the steps. The void portion 413 has a lower dielectric constant than a film in which the void portion 413 is formed; thus, capacitance generated between wirings due to miniaturization of a semiconductor device can be reduced, so that the semiconductor device can operate at high speed while high degree of integration is kept. Although moisture might enter the semiconductor film 406 through the void portion 413 and characteristics of the transistor 550 might be adversely affected, the nitride insulating film 511 is provided over the oxide insulating film 510, whereby a void portion generated in the oxide insulating film 510 can be covered.

When the void portion 413 is covered with the nitride insulating film 511, the void portion 413 can be prevented from expanding to the outside of the oxide insulating film 510. Alternatively, the void portion 413 may be filled with the nitride insulating film 511. Further, the nitride insulating film 511 functions as a barrier film which suppresses entry of hydrogen or a compound containing hydrogen (e.g., water) from the outside or the interlayer insulating film 414 formed later to the semiconductor film 406.

Next, a method for manufacturing the transistor 550 is described with reference to FIGS. 5A to 5C and FIGS. 6A to 6D.

First, the base insulating film 401 is formed over the substrate 400 having an insulating surface. The materials, the manufacturing methods, and the like of the substrate 400 and the gate insulating film 404 in Embodiment 1 can be referred to for those of the substrate 400 and the base insulating film 401 in this embodiment.

Figure 5A:
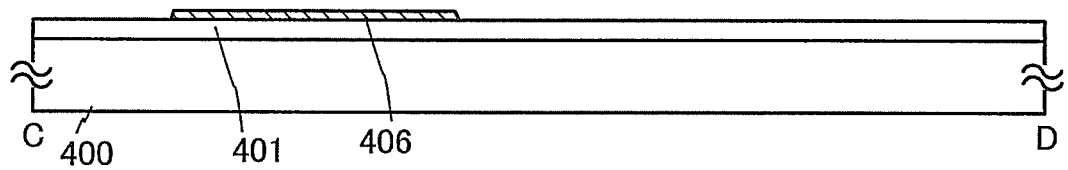
FIGS. 5A to 5C illustrate an example of a method for manufacturing a semiconductor device.

Next, the semiconductor film 406 is formed over the base insulating film 401 (see FIG. 5A). The material, the manufacturing method, and the like of the semiconductor film 406 in Embodiment 1 can be referred to for those of the semiconductor film 406 in this embodiment.

Figure 5B:
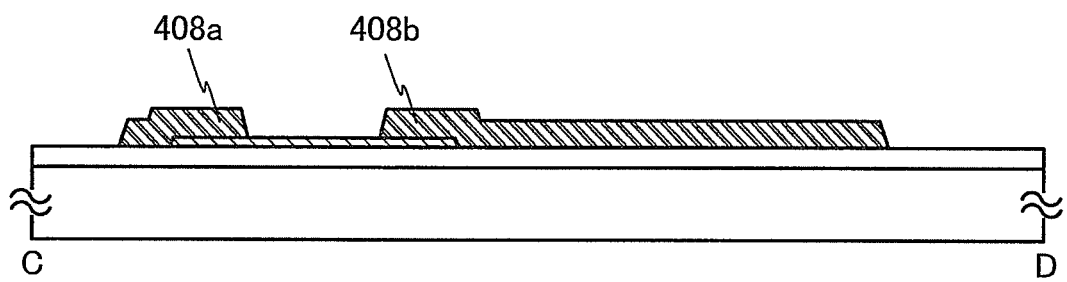

Then, a conductive film is formed over the semiconductor film 406 and processed by etching treatment to form the source electrode 408a and the drain electrode 408b (including a wiring formed with the same layer) (see FIG. 5B). The materials, the manufacturing methods, and the like of the source electrode 408a and the drain electrode 408b in Embodiment 1 can be referred to for those of the source electrode 408a and the drain electrode 408b in this embodiment.

Further, as described in Embodiment 1, steps are generated at the side end surfaces of the source electrode 408a and the drain electrode 408b and void portions are generated in the gate insulating film 512 formed later due to the steps. The void portion in the gate insulating film 512 is described later.

Figure 5C:
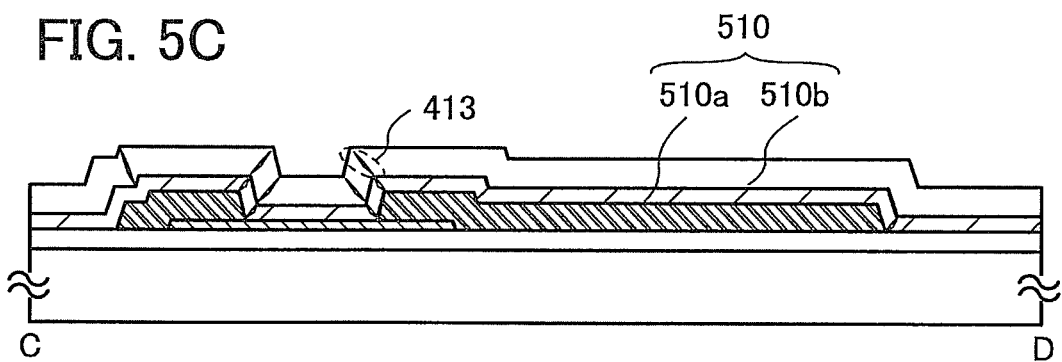

Next, the oxide insulating film 510 which is part of the gate insulating film 512 is formed to cover the base insulating film 401, the semiconductor film 406, the source electrode 408a, and the drain electrode 408b (see FIG. 5C).

In this manner, it is preferable that the oxide insulating film 510 be in contact with the base insulating film 401, the semiconductor film 406, the source electrode 408a, and the drain electrode 408b, be formed under a low power condition, and be a stacked-layer structure of the oxide insulating film 510a with high coverage and the oxide insulating film 510b over the oxide insulating film 510a. The material, the manufacturing method, and the like of the oxide insulating film 410 in Embodiment 1 can be referred to for those of the oxide insulating film 510.

In the case where the steps are generated at the side end surfaces of the source electrode 408a and the drain electrode 408b, the void portions 413 as described in Embodiment 1 are generated when the oxide insulating film 510 is formed. The void portion 413 has a lower dielectric constant than a film in which the void portion 413 is formed; thus, capacitance generated between wirings due to miniaturization of a semiconductor device can be reduced, so that the semiconductor device can operate at high speed while high degree of integration is kept.

The oxide insulating film 510b is a film with low density including a void portion 413. The oxide insulating film 510b has a low-density region, so that the oxide insulating film 510b as a whole has a low film density.

The film density of the entire gate insulating film 512 measured by X-ray reflectometry (XRR) is preferably higher than or equal to 2.26 g/cm$^3$ and lower than or equal to 2.50 g/cm$^3$.

Figure 6A:
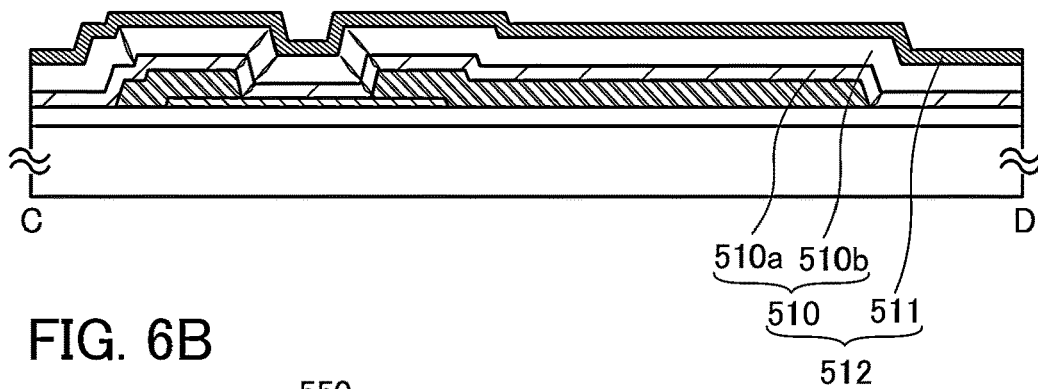
FIGS. 6A to 6D illustrate an example of a method for manufacturing a semiconductor device.

Next, the nitride insulating film 511 is formed to cover the oxide insulating film 510 (see FIG. 6A). The material, the manufacturing method, and the like of the nitride insulating film 411 in Embodiment 1 can be referred to for those of the nitride insulating film 511 in this embodiment.

The nitride insulating film 511 has a function of covering the void portions generated in the oxide insulating film 510 due to the steps of the side end surfaces of the source electrode 408a and the drain electrode 408b. When the void portion is covered with the nitride insulating film 511, the void portion can be prevented from expanding to the outside of the oxide insulating film 510. Alternatively, the void portion may be filled with the nitride insulating film 511. Further, the nitride insulating film 511 functions as a barrier film which suppresses entry of hydrogen or a compound containing hydrogen (e.g., water) from the outside or the interlayer insulating film 414 formed later to the semiconductor film 406; thus, the reliability of the transistor can be improved.

Figure 6B:
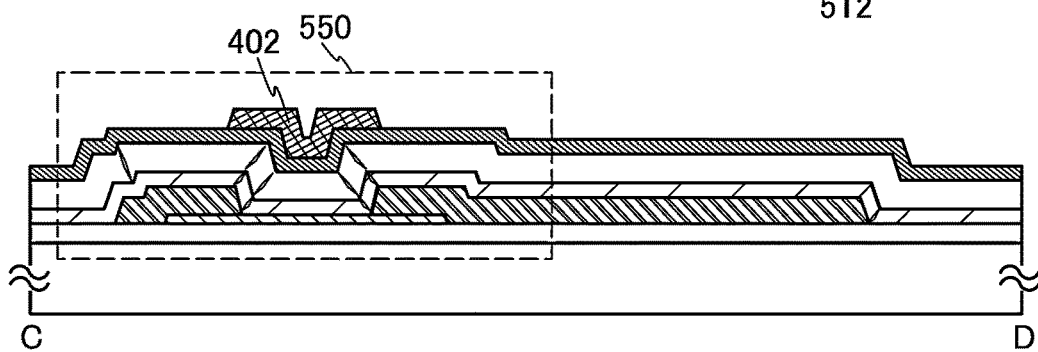

Next, the gate electrode 402 is formed over the gate insulating film 512 overlapping with the semiconductor film 406 (see FIG. 6B). The material, the manufacturing method, and the like of the gate electrode 402 in Embodiment 1 can be referred to for those of the gate electrode 402 in this embodiment.

Through the above steps, the transistor 550 of this embodiment can be manufactured.

Figure 6C:
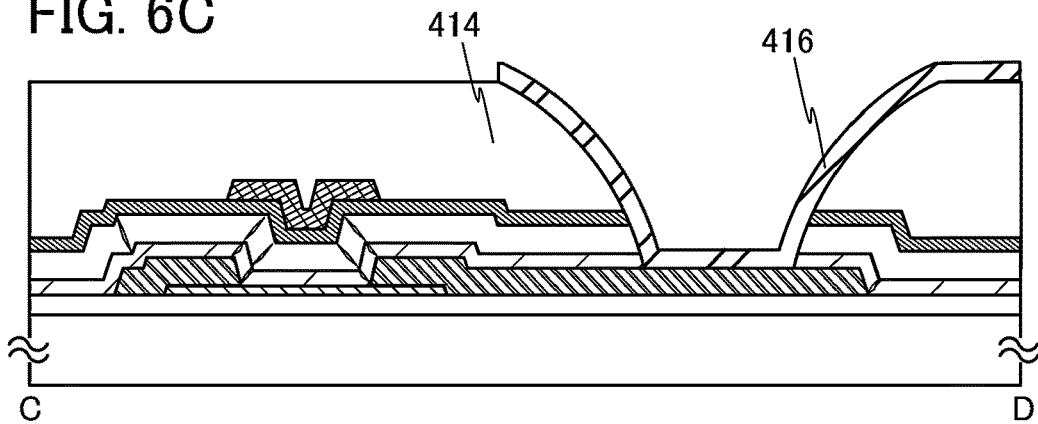

Next, the interlayer insulating film 414 is formed over the transistor 550, an opening is provided in the insulating film 412 and the interlayer insulating film 414, and the electrode 416 electrically connected to the drain electrode 408b through the opening is formed over the interlayer insulating film 414 (see FIG. 6C). The materials, the manufacturing methods, and the like of the interlayer insulating film 414 and the electrode 416 in Embodiment 1 can be referred to for those of the interlayer insulating film 414 and the electrode 416 in this embodiment.

Figure 6D:
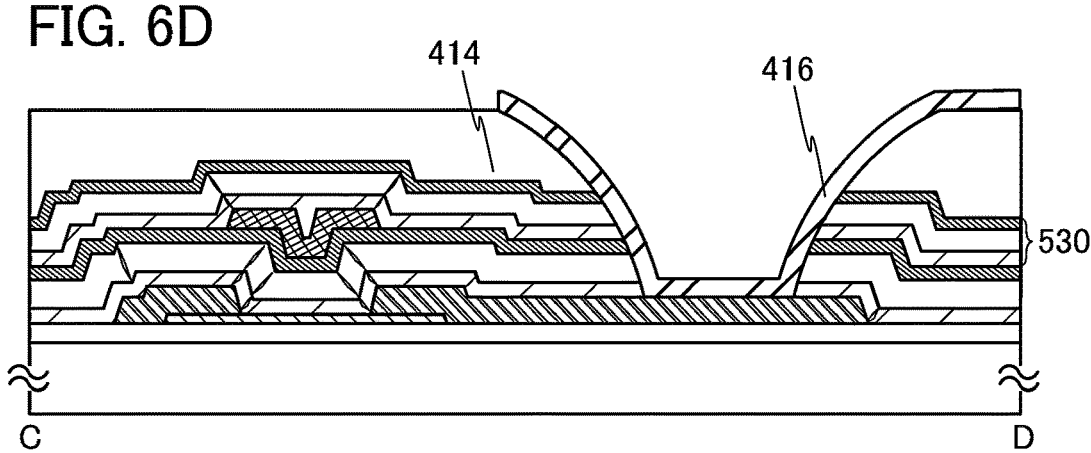

Further, as illustrated in FIG. 6D, an insulating film 530 formed of an oxide insulating film and a nitride insulating film may be provided over the gate electrode 402. By forming a nitride insulating film covering an oxide insulating film, a void portion is generated in the insulating film 530 due to a corner portion of a side end surface of the gate electrode 402. However, with the above-described structure, when the void portion is covered with the nitride insulating film, the void portion can be prevented from expanding to the outside of the oxide insulating film. Alternatively, a structure in which not the gate insulating film 512 but the insulating film 530 is a stack of an oxide insulating film and a nitride insulating film covering the oxide insulating film may be employed.

Thus, the void portion in the oxide insulating film 510 has a lower dielectric constant than a film in which the void portion is formed; thus, capacitance generated between wirings due to miniaturization of a semiconductor device can be reduced, so that the semiconductor device can operate at high speed while high degree of integration is kept. When the void portion is covered with the nitride insulating film 511, the void portion can be prevented from expanding to the outside of the oxide insulating film 510. Alternatively, the void portion may be filled with the nitride insulating film 511. Further, the nitride insulating film 511 functions as a barrier film which suppresses entry of hydrogen or a compound containing hydrogen (e.g., water) from the outside or the interlayer insulating film 414 formed later to the semiconductor film 406; thus, the reliability of the transistor 550 can be improved.

The structures, methods, and the like described in this embodiment can be combined as appropriate with any of the structures, methods, and the like described in the other embodiments.

Embodiment 3

In this embodiment, a semiconductor device having a structure different from those of the semiconductor devices in Embodiments 1 and 2 is described with reference to FIGS. 7A to 7C.

Figure 7A:
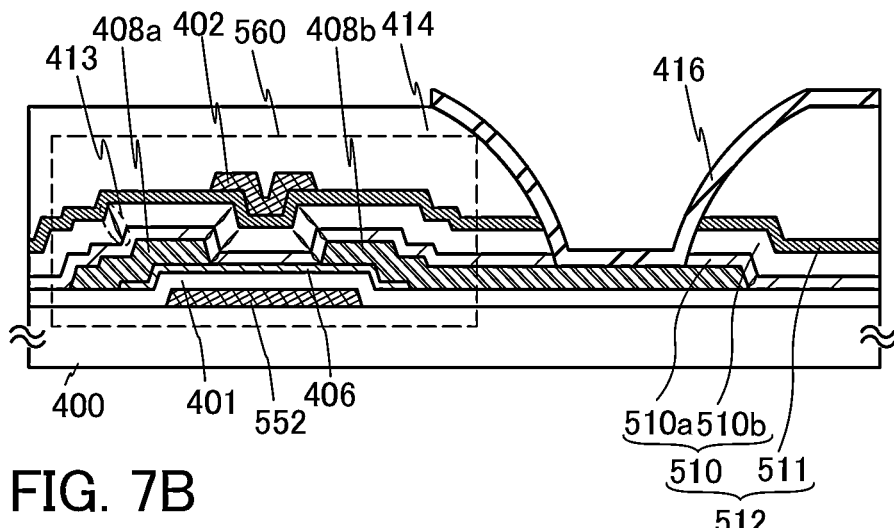
FIGS. 7A to 7C are cross-sectional views each illustrating one embodiment of a semiconductor device.

A transistor 560 illustrated in FIG. 7A includes a plurality of gate electrodes facing each other with a semiconductor film 406 provided therebetween. The transistor 560 includes a gate electrode 552 provided over the substrate 400 having an insulating surface, a base insulating film 401 provided over the gate electrode 552, the semiconductor film 406 provided over the base insulating film 401, the source electrode 408a and the drain electrode 408b which are provided over the base insulating film 401 and the semiconductor film 406, a gate insulating film 512 which covers the source electrode 408a and the drain electrode 408b and is in contact with the semiconductor film 406, and the gate electrode 402 which is provided over the gate insulating film 512 and overlaps with the semiconductor film 406. In addition, the interlayer insulating film 414 covering the transistor 560 is provided, and the electrode 416 which is electrically connected to the drain electrode 408b through an opening formed in the insulating film 412 and the interlayer insulating film 414 is provided over the interlayer insulating film 414.

The material, the manufacturing method, and the like of the gate electrode 402 in Embodiment 1 can be referred to for those of the gate electrode 552.

The transistor 560 in this embodiment has the gate electrode 552 and the gate electrode 402 facing each other with the semiconductor film 406 provided therebetween. By application of different potentials to the gate electrode 552 and the gate electrode 402, the threshold voltage of the transistor 560 can be controlled. Alternatively, when the same potential is applied to the gate electrode 552 and the gate electrode 402, the on-state current of the transistor 560 can be increased.

Further, the oxide insulating film 410 does not necessarily have a two-layer structure. For example, a transistor 570 illustrated in FIG. 7B has a structure in which an oxide insulating film 410c is further provided over the oxide insulating film 410b in the oxide insulating film 410 of the transistor 450 in Embodiment 1. Further, a transistor 580 illustrated in FIG. 7C has a structure in which a stacked layer of an oxide insulating film 410d and an oxide insulating film 410e is further provided over the oxide insulating film 410c. Note that each of the materials used for the oxide insulating film 410c and the oxide insulating film 410e can be similar to that used for the oxide insulating film 410a, and the material used for the oxide insulating film 410d can be similar to that used for the oxide insulating film 410b.

Further, the oxide insulating film 410a formed with lower power than the oxide insulating film 410b is a film with low density, and adequately covers the steps of the side end surfaces of the source electrode 408a and the drain electrode 408b; thus, these oxide insulating films are stacked as described above, whereby the steps can be gentle.

In addition, when the oxide insulating film 410b which is a denser film than the oxide insulating film 410a is formed over the oxide insulating film 410a, by an effect of the oxide insulating film 410a (planarization of a step portion owing to high step coverage), a void portion due to the step is not easily generated in the oxide insulating film 410b.

Further, in the semiconductor film 406, the thickness of a region in contact with the oxide insulating film 410a is smaller than the thickness of a region in contact with the source electrode 408a and the drain electrode 408b. In the semiconductor film 406, the region with a smaller thickness is formed by being partly etched at the time of processing a conductive film to form the source electrode 408a and the drain electrode 408b or by performing etching treatment on an exposed region of the semiconductor film 406 after forming the source electrode 408a and the drain electrode 408b. The region serves as a channel formation region of the transistor 570 and the transistor 580.

By reducing the thickness of the channel formation region in the semiconductor film 406, the resistance of the regions in contact with the source electrode 408a and the drain electrode 408b can be lower than that of the channel formation region. Thus, contact resistance between the semiconductor film 406 and the source electrode 408a and contact resistance between the semiconductor film 406 and the drain electrode 408b can be reduced.

The structures, methods, and the like described in this embodiment can be combined as appropriate with any of the structures, methods, and the like described in the other embodiments.

Embodiment 4

In this embodiment, the case where an oxide semiconductor film is used as the semiconductor film 406 of the above embodiments is described.

In the transistor including an oxide semiconductor film, the current in an off state (off-state current) can be controlled to be small and relatively high field-effect mobility can be obtained; thus, the transistor can operate at high speed. Further, in the above embodiments, the oxide insulating film under the nitride insulating film is a film which can supply oxygen, whereby oxygen is released by heating from the void portion which is closed by the nitride insulating film. By supplying oxygen to the oxide semiconductor film, the above-described effect becomes more significant. A deposition method of the oxide semiconductor film is described below.

The oxide semiconductor film can be formed by a sputtering method, a molecular beam epitaxy (MBE) method, a chemical vapor deposition (CVD) method, a pulsed laser deposition (PLD) method, an atomic layer deposition (ALD) method, or the like as appropriate.

Further, when the oxide semiconductor film contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Accordingly, the hydrogen concentration in the oxide semiconductor film is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, further more preferably lower than or equal to $1\times10^{16}$ atoms/cm$^3$. Note that the above hydrogen concentration in the oxide semiconductor film is measured by secondary ion mass spectrometry (SIMS).

For the above-described reason, it is preferable that the gas used for deposition of the oxide semiconductor film do not contain an impurity such as water, hydrogen, a hydroxyl group, or hydride. In other words, it is preferable to use a gas having a purity higher than or equal to 6N, preferably higher than or equal to 7N (i.e., the impurity concentration in the gas is lower than or equal to 1 ppm, preferably lower than or equal to 0.1 ppm).

Further, in the deposition of the oxide semiconductor film, in order to remove moisture (including water, water vapor, hydrogen, a hydroxyl group, or hydride) in the deposition chamber, an entrapment vacuum pump such as a cryopump, an ion pump, or a titanium sublimation pump is preferably used. The evacuation unit may be a turbo molecular pump provided with a cold trap. From the deposition chamber which is evacuated with a cryopump, a hydrogen atom, a compound containing a hydrogen atom such as water ($H_2O$) (more preferably, also a compound containing a carbon atom), and the like are removed, whereby the concentration of an impurity such as hydrogen or moisture in the oxide semiconductor film formed in the deposition chamber can be reduced.

Note that a target used in the sputtering apparatus preferably has a relative density greater than or equal to 90% and less than or equal to 100%, preferably greater than or equal to 95% and less than or equal to 100%. The use of the target with high relative density enables the formed oxide semiconductor film to be a dense film.

As a material of the oxide semiconductor film, for example, an In-M-Zn—O-based material may be used. Here, a metal element M is an element whose bond energy with oxygen is higher than that of In and that of Zn. Alternatively, the metal element M is an element which has a function of suppressing desorption of oxygen from the In-M-Zn—O-based material. Owing to the effect of the metal element M, generation of oxygen vacancies in the oxide semiconductor film is suppressed. Therefore, change in electrical characteristics of the transistor, which is caused by oxygen vacancies, can be reduced; accordingly, a highly reliable transistor can be obtained.

Specifically, the metal element M may be Al, Sc, Ti, V, Cr, Mn, Fe, Co, Ni, Ga, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Ga, Y, Zr, Ce, or Hf. For the metal element M, one or more elements may be selected from the above elements. Further, Ge can be used instead of the metal element M.

Here, in the In-M-Zn—O-based material, which is an oxide semiconductor, the higher the concentration of In is, the higher the carrier mobility and the carrier density are. As a result, the oxide semiconductor has higher conductivity as the concentration of In is higher.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits a cube whose one side is less than 10 nm, less than 5 nm, or less than 3 nm.

The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around $31°$. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when $2\theta$ is around $56°$. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around $56°$. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around $56°$.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around $36°$, in addition to the peak of $2\theta$ at around $31°$. The peak of $2\theta$ at around $36°$ indicates that a crystal having no c-axis alignment is included in part of the CAAC-OS film. It is preferable that in the CAAC-OS film, a peak of $2\theta$ appear at around $31°$ and a peak of $2\theta$ do not appear at around $36°$.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For example, the CAAC-OS film is formed by sputtering with a polycrystalline oxide semiconductor sputtering target. By collision of ions with the sputtering target, a crystal region included in the sputtering target may be separated from the target along an a-b plane; in other words, sputtered particles having a plane parallel to the a-b plane (flat-plate-like sputtered particles or pellet-like sputtered particles) may flake off from the target. In this case, the flat-plate-like sputtered particles reach a substrate while maintaining their crystal state, whereby the CAAC-OS film can be formed.

For the deposition of the CAAC-OS film, the following conditions are preferably used.

The crystal state can be prevented from being broken by the impurities by reducing the amount of impurities entering the CAAC-OS film during the deposition, for example, by reducing the concentration of impurities (e.g., hydrogen, water, carbon dioxide, and nitrogen) that exist in the deposition chamber or by reducing the concentration of impurities in a deposition gas. Specifically, a deposition gas with a dew point of −80° C. or lower, preferably −100° C. or lower, more preferably −120° C. or lower, is used.

By increasing the substrate heating temperature during the deposition, migration of sputtered particles is likely to occur after the sputtered particles reach a substrate surface. Specifically, the substrate heating temperature during the deposition ranges from 100° C. to 740° C., preferably from 200° C. to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

It is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn-based oxide target is described below.

A polycrystalline In—Ga—Zn-based oxide target is made by mixing $InO_X$ powder, $GaO_Y$ powder, and $ZnO_Z$ powder at a predetermined molar ratio, applying pressure to the mixture, and then performing heat treatment on the mixture at temperatures ranging from 1000° C. to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired target.

The oxide semiconductor film immediately after being formed is preferably in a supersaturated state in which the proportion of oxygen is higher than in the stoichiometric composition. For example, when the oxide semiconductor film is formed by a sputtering method, it is preferable that the film be formed in a film formation gas containing a high percentage of oxygen, and it is especially preferable that the film be formed under an oxygen atmosphere (oxygen gas: 100%). When the film is formed in a film formation gas containing a high percentage of oxygen, particularly under a 100% oxygen gas atmosphere, release of Zn from the film can be suppressed even when the film formation temperature is higher than or equal to 300° C., for example.

Note that the oxide semiconductor film may have a structure in which a plurality of oxide semiconductor films is stacked. For example, the oxide semiconductor film may be a stack of a first oxide semiconductor film and a second oxide semiconductor film that are formed using metal oxides with different compositions. For example, the first oxide semiconductor film may be formed using a three-component metal oxide, and the second oxide semiconductor film may be formed using a two-component metal oxide. Alternatively, for example, both the first oxide semiconductor film and the second oxide semiconductor film may be formed using a three-component metal oxide.

Further, it is possible that the constituent elements of the first oxide semiconductor film and the second oxide semiconductor film are the same and the compositions of the constituent elements of the first oxide semiconductor film and the second oxide semiconductor film are different. For example, the first oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film may have an atomic ratio of In:Ga:Zn=1:3:2, and the second oxide semiconductor film may have an atomic ratio of In:Ga:Zn=2:1:3.

At this time, one of the first oxide semiconductor film and the second oxide semiconductor film, which is closer to the gate electrode, preferably contains In and Ga at a proportion of In>Ga. The other oxide semiconductor film, which is farther from the gate electrode preferably contains In and Ga at a proportion of In≤Ga.

In an oxide semiconductor, the s orbital of heavy metal mainly contributes to carrier transfer, and when the In content in the oxide semiconductor is increased, overlap of the s orbitals is likely to be increased. Therefore, an oxide having a composition where In>Ga has higher mobility than an oxide having a composition where In≤Ga. Further, in Ga, the formation energy of an oxygen vacancy is larger and thus an oxygen vacancy is less likely to be generated than in In; therefore, the oxide having a composition where In≤Ga has more stable characteristics than the oxide having a composition where In>Ga.

An oxide semiconductor containing In and Ga at a proportion of In>Ga is used on the channel side, and an oxide semiconductor containing In and Ga at a proportion of In≤Ga is used on the back channel side (a side opposite to the channel), so that mobility and reliability of a transistor can be further improved.

Further, oxide semiconductors having different crystallinities may be used for the first oxide semiconductor film and the second oxide semiconductor film. That is, two of a single crystal oxide semiconductor film, a polycrystalline oxide semiconductor film, an amorphous oxide semiconductor film, microcrystalline oxide semiconductor film, and a CAAC-OS film may be combined as appropriate. When an amorphous oxide semiconductor is used for at least one of the first oxide semiconductor film and the second oxide semiconductor film, internal stress or external stress of the oxide semiconductor film is relieved, variation in characteristics of a transistor is reduced, and reliability of the transistor can be further improved.

On the other hand, an amorphous oxide semiconductor is likely to absorb an impurity which serves as a donor, such as hydrogen, and an oxygen vacancy is likely to be generated; thus, an amorphous oxide semiconductor easily becomes n-type. For this reason, it is preferable to use an oxide semiconductor having crystallinity such as a CAAC-OS film for the oxide semiconductor film on the channel side.

Further, the oxide semiconductor film may have a stacked-layer structure of three or more layers in which an amorphous semiconductor film is interposed between a plurality of crystalline semiconductor films. Furthermore, a structure in which a crystalline semiconductor film and an amorphous semiconductor film are alternately stacked may be employed.

These two structures for making the oxide semiconductor film have a stacked-layer structure of a plurality of layers can be combined as appropriate.

In the case where the oxide semiconductor film has a stacked-layer structure of a plurality of layers, oxygen may be added each time the oxide semiconductor film is formed. For addition of oxygen, heat treatment in an oxygen atmosphere, an ion implantation method, an ion doping method, a plasma immersion ion implantation method, plasma treatment performed in an atmosphere containing oxygen, or the like can be employed.

Oxygen is added each time the oxide semiconductor film is formed, whereby an effect of reducing oxygen vacancies in the oxide semiconductor can be improved.

In an insulating film in contact with the oxide semiconductor film, the film density of the entire film measured by X-ray reflectometry (XRR) is preferably higher than or equal to 2.26 g/cm$^3$ and lower than or equal to 2.50 g/cm$^3$, and an insulating film having a film density in the above range can release a large amount of oxygen.

When the insulating film is formed, after active species in the source gas are adsorbed on surfaces on which the insulating film is formed (here, the top surfaces of the source electrode and the drain electrode), the active species move on the surfaces. However, when the insulating film is a film which can supply oxygen, a dangling bond of the active species in the source gas is terminated with excess oxygen in the insulating film and thus the insulating film is stabilized and the amount of active species in the source gas which move on the surfaces becomes small. Accordingly, a portion where the insulating film is not easily deposited due to a step portion or the like is formed; thus a void portion is easily generated. Moreover, active species in the source gas of a film deposited later do not easily enter the void portion, and the void portion is expanded.

Further, by forming the nitride insulating film, the void portion can be a closed space and a large amount of oxygen can be taken in the closed void portion; thus, the amount of oxygen released from the oxide insulating film at the time of heating can be increased. As a result, oxygen vacancies in the oxide semiconductor film can be filled with oxygen from the oxide insulating film; thus, the reliability of the transistor can be improved.

Figure 7B:
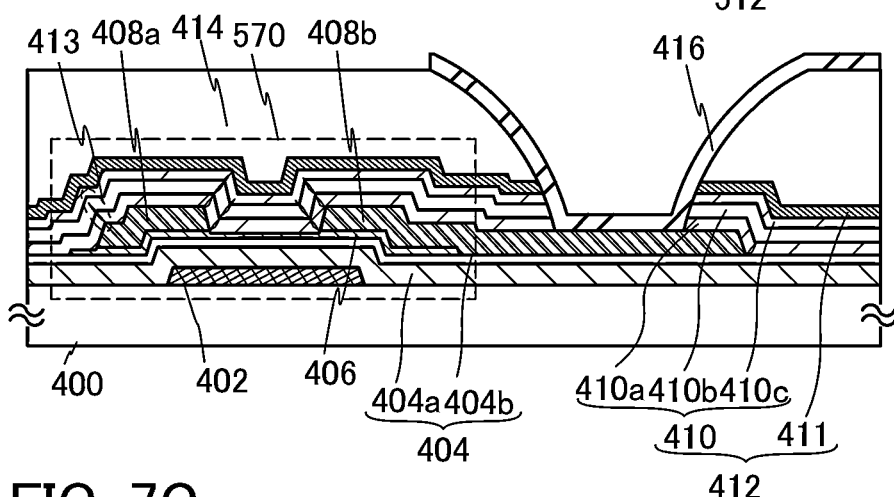
Figure 7C:
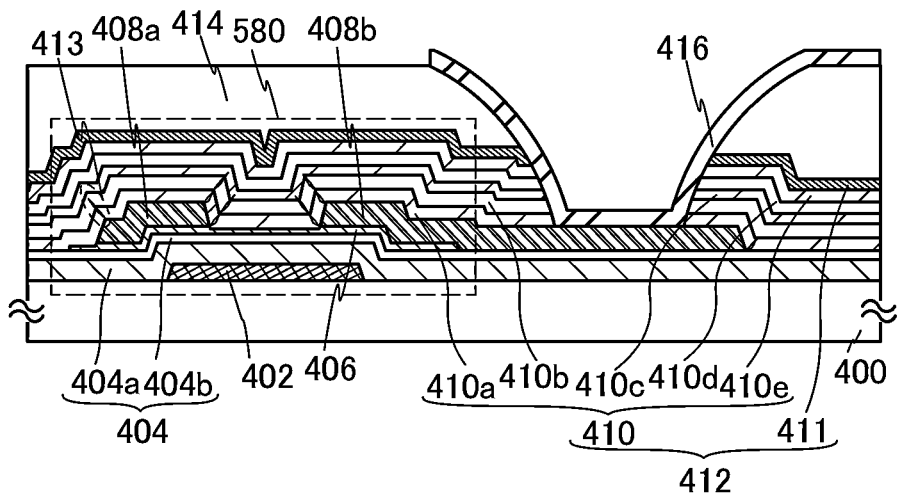

Further, in the case where oxide insulating films are stacked as illustrated in FIG. 7B and FIG. 7C in Embodiment 3, the oxide insulating film 410b is a film which supplies oxygen to the oxide semiconductor film; thus, when the nitride insulating film 411 is formed in contact with the oxide insulating film 410b with a high application power, excess oxygen contained in the oxide insulating film 410b is released and oxygen supply capability might be impaired.

Thus, by providing the oxide insulating film 410c or the oxide insulating film 410e directly under the nitride insulating film 411, impairment of the oxygen supply capability of the oxide insulating film 410b or the oxide insulating film 410d due to the formation of the nitride insulating film 411 can be suppressed.

Next, models showing movement of nitrogen, hydrogen, water which is generated by heat treatment in an oxide semiconductor film 31 and an oxide insulating film 32 which can supply oxygen are described with reference to FIGS. 25A to 25D, FIGS. 26A to 26E, and FIGS. 27A to 27C. Note that in FIGS. 25A to 25D, FIGS. 26A to 26E, and FIGS. 27A to 27C, a broken line arrow indicates movement of each atom which is generated by heating, and a solid line indicates a change during heat treatment or before and after the heat treatment. Further, as the oxide insulating film 32, an oxide insulating film containing more oxygen than in the stoichiometric composition is used.

FIGS. 25A to 25D each show a model showing movement of atoms which can be mainly generated in the oxide insulating film 32 by heat treatment.

Figure 25A:
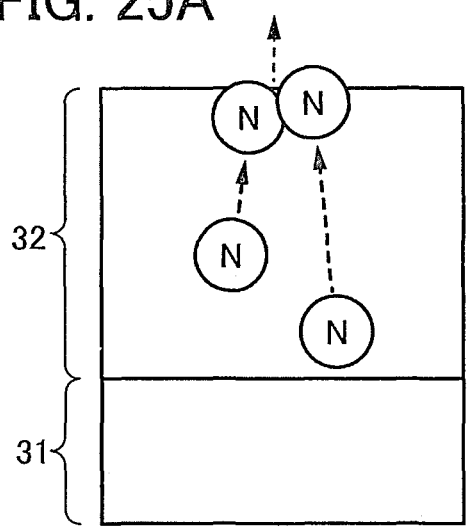
FIGS. 25A to 25D are model diagrams showing movement of nitrogen, hydrogen, and water which is generated by heat treatment in an oxide insulating film containing nitrogen.

FIG. 25A shows movement of nitrogen atoms which is generated by heat treatment. In the model, nitrogen atoms N (here, two nitrogen atoms) contained in the oxide insulating film 32 are bonded to each other in the oxide insulating film 32 or at the surface thereof by heat treatment to form a nitrogen molecule, and the nitrogen molecule is released from the oxide insulating film 32.

Figure 25B:
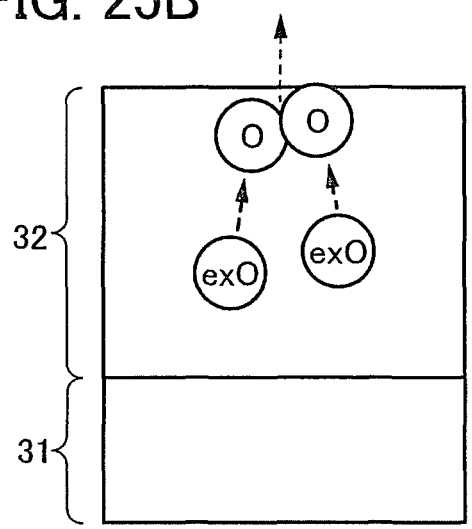

FIG. 25B is a model showing movement of oxygen atoms which is generated by heat treatment. An oxygen atom which is an excess of oxygen atoms over that in the stoichiometric composition (here, two oxygen atoms indicated by exO) contained in the oxide insulating film 32 are bonded to each other in the oxide insulating film 32 or at the surface thereof by heat treatment to form an oxygen molecule, and the oxygen molecule is released from the oxide insulating film 32.

Figure 25C:
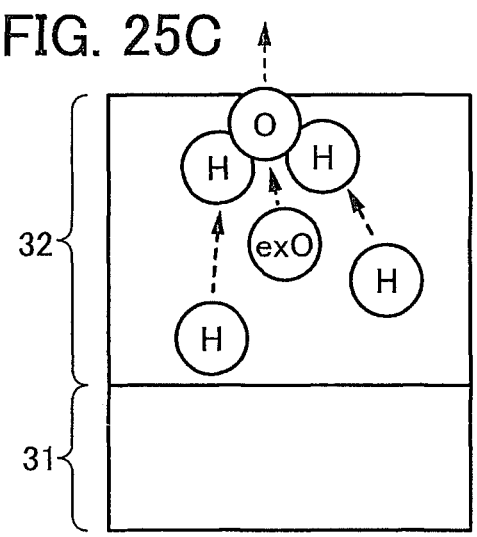

FIG. 25C is a model showing movement of hydrogen atoms and an oxygen atom which is generated by heat treatment. Hydrogen atoms H (here, two hydrogen atoms) and an oxygen atom exO which is an excess of oxygen atoms over that in the stoichiometric composition contained in the oxide insulating film 32 are bonded to each other in the oxide insulating film 32 or at the surface thereof by heat treatment to form a water molecule, and the water molecule is released from the oxide insulating film 32.

Figure 25D:
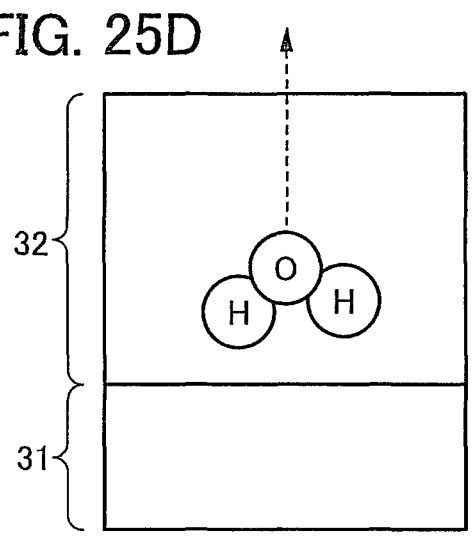

FIG. 25D is a model showing movement of a water molecule which is generated by heat treatment. The water molecule contained in the oxide insulating film 32 is released from the oxide insulating film 32 by heat treatment.

As shown in the above models, one or more nitrogen, hydrogen, and water are released from the oxide insulating film 32 by heat treatment, whereby nitrogen content, hydrogen content, and water content in the film can be reduced.

Next, a model showing movement of atoms which can be generated by heat treatment in the oxide semiconductor film 31 is described with reference to FIGS. 26A to 26E.

Figure 26A:
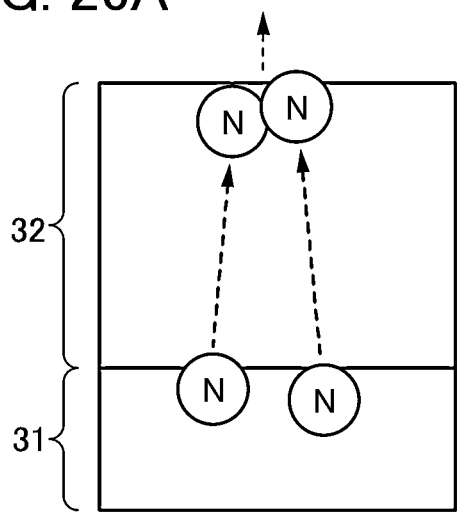
FIGS. 26A to 26E are model diagrams showing movement of nitrogen, hydrogen, and water which is generated by heat treatment in an oxide semiconductor film.

FIG. 26A is a model showing movement of nitrogen atoms which is generated by heat treatment. Nitrogen atoms N (here, two nitrogen atoms) contained in the oxide semiconductor film 31 are bonded to each other in the oxide semiconductor film 31, at the interface between the oxide semiconductor film 31 and the oxide insulating film 32, in the oxide insulating film 32, or at the surface of the oxide insulating film 32 by heat treatment to form a nitrogen molecule, and the nitrogen molecule is released from the oxide semiconductor film 31.

Figure 26B:
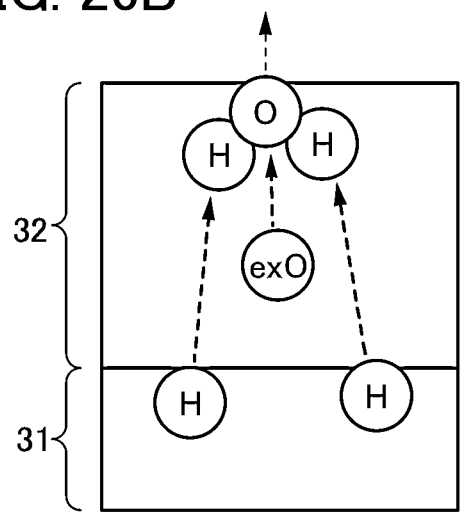

FIG. 26B is a model showing movement of hydrogen atoms and an oxygen atom which is generated by heat treatment. After hydrogen atoms H (here, two hydrogen atoms) contained in the oxide semiconductor film 31 are moved to the oxide insulating film 32 by heat treatment, these hydrogen atoms are bonded to an oxygen atom exO which is an excess of oxygen atoms over that in the stoichiometric composition in the oxide insulating film 32 or at the surface thereof to form a water molecule, and the water molecule is released from the oxide insulating film 32.

Figure 26C:
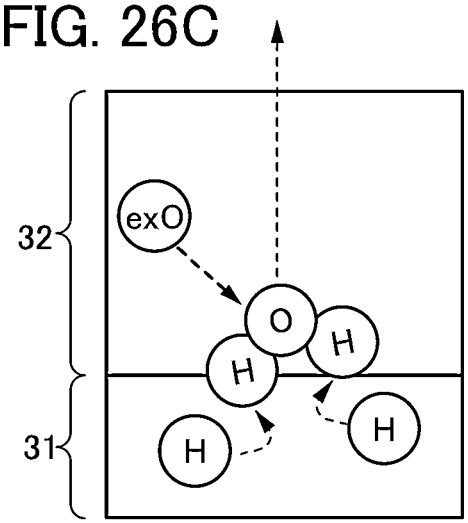

FIG. 26C is a model showing another movement of hydrogen atoms and an oxygen atom which is generated by heat treatment. Hydrogen atoms H contained in the oxide semiconductor film 31 are bonded to the oxygen atom exO which is an excess of oxygen atoms over that in the stoichiometric composition in the oxide semiconductor film 31 or at the interface between the oxide semiconductor film 31 and the oxide insulating film 32 by heat treatment to form a water molecule, and the water molecule is released from the oxide insulating film 32.

Figure 26D:
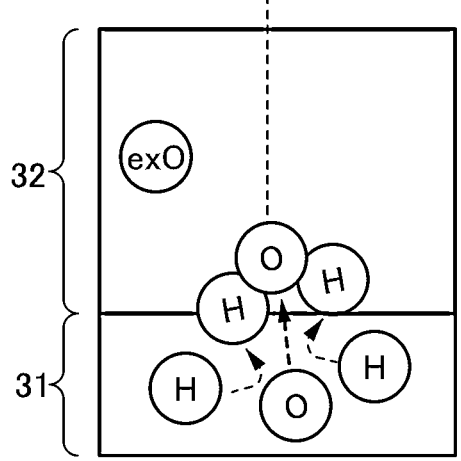
Figure 26E:
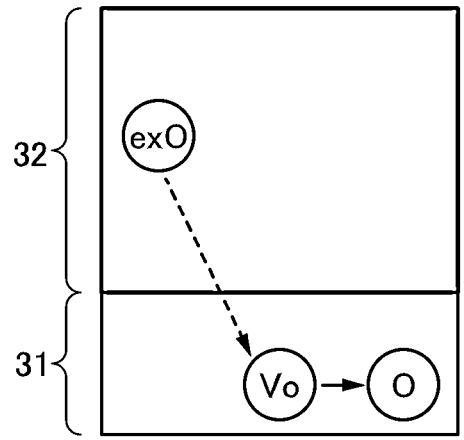

FIGS. 26D and 26E are models each showing another movement of hydrogen atoms and oxygen atoms which is generated by heat treatment. Hydrogen atoms H and an oxygen atom O which are contained in the oxide semiconductor film 31 are bonded to each other in the oxide semiconductor film 31, at the interface between the oxide semiconductor film 31 and the oxide insulating film 32, in the oxide insulating film 32, or at the surface of the oxide insulating film 32 to form a water molecule, and the water molecule is released from the oxide insulating film 32. At this time, in the oxide semiconductor film 31, a position from which the oxygen atom is released becomes an oxygen vacancy Vo as illustrated in FIG. 26E; however, the oxygen atom exO which is an excess of oxygen atoms over that in the stoichiometric composition is moved to the position of the oxygen vacancy Vo, and the oxygen vacancy Vo is filled with the oxygen atom exO to form an oxygen atom O.

In this manner, one or more nitrogen, hydrogen, and water are released from the oxide semiconductor film 31 by heat treatment, whereby nitrogen content, hydrogen content, and water content in the film can be reduced.

Next, models each showing a change in oxygen vacancies in the oxide semiconductor film 31 by heat treatment is described with reference to FIGS. 27A to 27C.

When an excess of oxygen atoms over that in the stoichiometric composition is moved to the oxide semiconductor film 31, a first oxygen atom is pushed out by the excess of oxygen atoms over that in the stoichiometric composition from the position of the first oxygen atom. The first oxygen atom which has been pushed out is moved to a position of a second oxygen atom and the second oxygen atom is pushed out. In this manner, when an excess of oxygen atoms over that in the stoichiometric composition is moved to the oxide semiconductor film 31, oxygen atoms are sequentially pushed out among the plurality of oxygen atoms. In FIGS. 27A to 27C, oxygen atoms are sequentially pushed out among the plurality of oxygen atoms is not shown, and models each showing a change in oxygen vacancies are described using three oxygen vacancies (Vo_1, Vo_2, and Vo_3) contained in the oxide semiconductor film 31 and oxygen contained in the oxide insulating film 32 which can supply oxygen, specifically, an excess of oxygen atoms over that in the stoichiometric composition (exO_1, exO_2, and exO_3). Note that the oxide insulating film 32 is a stack of an oxide insulating film 32a with high coverage and an oxide insulating film 32b which can supply oxygen, which is formed under a low power condition.

Figure 27A:
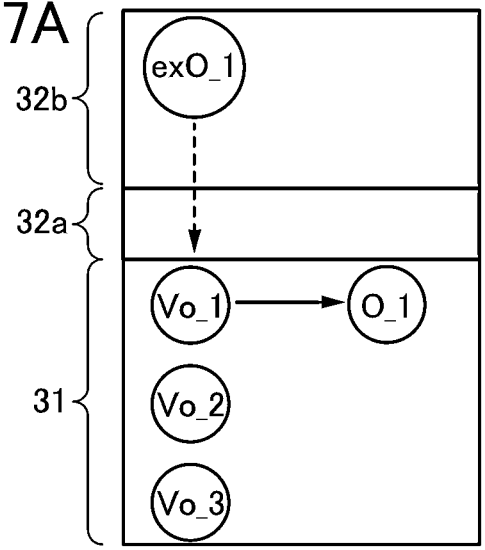
FIGS. 27A to 27C are model diagrams showing a change in oxygen vacancies by heating in an oxide semiconductor film.
Figure 27B:
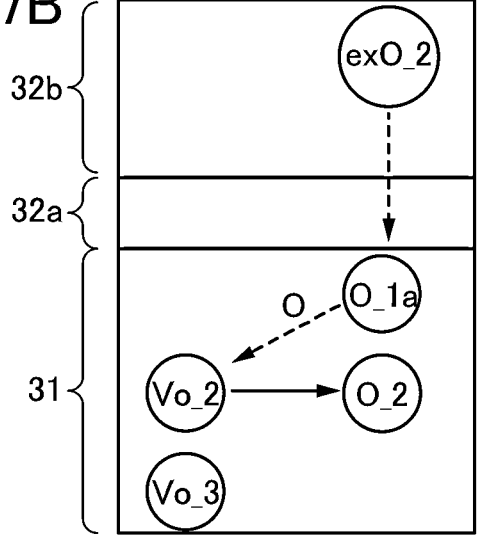
Figure 27C:
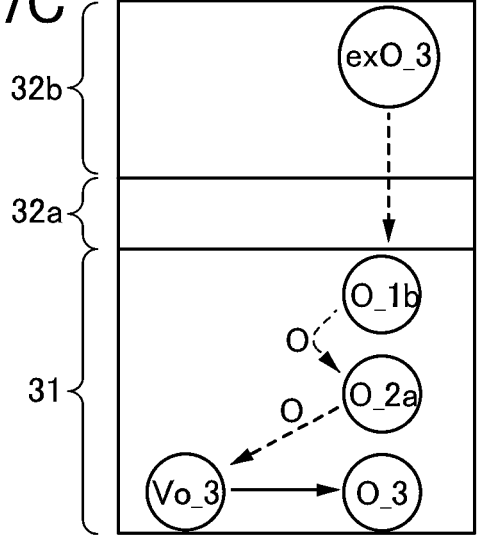

In FIGS. 27A to 27C, three oxygen vacancies (Vo_1, Vo_2, and Vo_3) contained in the oxide semiconductor film 31 and oxygen contained in the oxide insulating film 32b which can supply oxygen, specifically, an excess of oxygen atoms over that in the stoichiometric composition (exO_1, exO_2, and exO_3) are shown.

FIG. 27A shows reaction between an oxygen vacancy Vo_1 and an oxygen atom exO_1 by heat treatment. An excess of oxygen atoms over that in the stoichiometric composition exO_1 is moved to the position of the oxygen vacancy Vo_1 contained in the oxide semiconductor film 31 by heat treatment, the oxygen vacancy Vo_1 is filled, so that an oxygen atom O_1 is formed.

Next, as illustrated in FIG. 27B, when an excess of oxygen atoms over that in the stoichiometric composition exO_2 gets closer to the position of the oxygen atom O_1 contained in the oxide semiconductor film 31, an oxygen atom O is released from the position of the oxygen atom O_1. The released oxygen atom O is moved to the position of an oxygen vacancy Vo_2, the oxygen vacancy Vo_2 is filled, so that an oxygen atom O_2 is formed. On the other hand, the position of the oxygen atom O_1 from which an oxygen atom is released becomes an oxygen vacancy; however, an oxygen atom exO_2 is moved to the position of the oxygen vacancy, so that the oxygen atom O_1a is formed.

Next, as illustrated in FIG. 27C, when an excess of oxygen atoms over that in the stoichiometric composition exO_3 gets closer to the position of the oxygen atom O_1a contained in the oxide semiconductor film 31, an oxygen atom O is released from the position of the oxygen atom O_1a. The released oxygen atom O is moved to the position of the oxygen atom O_2. An oxygen atom O is released from the oxygen atom O_2. An oxygen vacancy Vo_3 is filled with the released oxygen atom O, so that an oxygen atom O_3 is formed. On the other hand, the position of the oxygen atom O_1a from which an oxygen atom is released becomes an oxygen vacancy; however, an oxygen atom exO_3 is moved to the position of the oxygen vacancy, so that the oxygen atom O_1b is formed. Further, the position of the oxygen atom O_2 from which an oxygen atom is released also becomes an oxygen vacancy; however, the oxygen atom released from the oxygen atom O_1a is moved to the oxygen vacancy, so that the oxygen atom O_2a is formed.

Through the above steps, an oxygen vacancy contained in the oxide semiconductor film 31 can be filled with oxygen contained in the oxide insulating film 32b which can supply oxygen. Further, not only an oxygen vacancy on the surface of the oxide semiconductor film 31, but also an oxygen vacancy in the film can be filled by heat treatment. As described above, the oxide insulating film 32b which can supply oxygen while being heated is formed or heat treatment is performed after the oxide insulating film 32b which can supply oxygen is provided, whereby the number of oxygen vacancies contained in the oxide semiconductor film 31 can be reduced.

When the oxide insulating film 32b which contains more oxygen than in the stoichiometric composition is provided over a back channel of the oxide semiconductor film 31 with an oxide insulating film provided as the oxide insulating film 32a through which oxygen is permeated, oxygen can be moved to the back channel side of the oxide semiconductor film 31, and oxygen vacancies on the back channel side can be reduced.

The structures, methods, and the like described in this embodiment can be combined as appropriate with any of the structures, methods, and the like described in the other embodiments.

Embodiment 5

Figure 11:
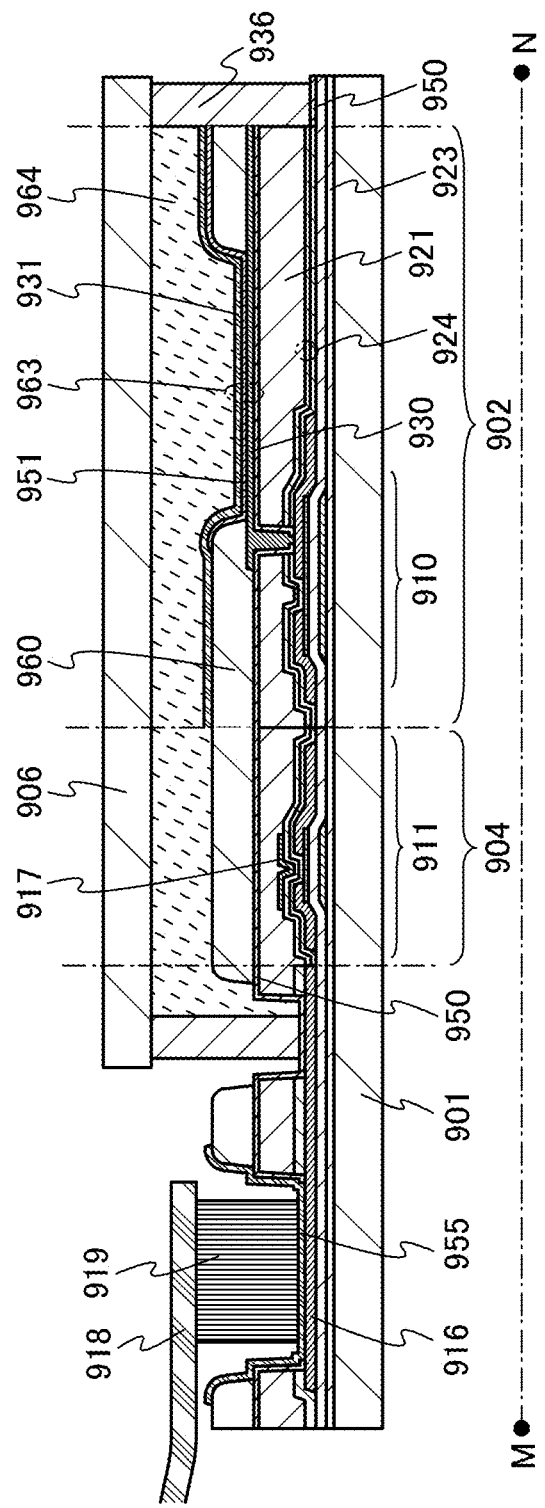
FIG. 11 is a cross-sectional view illustrating one embodiment of a display device.

A semiconductor device (also referred to as a display device) having a display function can be manufactured using the transistor examples of which are shown in the above embodiments. Moreover, some or all of the driver circuits which include the transistor can be formed over a substrate where the pixel portion is formed, whereby a system-on-panel can be obtained. In this embodiment, an example of a display device using the transistor examples of which are shown in the above embodiments is described with reference to FIGS. 9A to 9C, FIGS. 10A and 10B, FIG. 11, and FIGS. 12A to 12C. FIGS. 10A, 10B, and FIG. 11 are cross-sectional views illustrating cross-sectional structures taken along chain line M-N in FIG. 9B.

Figure 9A:
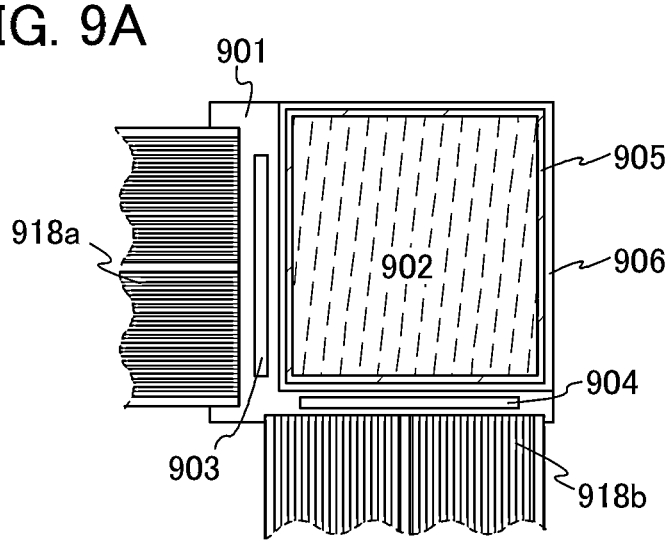
FIGS. 9A to 9C are cross-sectional views each illustrating one embodiment of a display device.

In FIG. 9A, a sealant 905 is provided so as to surround a pixel portion 902 provided over a first substrate 901, and the pixel portion 902 is sealed with a second substrate 906. In FIG. 9A, a signal line driver circuit 903 and a scan line driver circuit 904 each are formed using a single crystal semiconductor or a polycrystalline semiconductor over a substrate prepared separately, and mounted in a region different from the region surrounded by the sealant 905 over the first substrate 901. Further, various signals and potentials are supplied to the signal line driver circuit 903, the scan line driver circuit 904, and the pixel portion 902 from flexible printed circuits (FPCs) 918a and 918b.

Figure 9B:
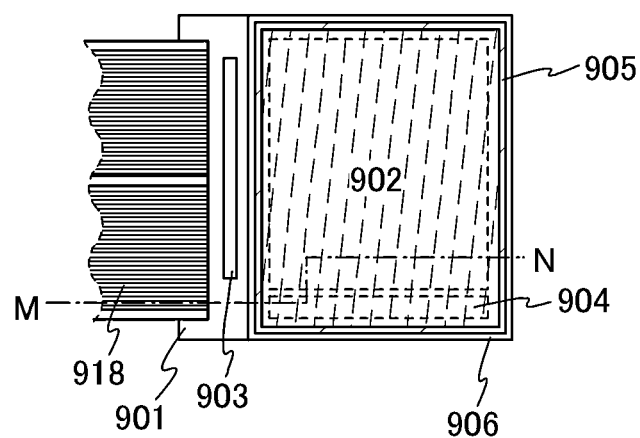
Figure 9C:
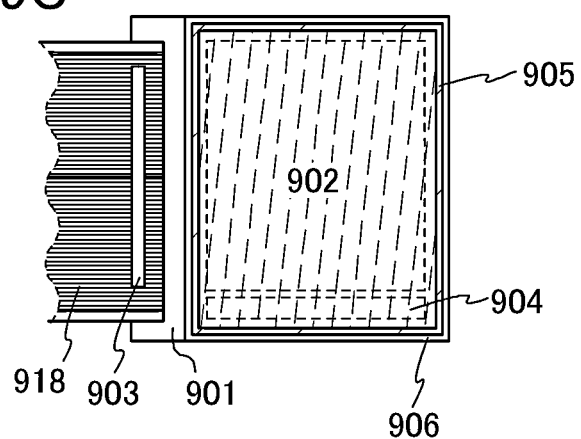

In FIGS. 9B and 9C, the sealant 905 is provided so as to surround the pixel portion 902 and the scan line driver circuit 904 which are provided over the first substrate 901. The second substrate 906 is provided over the pixel portion 902 and the scan line driver circuit 904. Thus, the pixel portion 902 and the scan line driver circuit 904 are sealed together with a display element by the first substrate 901, the sealant 905, and the second substrate 906. In FIGS. 9B and 9C, a signal line driver circuit 903 which is formed using a single crystal semiconductor or a polycrystalline semiconductor over a substrate separately prepared is mounted in a region different from the region surrounded by the sealant 905 over the first substrate 901. In FIGS. 9B and 9C, various signals and potentials are supplied to the signal line driver circuit 903, the scan line driver circuit 904, and the pixel portion 902 from an FPC 918.

Although FIGS. 9B and 9C each show an example in which the signal line driver circuit 903 is formed separately and mounted on the first substrate 901, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 9A shows an example in which the signal line driver circuit 903 and the scan line driver circuit 904 are mounted by a COG method. FIG. 9B shows an example in which the signal line driver circuit 903 is mounted by a COG method. FIG. 9C shows an example in which the signal line driver circuit 903 is mounted by a TAB method.

The display device includes in its category a panel in which a display element is sealed and a module in which an IC including a controller or the like is mounted on the panel.

A display device in this specification refers to an image display device, a display device, or a light source (including a lighting device). Further, the display device also includes the following modules in its category: a module to which a connector such as an FPC, a TAB tape, or a TCP is attached; a module having a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in the above embodiments can be used.

As the display element provided in the display device, a liquid crystal element (also referred to as a liquid crystal display element) or a light-emitting element (also referred to as a light-emitting display element) can be used. A light emitting element includes, in its scope, an element whose luminance is controlled by current or voltage, and specifically includes an inorganic electroluminescent (EL) element, an organic EL element, and the like. Further, a display medium whose contrast is changed by an electric effect, such as electronic ink, can be used.

A light-emitting device shown in FIG. 10A includes a connection terminal electrode 915 and a terminal electrode 916. The connection terminal electrode 915 and the terminal electrode 916 are electrically connected to a terminal included in the FPC 918 through an anisotropic conductive agent 919.

The connection terminal electrode 915 is formed using the same conductive film as a first electrode 930, and the terminal electrode 916 is formed using the same conductive film as a source electrode and a drain electrode (hereinafter, also referred to as a pair of electrodes) in each of a transistor 910 and a transistor 911.

A light-emitting device shown in FIG. 10B includes a connection terminal electrodes 915a, 915b, and a terminal electrode 916. The connection terminal electrodes 915a, 915b, and the terminal electrode 916 are electrically connected to a terminal included in the FPC 918 through an anisotropic conductive agent 919.

The connection terminal electrode 915a is formed using the same conductive film as the first electrode 930, the connection terminal electrode 915b is formed using the same conductive film as a third electrode 941, and the terminal electrode 916 is formed using the same conductive film as a pair of electrodes in each of the transistor 910 and the transistor 911.

Further, as illustrated in FIG. 11, the semiconductor device includes a connection terminal electrode 955 and a terminal electrode 916. The connection terminal electrode 955 and the terminal electrode 916 are electrically connected to a terminal included in the FPC 918 through an anisotropic conductive agent 919.

The connection terminal electrode 955 is formed using the same conductive film as a second electrode 931, and the terminal electrode 916 is formed using the same conductive film as a pair of electrodes in each of a transistor 910 and a transistor 911.

Each of the pixel portion 902 and the scan line driver circuit 904 which are provided over the first substrate 901 includes a plurality of transistors. FIGS. 10A and 10B and FIG. 11 illustrate the transistor 910 included in the pixel portion 902 and the transistor 911 included in the scan line driver circuit 904. In FIGS. 10A and 10B, an insulating film 924 corresponding to the insulating film 412 in Embodiment 1 is provided in each of the transistor 910 and the transistor 911, and an interlayer insulating film 921 functioning as a planarization film is further provided over the insulating film 924. Note that the insulating film 923 is an insulating film serving as a base film.

In this embodiment, any of the transistors described in the above embodiments can be used as the transistor 910 and the transistor 911.

Moreover, FIG. 11 shows an example in which a conductive film 917 is provided over the insulating film 924 so as to overlap with a channel formation region of the semiconductor film of the transistor 911 for the driver circuit. Note that an oxide semiconductor film is used as the semiconductor film. By providing the conductive film 917 so as to overlap with the channel formation region of the oxide semiconductor film, the amount of change in the threshold voltage of the transistor 911 between before and after a BT stress test can be further reduced. The conductive film 917 may have the same potential as or a potential different from that of the gate electrode of the transistor 911, and the conductive film 917 can serve as a second gate electrode. The potential of the conductive film 917 may be GND, 0 V or in a floating state.

In addition, the conductive film 917 has a function of blocking an external electric field. In other words, the conductive film 917 has a function of preventing an external electric field (particularly, a function of preventing static electricity) from affecting the inside (a circuit portion including the transistor). Such a blocking function of the conductive film 917 can prevent a change in electrical characteristics of the transistor due to the influence of an external electric field such as static electricity. The conductive film 917 can be used for any of the transistors described in the above embodiments.

In the display panel, the transistor 910 included in the pixel portion 902 is electrically connected to a display element. There is no particular limitation on the kind of the display element as long as display can be performed, and various kinds of display elements can be used.

The first electrode and the second electrode (each of which may be called a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 930, the second electrode 931, and the third electrode 941 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

Alternatively, the first electrode 930, the second electrode 931, and the third electrode 941 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

The first electrode 930, the second electrode 931, and the third electrode 941 can be formed using a conductive composition including a conductive macromolecule (also referred to as a conductive polymer). As the conductive high molecule, what is called a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, and the like can be given.

An example of a liquid crystal display device using a liquid crystal element as a display element is illustrated in FIGS. 10A and 10B. FIG. 10A illustrates an example in which a vertical electric field method is employed.

In FIG. 10A, a liquid crystal element 913 which is a display element includes the first electrode 930, a second electrode 931, and a liquid crystal layer 908. Note that an insulating film 932 and an insulating film 933 which serve as alignment films are provided so that the liquid crystal layer 908 is provided therebetween. The second electrode 931 is provided on the second substrate 906 side. The second electrode 931 overlaps with the first electrode 930 with the liquid crystal layer 908 provided therebetween.

In FIG. 10B, a liquid crystal element 943 which is a display element includes the first electrode 930, the third electrode 941, and the liquid crystal layer 908 which are formed over the interlayer insulating film 921. The third electrode 941 functions as the common electrode. An insulating film 944 is provided between the first electrode 930 and the third electrode 941. The insulating film 944 is formed using a silicon nitride film. An insulating film 932 and an insulating film 933 which serve as alignment films are provided so that the liquid crystal layer 908 is provided therebetween.

A spacer 935 is a columnar spacer obtained by selective etching of an insulating film and is provided in order to control the distance between the first electrode 930 and the second electrode 931 (a cell gap). Alternatively, a spherical spacer may be used.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is raised. Since the blue phase appears only in a narrow temperature range, a liquid crystal composition in which a chiral material is mixed is used for the liquid crystal layer in order to improve the temperature range. The liquid crystal composition which includes a liquid crystal showing a blue phase and a chiral agent has a short response time of 1 msec or less, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, the productivity of the liquid crystal display device can be increased.

The first substrate 901 and the second substrate 906 are fixed in place by the sealant 925. As the sealant 925, an organic resin such as a thermosetting resin or a photocurable resin can be used.

In the liquid crystal display device in FIG. 10A, the sealant 925 is in contact with a gate insulating film 922, and the interlayer insulating film 921 is provided on an inner side than the sealant 925. Note that the gate insulating film 922 is formed by stacking a silicon nitride film and a silicon oxynitride film. Further, when the insulating film 924 is selectively etched, it is preferable that the silicon nitride film be exposed by etching the silicon oxynitride film in the upper layer of the gate insulating film 922. As a result, the sealant 925 is in contact with the silicon nitride film formed in the gate insulating film 922, and entry of water from the outside into the sealant 925 can be suppressed.

In the liquid crystal display device in FIG. 10B, the sealant 925 is in contact with the insulating film 924. The interlayer insulating film 921 is provided on an inner side than the sealant 925 and the sealant 925 is in contact with the silicon nitride film on the surface of the insulating film 924; thus, entry of water from the outside into the sealant 925 can be suppressed.

The size of storage capacitor formed in the liquid crystal display device is set considering the leakage current of the transistor provided in the pixel portion or the like so that charge can be held for a predetermined period. By using the transistor including the highly-purified oxide semiconductor film, it is enough to provide a storage capacitor having a capacitance that is ⅓ or less, preferably ⅕ or less of a liquid crystal capacitance of each pixel; therefore, the aperture ratio of a pixel can be increased.

In the display device, a black matrix (a light-blocking film), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be used. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. The present invention is not limited to the application to a display device for color display but can also be applied to a display device for monochrome display.

Figure 12A:
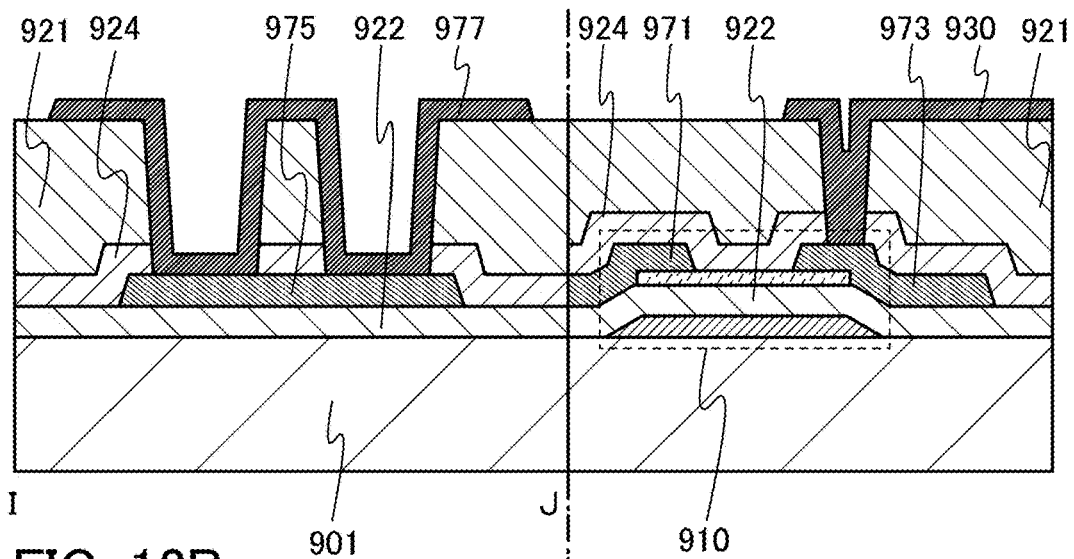
FIGS. 12A to 12C illustrate one embodiment of a display device.
Figure 12B:
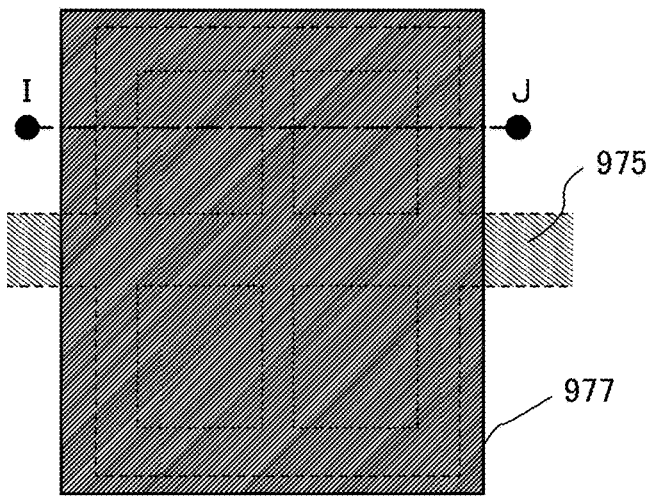
Figure 12C:
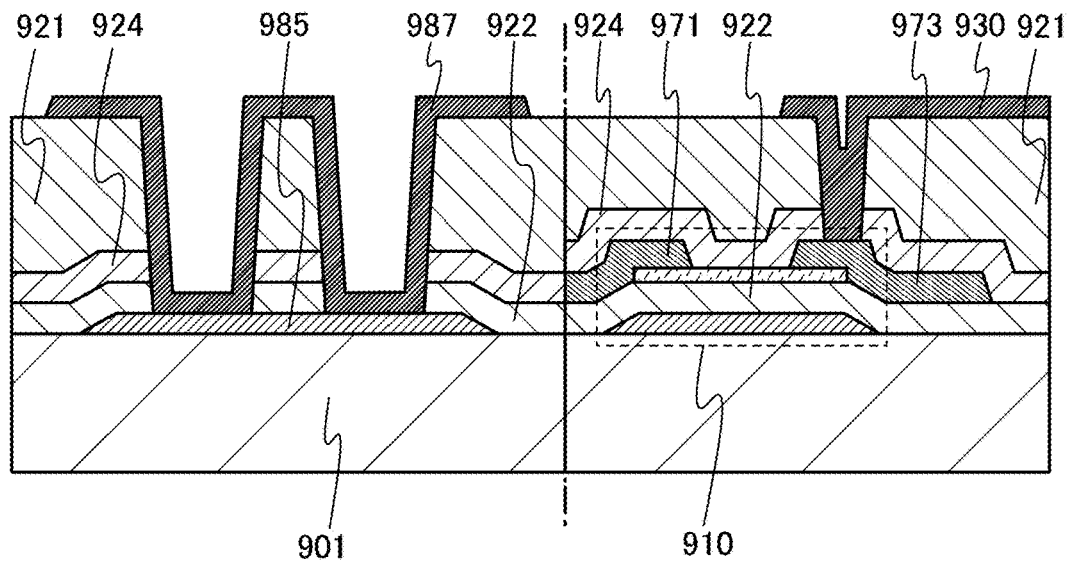

FIGS. 12A to 12C illustrate an example of the display device in FIG. 10A in which a common connection portion (pad portion) for electrically connecting to the second electrode 931 provided on the substrate 906 is formed over the substrate 901.

The common connection portion is provided in a position that overlaps with the sealant for bonding the substrate 901 and the substrate 906, and is electrically connected to the second electrode 931 through conductive particles contained in the sealant. Alternatively, the common connection portion is provided in a position that does not overlap with the sealant (except for the pixel portion) and a paste containing conductive particles is provided separately from the sealant so as to overlap with the common connection portion, whereby the common connection portion is electrically connected to the second electrode 931.

FIG. 12A is a cross-sectional view of the common connection portion taken along a line I-J in the top view in FIG. 12B.

A common potential line 975 is provided over the gate insulating film 922 and is formed using the same material and through the same steps as a source electrode 971 and a drain electrode 973 of the transistor 910 illustrated in FIGS. 10A and 10B.

Further, the common potential line 975 is covered with the insulating film 924 and the interlayer insulating film 921, and a plurality of openings is provided in the insulating film 924 and the interlayer insulating film 921 at positions overlapping with the common potential line 975. These openings are formed through the same steps as a contact hole which connects the first electrode 930 and one of the source electrode 971 and the drain electrode 973 of the transistor 910.

Further, the common potential line 975 is connected to the common electrode 977 through the openings. The common electrode 977 is provided over the interlayer insulating film 921 and formed using the same material and through the same steps as the connection terminal electrode 915 and the first electrode 930 in the pixel portion.

In this manner, the common connection portion can be manufactured in the same process as the switching element in the pixel portion 902.

The common electrode 977 is an electrode in contact with the conductive particles contained in the sealant, and is electrically connected to the second electrode 931 of the substrate 906.

Alternatively, as illustrated in FIG. 12C, a common potential line 985 may be formed using the same material and through the same steps as the gate electrode of the transistor 910.

In the common connection portion in FIG. 12C, the common potential line 985 is provided under the gate insulating film 922, the insulating film 924, and the interlayer insulating film 921, and a plurality of openings is provided in the gate insulating film 922, the insulating film 924, and the interlayer insulating film 921 at positions overlapping with the common potential line 985. These openings are formed by etching the insulating film 924 and the interlayer insulating film 921 and further selectively etching the gate insulating film 922, which are the same steps as a contact hole which connects the first electrode 930 and one of the source electrode 971 and the drain electrode 973 of the transistor 910.

Further, the common potential line 985 is connected to the common electrode 987 through the openings. The common electrode 987 is provided over the interlayer insulating film 921 and formed using the same material and through the same steps as the connection terminal electrode 915 and the first electrode 930 in the pixel portion.

Note that in the liquid crystal display device of an FFS mode in FIG. 10B, the common electrodes 977 and 987 are each connected to the third electrode 941.

Next, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In the organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

An example of a light-emitting device using a light-emitting element as the display element is shown in FIG. 11. A light-emitting element 963 which is a display element is electrically connected to the transistor 910 provided in the pixel portion 902. Note that although the structure of the light-emitting element 963 is a stacked-layer structure of the first electrode 930, a light-emitting layer 951, and the second electrode 931, the structure is not limited thereto. The structure of the light-emitting element 963 can be changed as appropriate depending on the direction in which light is extracted from the light-emitting element 963, or the like.

A silicon nitride film 950 is provided between the interlayer insulating film 921 and the first electrode 930. The silicon nitride film 950 is in contact with side surfaces of the interlayer insulating film 921 and the insulating film 924. A partition wall 960 is provided over end portions of the silicon nitride film 950 and the first electrode 930. The partition wall 960 can be formed using an organic insulating material or an inorganic insulating material. It is particularly preferred that the partition wall 960 be formed using a photosensitive resin material to have an opening over the first electrode 930 so that a sidewall of the opening has an inclined surface with a continuous curvature.

The light-emitting layer 951 may be formed to have a single-layer structure or a stacked-layer structure including a plurality of layers.

A protective layer may be formed over the second electrode 931 and the partition wall 960 in order to prevent oxygen, hydrogen, moisture, carbon dioxide, or the like from entering the light-emitting element 963. As the protective layer, a silicon nitride film, a silicon nitride oxide film, an aluminum oxide film, an aluminum nitride film, an aluminum oxynitride film, an aluminum nitride oxide film, a DLC film, or the like can be formed. In addition, in a space which is sealed with the first substrate 901, the second substrate 906, and a sealant 936, a filler 964 is provided and sealed. It is preferred that, in this manner, the light-emitting element be packaged (sealed) with a protective film (such as a laminate film or an ultraviolet curable resin film) or a cover material with high air-tightness and little degasification so that the panel is not exposed to the outside air.

As the sealant 936, an organic resin such as a thermosetting resin or a photocurable resin, fritted glass including low-melting glass, or the like can be used. The fritted glass is preferred because of its high barrier property against impurities such as water and oxygen. Further, in the case where the fritted glass is used as the sealant 936, as illustrated in FIG. 11, the fritted glass is provided over the silicon nitride film 950, whereby adhesion of the silicon nitride film 950 to the fritted glass becomes high and entry of water from the outside into the sealant 936 can be prevented.

As the filler 964, as well as an inert gas such as nitrogen or argon, an ultraviolet curable resin or a thermosetting resin can be used: polyvinyl chloride (PVC), an acrylic resin, polyimide, an epoxy resin, a silicone resin, polyvinyl butyral (PVB), ethylene vinyl acetate (EVA), or the like can be used. For example, nitrogen is used for the filler.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection film. For example, anti-glare treatment by which reflected light can be diffused by projections and depressions on the surface so as to reduce the glare can be performed.

Since the transistor is easily broken owing to static electricity or the like, a protective circuit for protecting the driver circuit is preferred to be provided. The protection circuit is preferred to be formed using a nonlinear element.

As described above, by using any of the transistors described in the above embodiments, a highly reliable semiconductor device having a display function can be provided.

This embodiment can be implemented in appropriate combination with the structures described in the other embodiments.

Embodiment 6

A semiconductor device having an image sensor function for reading data of an object can be formed with the use of the transistor described in any of the above Embodiments.

Figure 13A:
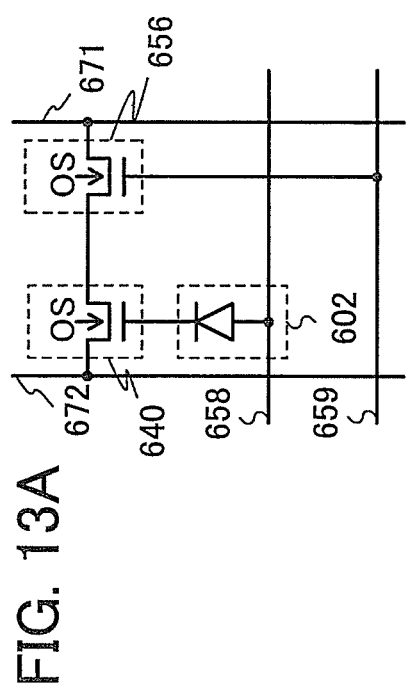
FIGS. 13A and 13B illustrate one embodiment of a semiconductor device.

An example of a semiconductor device having an image sensor function is illustrated in FIG. 13A. FIG. 13A illustrates an equivalent circuit of a photo sensor, and FIG. 13B is a cross-sectional view illustrating part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor including an oxide semiconductor film is denoted by a symbol "OS" so that it can be identified as a transistor including an oxide semiconductor film. In FIG. 13A, the transistor 640 and the transistor 656 are each a transistor including an oxide semiconductor film, to which the transistor described in any of the above embodiments can be applied. In this embodiment, an example in which a transistor having a structure similar to that of the transistor 450 described in Embodiment 1 is applied is described.

Figure 13B:
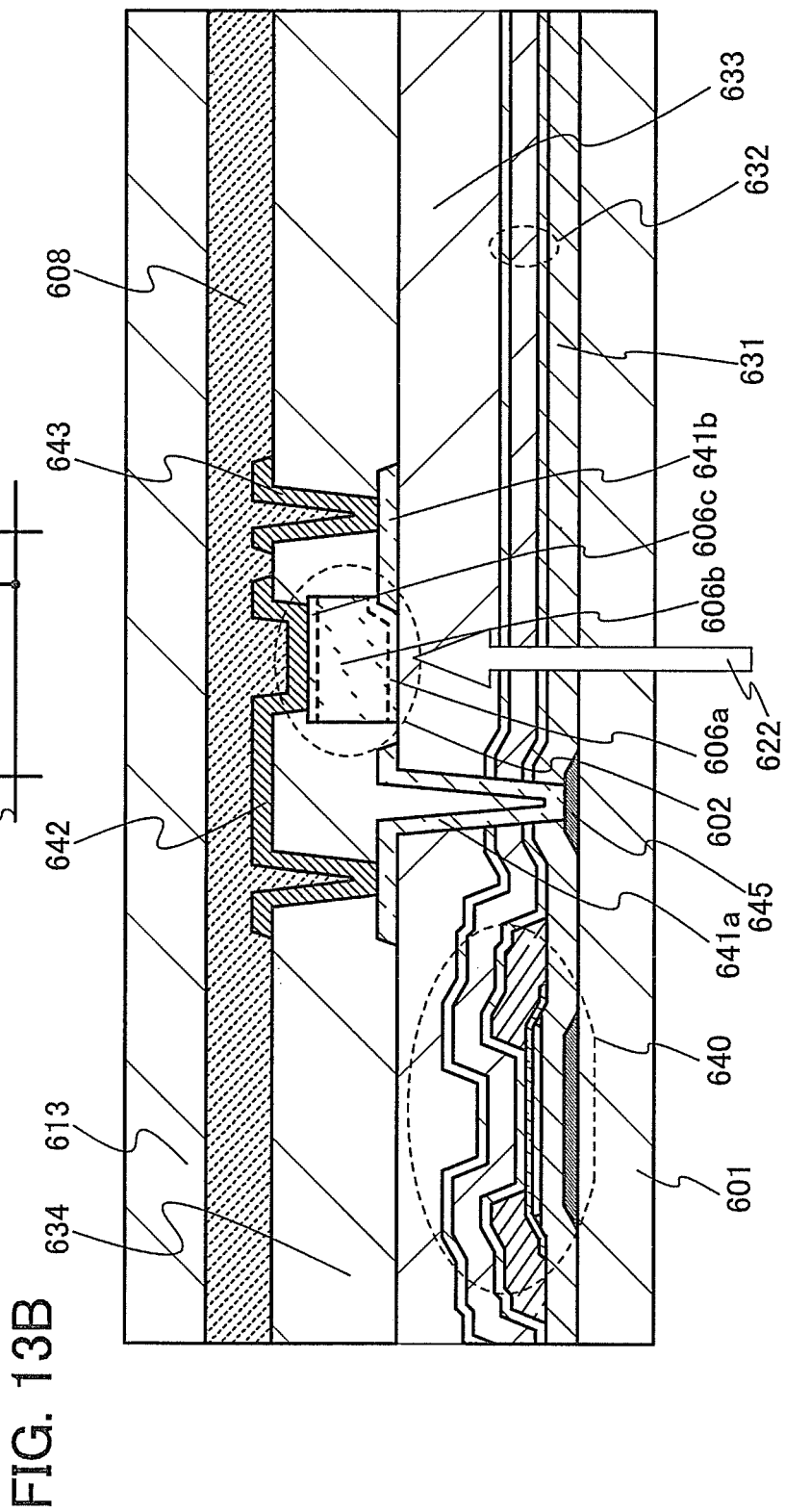

FIG. 13B is a cross-sectional view of the photodiode 602 and the transistor 640 in the photosensor. The transistor 640 and the photodiode 602 functioning as a sensor are provided over a substrate 601 (an element substrate) having an insulating surface. A substrate 613 is provided over the photodiode 602 and the transistor 640 with an adhesive layer 608 interposed therebetween.

An insulating film 632, a planarization film 633, and a planarization film 634 are provided over the transistor 640. The photodiode 602 includes an electrode 641b formed over the planarization film 633; a first semiconductor film 606a, a second semiconductor film 606b, and a third semiconductor film 606c over the electrode 641b in this order; an electrode 642 which is provided over the planarization film 634 and electrically connected to the electrode 641b through the first to third semiconductor films; and an electrode 641a which is provided in the same layer as the electrode 641b and electrically connected to the electrode 642.

The electrode 641b is electrically connected to a conductive layer 643 formed over the planarization film 634, and the electrode 642 is electrically connected to a conductive film 645 through the electrode 641a. The conductive film 645 is electrically connected to a gate electrode of the transistor 640, and thus the photodiode 602 is electrically connected to the transistor 640.

Here, a pin photodiode in which a semiconductor film having p-type conductivity type as the first semiconductor film 606a, a high-resistance semiconductor film (i-type semiconductor film) as the second semiconductor film 606b, and a semiconductor film having n-type conductivity type as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor material gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method.

Heating or the like may be conducted after introducing the impurity element by an ion implantation method or the like in order to diffuse the impurity element. In that case, as a method of forming the amorphous silicon film, an LPCVD method, a chemical vapor deposition method, a sputtering method, or the like may be used. The first semiconductor film 606a is preferably formed to a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor material gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor material gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion implantation method or the like in order to diffuse the impurity element. In that case, as a method of forming the amorphous silicon film, an LPCVD method, a chemical vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a semi-amorphous semiconductor (SAS).

In addition, the mobility of holes generated by the photoelectric effect is lower than the mobility of electrons. Therefore, a PIN photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Light from the semiconductor film having a conductivity type opposite to that of the semiconductor film on the light-receiving plane is disturbance light; therefore, the electrode is preferably formed using a light-blocking conductive film. Note that the n-type semiconductor film side may alternatively be a light-receiving plane.

The insulating film 632, the planarization film 633, and the planarization film 634 can be formed using an insulating material by a sputtering method, a plasma CVD method, spin coating, dipping, spray coating, a droplet discharge method (such as an inkjet method), screen printing, offset printing, or the like depending on the material. Note that as the insulating film 632, an insulating film similar to the insulating film 412 of Embodiment 1 is used.

For the planarization films 633 and 634, for example, an organic insulating material having heat resistance, such as polyimide, acrylic resin, a benzocyclobutene-based resin, polyamide, or epoxy resin, can be used. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

With detection of light that enters the photodiode 602, data on an object to be detected can be read. Note that a light source such as a backlight can be used at the time of reading information on an object.

The structure, method, and the like described in this embodiment can be used in combination with structures, methods, and the like described in other embodiments and examples, as appropriate.

Embodiment 7

A semiconductor device disclosed in this specification can be applied to a variety of electronic devices (including game machines). Examples of electronic devices include a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of these electronic devices are illustrated in FIGS. 14A to 14C.

Figure 14A:
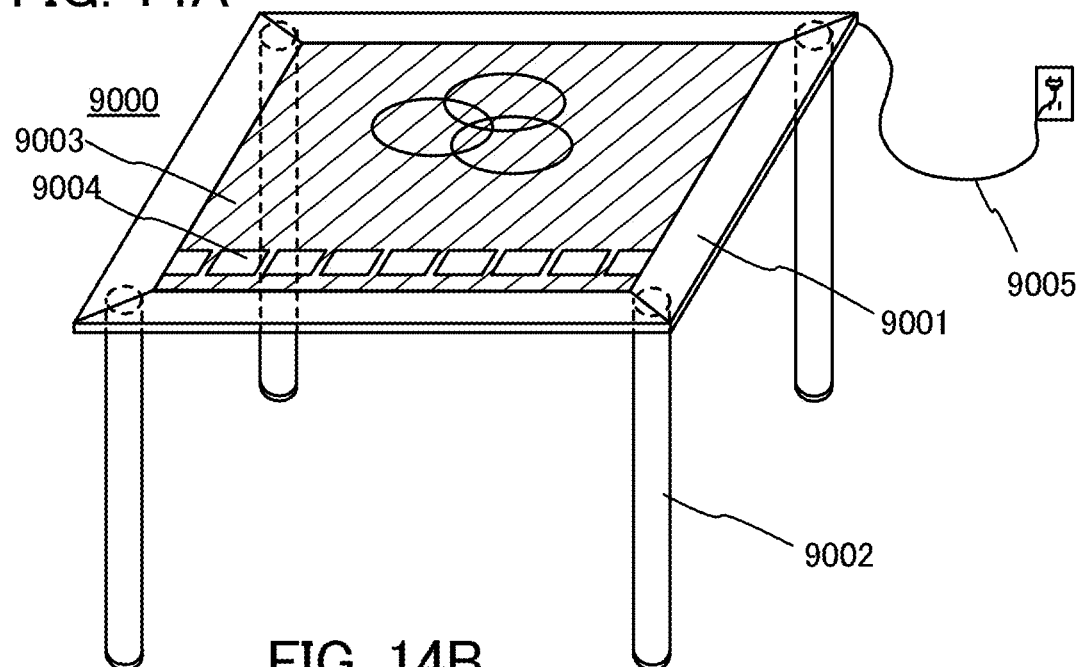
FIGS. 14A to 14C each illustrate an electronic device.
Figure 14B:
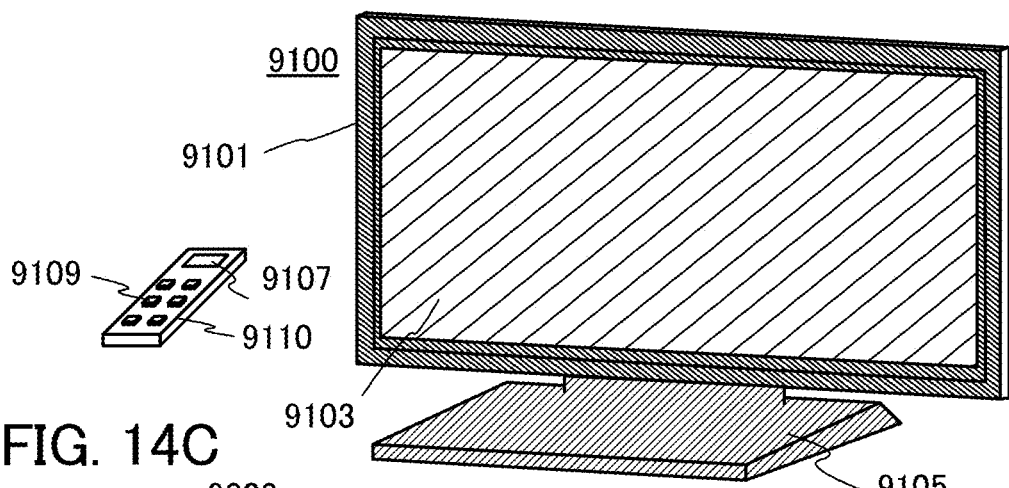
Figure 14C:
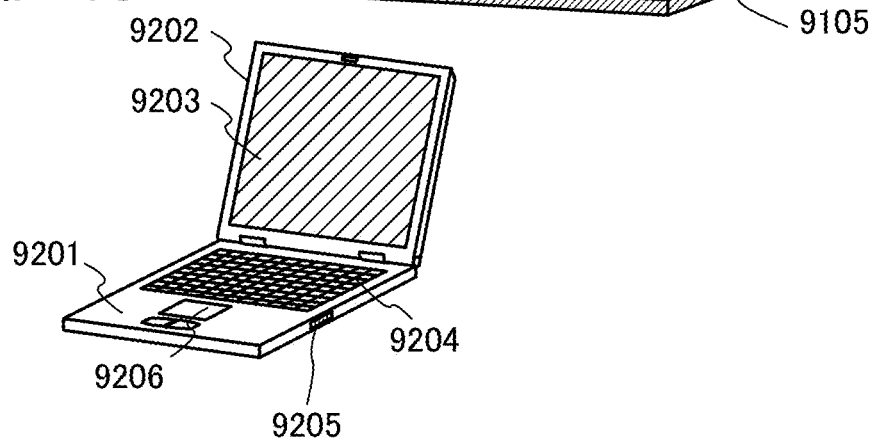

FIG. 14A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The transistor described in any of the above embodiments can be used for the display portion 9003, so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table may be made to communicate with home appliances or control the home appliances, the table 9000 may function as a control device which controls the home appliances by operation on the screen. For example, with use of the semiconductor device having an image sensor described in Embodiment 6, the display portion 9003 can function as a touch panel.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 14B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 14B is provided with a receiver, a modem, and the like. With the use of the receiver, the television set 9100 can receive general TV broadcasts. Moreover, when the television set 9100 is connected to a communication network with or without wires via the modem, one-way (from a sender to a receiver) or two-way (between a sender and a receiver or between receivers) information communication can be performed.

The transistor described in any of the above embodiments can be used in the display portions 9103 and 9107, so that the television set and the remote controller can have high reliability.

FIG. 14C illustrates a computer, which includes a main body 9201, a housing 9202, a display portion 9203, a keyboard 9204, an external connection port 9205, a pointing device 9206, and the like.

The transistor described in any of the above embodiments can be used for the display portion 9203, so that the computer can have high reliability.

Figure 15A:
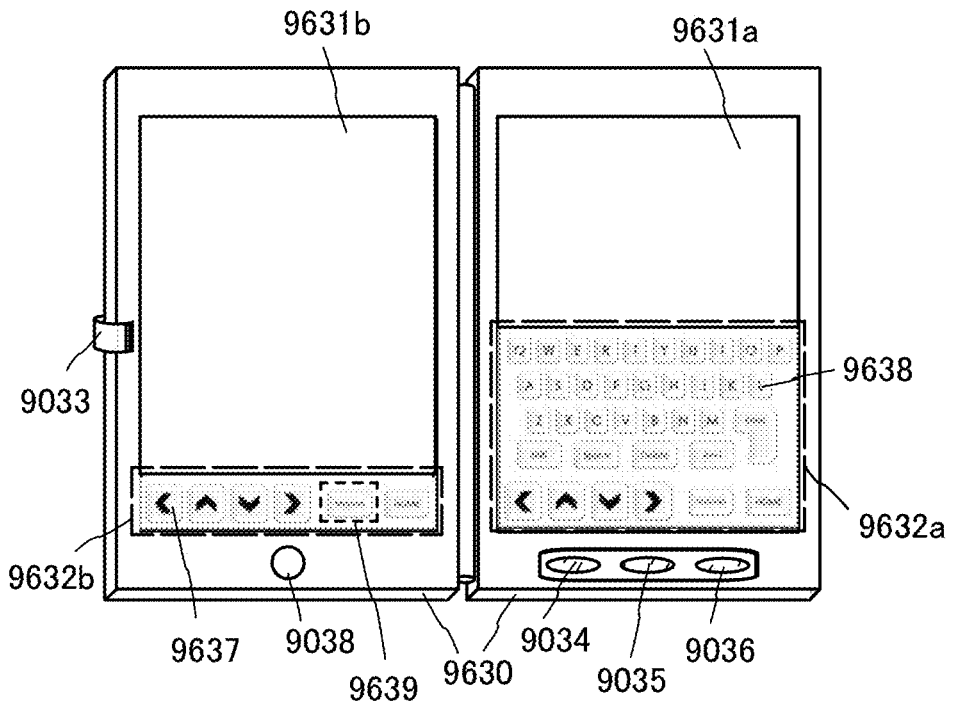
FIGS. 15A to 15C illustrate an electronic device.
Figure 15B:
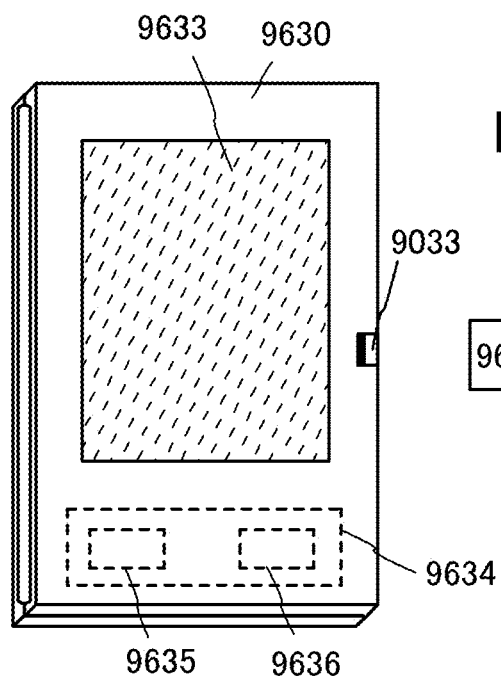

FIGS. 15A and 15B illustrate a tablet terminal that can be folded. In FIG. 15A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038.

The transistor described in any of the above embodiments can be used for the display portion 9631a and the display portion 9631b, so that the tablet terminal can have high reliability.

Part of the display portion 9631a can be a touch panel region 9632a, and data can be input by touching operation keys 9638 that are displayed. Although a structure in which a half region in the display portion 9631a has only a display function and the other half region also has a touch panel function is shown as an example, the display portion 9631a is not limited to the structure. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

In the display portion 9631b, as in the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The display-mode switching button 9034 allows switching between a landscape mode and a portrait mode, color display and black-and-white display, and the like. With the power-saving-mode switching button 9036 for switching to power-saving mode, the luminance of display can be optimized in accordance with the amount of external light at the time when the tablet is in use, which is detected with an optical sensor incorporated in the tablet. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 15A, one embodiment of the present invention is not limited to this example. The display portion 9631a and the display portion 9631b may have different areas or different display quality. For example, one of them may be a display panel that can display higher-definition images than the other.

FIG. 15B illustrates the tablet terminal folded, which includes the housing 9630, a solar battery 9633, and a charge and discharge control circuit 9634. Note that FIG. 15B shows an example in which the charge and discharge control circuit 9634 includes a battery 9635 and a DCDC converter 9636.

Since the tablet terminal can be folded in two, the housing 9630 can be closed when the tablet terminal is not in use. Thus, the display portions 9631a and 9631 b can be protected, thereby providing a tablet terminal with high endurance and high reliability for long-term use.

The tablet terminal illustrated in FIGS. 15A and 15B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar battery 9633, which is attached on the surface of the tablet terminal, supplies electric power to a touch panel, a display portion, an image signal processor, and the like. Note that the solar battery 9633 can be provided on one or two surfaces of the housing 9630, so that the battery 9635 can be charged efficiently. When a lithium ion battery is used as the battery 9635, there is an advantage of downsizing or the like.

Figure 15C:
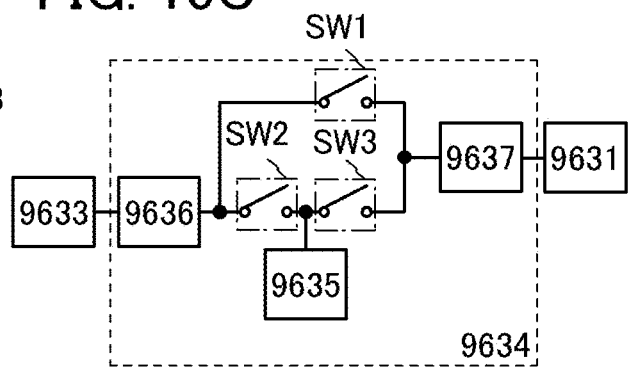

The structure and operation of the charge and discharge control circuit 9634 illustrated in FIG. 15B are described with reference to a block diagram of FIG. 15C. The solar battery 9633, the battery 9635, the DCDC converter 9636, a converter 9637, switches SW1 to SW3, and the display portion 9631 are illustrated in FIG. 15C, and the battery 9635, the DCDC converter 9636, the converter 9637, and the switches SW1 to SW3 correspond to the charge and discharge control circuit 9634 illustrated in FIG. 15B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

The structure, method, and the like described in this embodiment can be used in combination with structures, methods, and the like described in other embodiments, as appropriate.

Example 1

In this example, observation results of a cross section of a step portion of a source electrode and a drain electrode of a transistor in a semiconductor device according to the disclosed invention is described.

First, a method for manufacturing a transistor of an example sample is described.

A gate electrode was formed over the glass substrate first. A 100-nm-thick tungsten film was formed by a sputtering method. A mask was formed over the tungsten film by a photolithography process, and part of the tungsten film was etched using the mask, so that the gate electrode was formed.

Next, a gate insulating film was formed over the gate electrode. As the gate insulating film, a stacked layer of a 50-nm-thick silicon nitride film and a 200-nm-thick silicon oxynitride film was formed. The silicon nitride film was formed under the following conditions: silane with a flow rate of 50 sccm and nitrogen with a flow rate of 5000 sccm were supplied to a treatment chamber of a plasma CVD apparatus; the pressure in the treatment chamber was controlled to be 60 Pa; and the power of 150 W was supplied with the use of a 27.12 MHz high-frequency power source. The silicon oxynitride film was formed under the following conditions: silane with a flow rate of 20 sccm and dinitrogen monoxide with a flow rate of 3000 sccm were supplied to a treatment chamber of the plasma CVD apparatus; the pressure in the treatment chamber was controlled to be 40 Pa; and the power of 100 W was supplied with the use of a 27.12 MHz high-frequency power source. Note that each of the silicon nitride film and the silicon oxynitride film was formed at a substrate temperature of 350° C.

Next, an oxide semiconductor film was formed so as to overlap with the gate electrode with the gate insulating film provided therebetween. Here, an IGZO film which was a CAAC-OS film was formed over the gate insulating film by a sputtering method, a mask was formed over the IGZO film by a photolithography process, and the IGZO film was partly etched using the mask. Then, the etched IGZO film was subjected to heat treatment, so that the oxide semiconductor film was formed. Note that the IGZO film formed in this example has a thickness of 35 nm.

The IGZO film was formed under the following conditions: a sputtering target containing In, Ga, and Zn at an atomic ratio of 1:1:1 was used; argon with a flow rate of 50 sccm and oxygen with a flow rate of 50 sccm were supplied as a sputtering gas to a treatment chamber of a sputtering apparatus; the pressure in the treatment chamber was controlled to be 0.6 Pa; and the direct current power of 5 kW was supplied. Note that the IGZO film was formed at a substrate temperature of 170° C.

Next, water, hydrogen, and the like contained in the oxide semiconductor film were released by heat treatment. Here, heat treatment at 450° C. for one hour in a nitrogen atmosphere was performed, and then heat treatment at 450° C. for one hour in an atmosphere of nitrogen and oxygen was performed.

Then, a conductive film was formed over the gate insulating film and the oxide semiconductor film, a mask was formed over the conductive film by a photolithography process, and the conductive film was partly etched using the mask, so that a source electrode and a drain electrode were formed. Note that as the conductive film to be the source electrode and the drain electrode, a 400-nm-thick aluminum film was formed over a 50-nm-thick tungsten film, and a 100-nm-thick titanium film was formed over the aluminum film.

Next, after the substrate was moved to a treatment chamber under reduced pressure and heated at 220° C., the substrate was moved to a treatment chamber filled with dinitrogen monoxide. Then, the oxide semiconductor film was exposed to oxygen plasma which was generated in such a manner that an upper electrode provided in the treatment chamber was supplied with a high-frequency power of 150 W with the use of a 27.12 MHz high-frequency power source.

Next, an insulating film was formed in succession over the oxide semiconductor film, the source electrode, and the drain electrode without exposure to the atmosphere after the above plasma treatment. The insulating film was formed using four conditions which are a condition A1, a condition A2, a condition A3, and a condition A4. The sample formed using the condition A1 is referred to as a sample A1. The sample formed using the condition A2 is referred to as a sample A2. The sample formed using the condition A3 is referred to as a sample A3. The sample formed using the condition A4 is referred to as a sample A4. The samples A1 to A4 each have the insulating film with a thickness of 400 nm.

In the condition 1, a silicon oxynitride film was used as the insulating film. The silicon oxynitride film was formed by a plasma CVD method under the following conditions: silane with a flow rate of 30 sccm and dinitrogen monoxide with a flow rate of 4000 sccm were used as the source gas; the pressure in a treatment chamber was 40 Pa; the substrate temperature was 220° C.; and a high-frequency power of 150 W was supplied to parallel plate electrodes. Note that when the entire film was measured by XRR, the film density was 2.26 g/cm$^3$.

In the condition 2, a silicon oxynitride film was used as the insulating film. The silicon oxynitride film was formed by a plasma CVD method under the following conditions: silane with a flow rate of 160 sccm and dinitrogen monoxide with a flow rate of 4000 sccm were used as the source gas; the pressure in a treatment chamber was 200 Pa; the substrate temperature was 220° C.; and a high-frequency power of 1500 W was supplied to parallel plate electrodes. Note that when the entire film was measured by XRR, the film density was 2.31 g/cm$^3$.

In the condition 3, a silicon nitride film was used as the insulating film. The silicon nitride film was formed by a plasma CVD method under the following conditions: silane with a flow rate of 50 sccm, nitrogen with a flow rate of 5000 sccm, and ammonia with a flow rate of 100 sccm were used as the source gas; the pressure in a treatment chamber was 200 Pa; the substrate temperature was 220° C.; and a high-frequency power of 1000 W was supplied to parallel plate electrodes. Note that when the entire film was measured by XRR, the film density was 2.50 g/cm$^3$.

In the condition 4, a silicon nitride film was used as the insulating film. The silicon nitride film was formed by a plasma CVD method under the following conditions: silane with a flow rate of 200 sccm, nitrogen with a flow rate of 2000 sccm, and ammonia with a flow rate of 100 sccm were used as the source gas; the pressure in a treatment chamber was 200 Pa; the substrate temperature was 350° C.; and a high-frequency power of 2000 W was supplied to parallel plate electrodes. Note that when the entire film was measured by XRR, the film density was 2.72 g/cm$^3$.

Figure 16A:
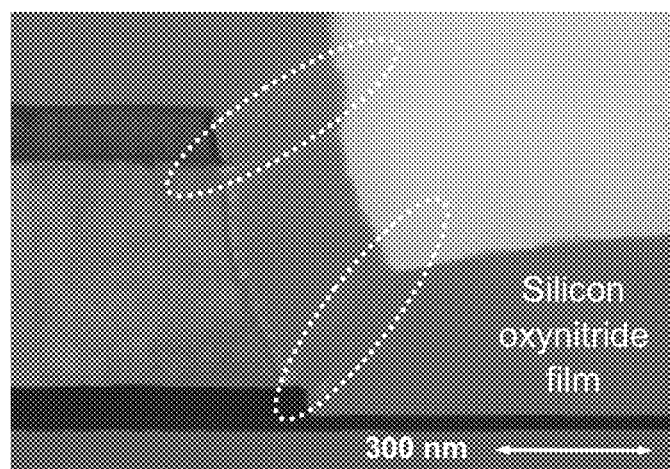
FIGS. 16A and 16B show STEM images of example samples in Example.

Cross sections of the samples A1 to A4 were observed by scanning transmission electron microscopy (STEM). FIG. 16A shows a STEM image of the sample A1, FIG. 16B shows a STEM image of the sample A2, FIG. 17A shows a STEM image of the sample A3, and FIG. 17B shows a STEM image of the sample A4.

Figure 16B:
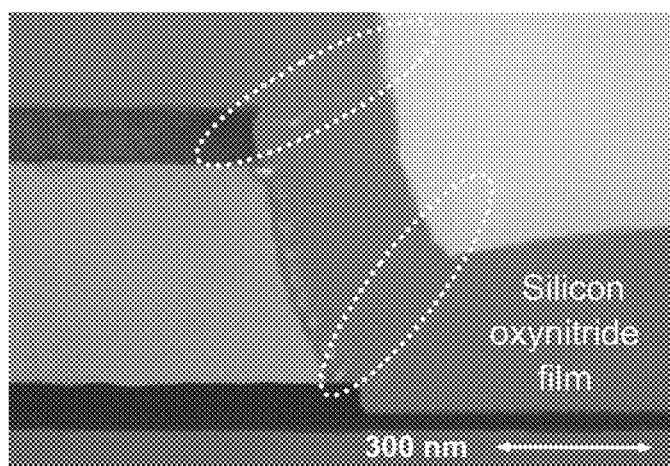
Figure 17A:
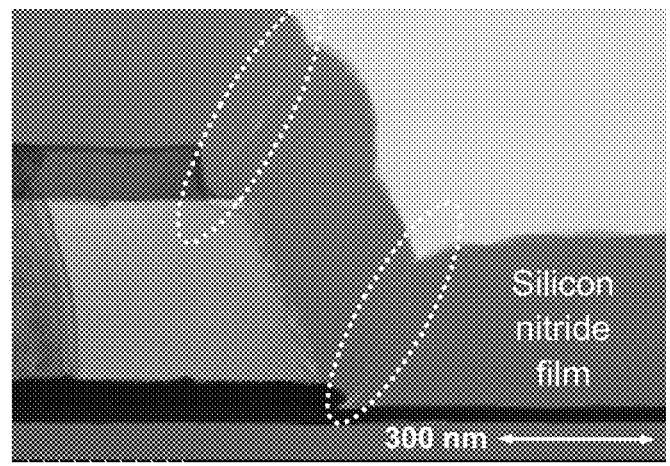
FIGS. 17A and 17B show STEM images of example samples in Example.
Figure 17B:
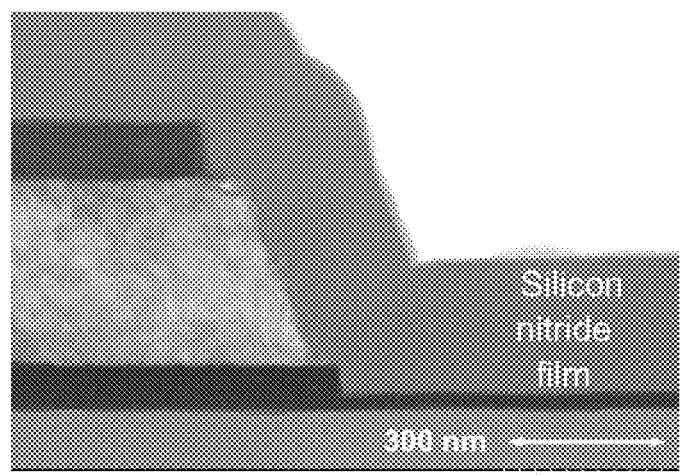

As illustrated in FIGS. 16A and 16B and FIG. 17A, it was observed that a void portion is generated in a portion surrounded by a dotted line in the insulating film covering the source electrode and the drain electrode. On the other hand, in FIG. 17B, generation of a void portion in the insulating film covering the source electrode and the drain electrode was not observed.

Thus, it was shown that in the samples A1 to A4, a void portion is generated in the insulating film covering the source electrode and the drain electrode when the film density is higher than or equal to 2.26 g/cm$^3$ and lower than or equal to 2.50 g/cm$^3$.

Example 2

In this example, measurement results of characteristics of a transistor in which a nitride insulating film is formed over an oxide insulating film are described.

First, a method for manufacturing a transistor of an example sample is described.

In this example, a gate electrode, a gate insulating film, and an oxide semiconductor film were formed over a glass substrate, and water, hydrogen, and the like contained in the oxide semiconductor film were released by heat treatment as in Example 1. Here, heat treatment at 450° C. for one hour in a nitrogen atmosphere was performed, and then heat treatment at 450° C. for one hour in an atmosphere of nitrogen and oxygen was performed.

Next, a conductive film was formed over the gate insulating film and the oxide semiconductor film, a mask was formed over the conductive film by a photolithography process, and the conductive film was partly etched using the mask, so that a source electrode and a drain electrode were formed.

Next, after the substrate was moved to a treatment chamber under reduced pressure and heated at 220° C., the substrate was moved to a treatment chamber filled with dinitrogen monoxide. Then, the oxide semiconductor film was exposed to oxygen plasma which was generated in such a manner that an upper electrode provided in the treatment chamber was supplied with a high-frequency power of 150 W with the use of a 27.12 MHz high-frequency power source.

Example 1 can be referred to for the steps up to here.

Next, the insulating film was formed in succession over the oxide semiconductor film, the source electrode, and the drain electrode without exposure to the atmosphere after the above plasma treatment. The insulating film has a stacked-layer structure in which a nitride insulating film is formed over an oxide insulating film. The oxide insulating film was formed by stacking a 50-nm-thick first silicon oxynitride film and a 400-nm-thick second silicon oxynitride film.

The first silicon oxynitride film was formed by a plasma CVD method under the following conditions: silane with a flow rate of 30 sccm and dinitrogen monoxide with a flow rate of 4000 sccm were used as the source gas; the pressure in a treatment chamber was 40 Pa; the substrate temperature was 220° C.; and a high-frequency power of 150 W was supplied to parallel plate electrodes.

The second silicon oxynitride film was formed by a plasma CVD method under the following conditions: silane with a flow rate of 160 sccm and dinitrogen monoxide with a flow rate of 4000 sccm were used as the source gas; the pressure in a treatment chamber was 200 Pa; the substrate temperature was 220° C.; and a high-frequency power of 1500 W was supplied to parallel plate electrodes. Under the above conditions, it is possible to form a silicon oxynitride film which contains more oxygen than in the stoichiometric composition and from which part of oxygen is released by heating.

Next, water, hydrogen, and the like contained in the oxide insulating film were released by heat treatment. Here, the heat treatment was performed at 350° C. under a mixed atmosphere of nitrogen and oxygen for one hour.

Next, a nitride insulating film was formed over the oxide insulating film. As the nitride insulating film, a 50-nm-thick silicon nitride film was formed. The silicon nitride film was formed by a plasma CVD method under the following conditions: silane with a flow rate of 200 sccm, nitrogen with a flow rate of 2000 sccm, and ammonia with a flow rate of 100 sccm were used as the source gas; the pressure in a treatment chamber was 100 Pa; the substrate temperature was 350° C.; and a high-frequency power of 2000 W was supplied to parallel plate electrodes.

Next, a part of the insulating film (the oxide insulating film and the nitride insulating film) was etched and an opening exposing a part of the source electrode or the drain electrode was formed.

Next, an interlayer insulating film was formed over the insulating film (the nitride insulating film). Here, the nitride insulating film was coated with a composition, and exposure and development were performed, so that the interlayer insulating film having an opening through which a part of the source electrode or the drain electrode is exposed was formed from the composition. Note that a 1.5-μm-thick acrylic resin was formed as the interlayer insulating film. After that, heat treatment was performed. The heat treatment was performed at a temperature of 250° C. in a nitrogen atmosphere for one hour.

Next, a conductive film, which is connected to a part of the source electrode or the drain electrode, was formed. Here, a 100-nm-thick ITO film containing silicon oxide was formed by a sputtering method.

Through the above steps, the transistor of the example sample was manufactured.

Further, as a comparative example, a transistor in a comparative sample, in which only an oxide insulating film is formed as an insulating film and a nitride insulating film is not formed, was manufactured.

Figure 18A:
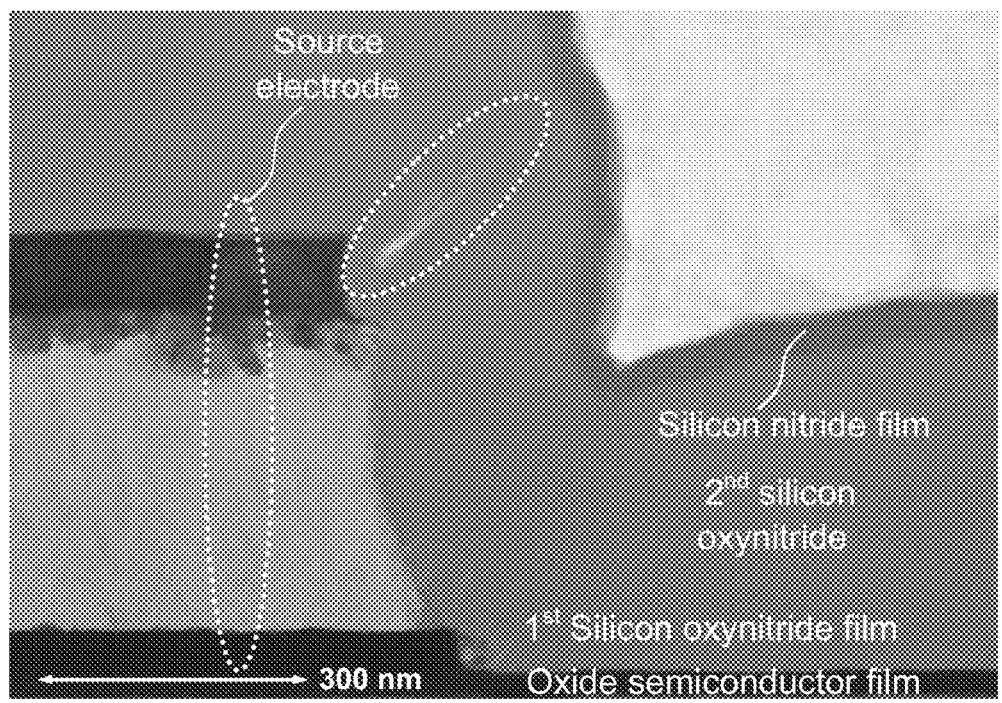
FIGS. 18A and 18B show STEM images of example samples in Example.

Cross sections of the example sample and the comparative sample were observed by scanning transmission electron microscopy (STEM). FIG. 18A shows a STEM image of the example sample and FIG. 18B shows a STEM image of the comparative sample.

Figure 18B:
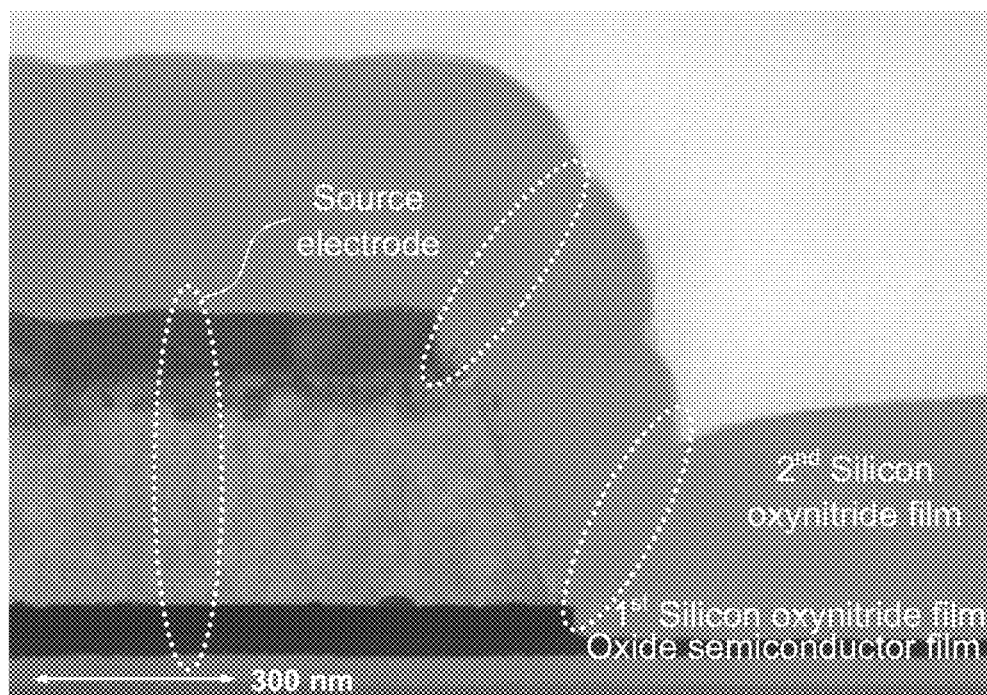

As illustrated in FIGS. 18A and 18B, it was observed that a void portion is generated in a portion surrounded by a dotted line in the first silicon oxynitride film and the second silicon oxynitride film which cover the source electrode and the drain electrode. Further, as illustrated in FIG. 18A, a void portion is not generated in the silicon nitride film over the second silicon oxynitride film. It was found that the void portion in the first silicon oxynitride film and the second silicon oxynitride film is covered with the silicon nitride film.

Next, Vg-Id characteristics of the transistors in the above-described example sample and comparative sample were measured.

A pressure cooker test (PCT) was performed as the accelerated life test to evaluate moisture resistance. In the PCT in this example, the example sample and the comparative sample were held for one hour under the following conditions: the temperature was 130° C.; the humidity was 85%; and the pressure was 0.23 MPa.

A gate bias temperature (GBT) stress test was performed on each of the example sample and the comparative sample. In this example, the GBT stress test was performed in a dark environment under the following conditions: Vg=−30 V; Vd=0 V; Vs=0 V; stress temperature=60° C.; no light emission; and stress application time=one hour. The measured values of the channel length (L), the channel width (W), and the thickness of the oxide film (gate insulating film) (Tox) were 6 μm, 50 μm, and 280 nm, respectively.

Figure 19A:
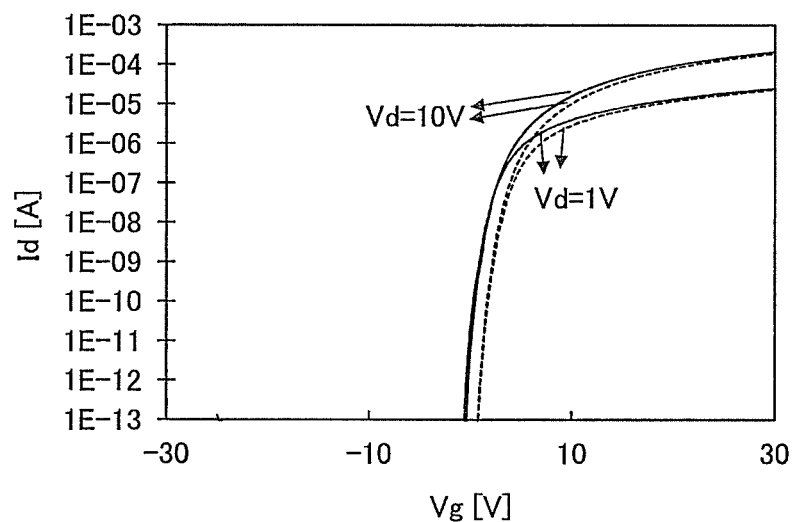
FIGS. 19A and 19B show electrical characteristics of example samples in Example.
Figure 19B:
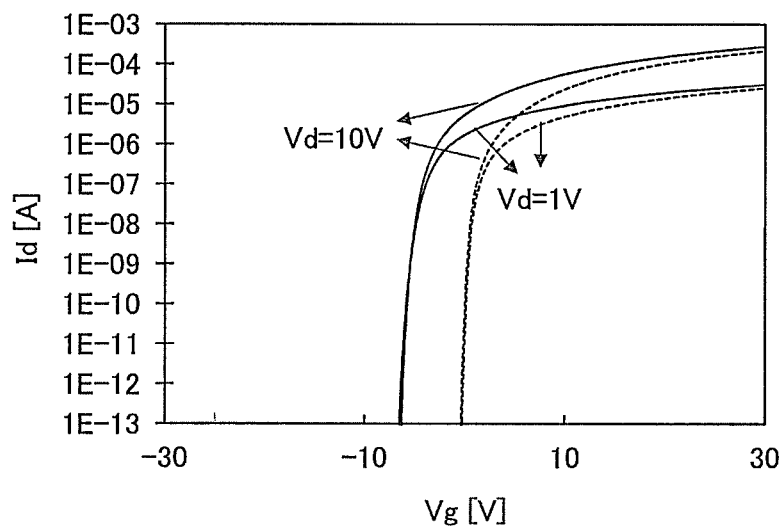

FIG. 19A shows results of the GBT stress test performed on the example sample and FIG. 19B shows results of the GBT stress test performed on the comparative sample. In the graphs, dotted lines indicate results of measurement performed before the PCT and solid lines indicate results of measurement performed after the PCT. In FIGS. 19A and 19B, the measurement results when the drain voltage (Vd: [V]) was set to 1 V and when the drain voltage (Vd: [V]) was set to 10 V are shown, and the horizontal axis indicates a gate voltage (Vg: [V]) and the vertical axis indicates a drain current (Id: [A]). Note that "drain voltage (Vd: [V])" refers to a potential difference between a drain and a source when the potential of the source is used as a reference potential, and "gate voltage (Vg: [V])" refers to a potential difference between a gate and a source when the potential of the source is used as a reference potential.

As shown in FIG. 19A, the transistor in the example sample did not change significantly after the PCT. On the other hand, as shown in FIG. 19B, the transistor in the comparative sample changed significantly after the PCT, and it is found that the threshold value is shifted in the negative direction after the PCT.

The difference between the example sample and the comparative sample is whether or not the silicon nitride film is provided over the second silicon oxynitride film. Thus, it is found that the amount of change in characteristics can be reduced by the effect of the silicon nitride film even after the PCT.

Consequently, by covering the void portion in the silicon oxynitride film with the silicon nitride film, a semiconductor device using an oxide semiconductor can have stable electrical characteristics and high reliability.

Example 3

In this example, measurement results of characteristics of transistors whose nitride insulating films over oxide insulating films were deposited at different temperatures are described.

First, a method for manufacturing a transistor of an example sample is described.

As example samples, a sample in which the deposition temperature of the silicon nitride film in the example sample in Example 2 is 220° C. is referred to as a sample B1 and a sample similar to the example sample in Example 2 (a sample in which the deposition temperature of the silicon nitride film is 350° C.) is referred to as a sample B2.

The silicon nitride film of the sample B1 was formed by a plasma CVD method under the following conditions: silane with a flow rate of 50 sccm, nitrogen with a flow rate of 5000 sccm, and ammonia with a flow rate of 100 sccm were used as the source gas; the pressure in the treatment chamber was 200 Pa; the substrate temperature was 220° C.; and a high-frequency power of 1000 W was supplied to parallel plate electrodes. A formation method of the silicon nitride film in the sample B2 is similar to that in the sample B1 except that the substrate temperature of the silicon nitride film was 350° C.

Next, Vg-Id characteristics of the transistors in the above-described sample B1 and sample B2 were measured.

A pressure cooker test (PCT) was performed as the accelerated life test to evaluate moisture resistance. In the PCT in this example, the sample B1 and the sample B2 were held for one hour under the following conditions: the temperature was 130° C.; the humidity was 85%; and the pressure was 0.20 MPa.

A GBT stress test was performed on each of the sample B1 and the sample B2. In this example, the GBT stress test was performed in a dark environment under the following conditions: Vg=−30 V to 30 V; Vd=0 V; Vs=0 V; stress temperature=60° C.; no light emission; and stress application time=one hour. The measured values of the channel length (L), the channel width (W), and the thickness of the oxide film (gate insulating film) (Tox) were 6 μm, 50 μm, and 280 nm, respectively.

FIG. 20A1 shows results of the GBT stress test performed on the sample B1 before the PCT and FIG. 20A2 shows results of the GBT stress test performed on the sample B1 after the PCT. FIG. 20B1 shows results of the GBT stress test performed on the sample B2 before the PCT and FIG. 20B2 shows results of the GBT stress test performed on the sample B2 after the PCT. In FIGS. 20A1, 20A2, 20B1, and 20B2, the measurement results when the drain voltage (Vd: [V]) was set to 1 V and when the drain voltage (Vd: [V]) was set to 10 V are shown, and the horizontal axis indicates a gate voltage (Vg: [V]) and the vertical axis indicates a drain current (Id: [A]) and a field effect mobility (μFE [cm$^2$/Vs]). In FIGS. 20A3 and 20B3, amounts of variation in threshold voltage (ΔVth) and amounts of variation in shift value (ΔShift) between before and after the PCT in the samples B1 and B2 are shown.

In this specification, in a curve where the horizontal axis indicates the gate voltage (Vg: [V]) and the vertical axis indicates the square root of drain current (Id$^{(1/2)}$: [A]), the threshold voltage (Vth) is defined as a gate voltage at a point of intersection of an extrapolated tangent line of Id$^{(1/2)}$ having the highest inclination with the Vg axis (i.e., d$^{(1/2)}$ of 0 A). Note that in this specification, the threshold voltage is calculated with a drain voltage Vd of 10 V.

In this specification, in a curve where the horizontal axis indicates the gate voltage (Vg: [V]) and the vertical axis indicates the logarithm of drain current (Id: [A]), the shift value (Shift) is defined as a gate voltage at a point of intersection of an extrapolated tangent line of Id having the highest inclination with a straight line of Id=1.0×10$^{-12}$ [A]. Note that in this specification, the shift value is calculated with a drain voltage Vd of 10 V.

As shown in FIGS. 20A3 and 20B3, it is found that the threshold voltage and the shift value of the transistors in the samples B1 and B2 slightly vary after the PCT and the transistors deteriorate. Further, it is found that the amount of change in threshold voltage and shift value of the transistor in the sample B2 (in which the deposition temperature of the silicon nitride film is 350° C.) is smaller than in the sample B1 (in which the deposition temperature of the silicon nitride film is 220° C.).

Example 4

In this example, results of Rutherford backscattering spectrometry (RBS) analysis and results of the evaluation by secondary ion mass spectrometry (SIMS) which are performed on a silicon nitride film which is part of an insulating film are described.

First, samples which were analyzed are described.

Figure 21:
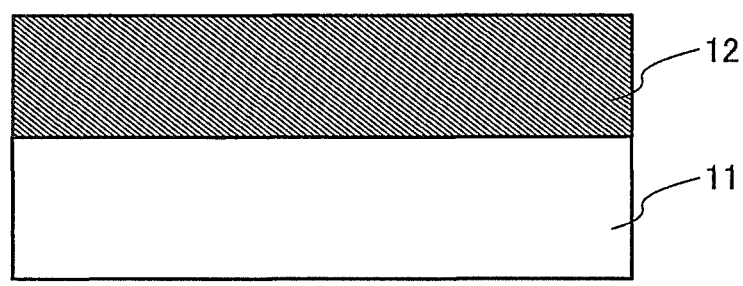
FIG. 21 shows an example sample in Example.

The sample was manufactured by forming a silicon nitride film 12 over a silicon wafer 11 by a plasma CVD method (see FIG. 21). The silicon nitride film 12 was formed using two conditions which are a condition C1 and a condition C2. The sample formed using the condition C1 is referred to as a sample C1. The sample formed using the condition C2 is referred to as a sample C2.

In the condition C1, the silicon nitride film 12 with a thickness of 100 nm was formed by a plasma CVD method under the following conditions: the temperature at which the silicon wafer 11 was held was 220° C.; silane with a flow rate of 50 sccm, nitrogen with a flow rate of 5000 sccm, and ammonia with a flow rate of 100 sccm were used as the source gas; the pressure in a treatment chamber was 200 Pa; and a high-frequency power of 1000 W was supplied to parallel plate electrodes.

In the condition C2, the silicon nitride film 12 with a thickness of 300 nm was formed by a plasma CVD method under the following conditions: the temperature at which the silicon wafer 11 was held was 350° C.; silane with a flow rate of 200 sccm, nitrogen with a flow rate of 2000 sccm, and ammonia with a flow rate of 100 sccm were used as the source gas; the pressure in a treatment chamber was 200 Pa; and a high-frequency power of 2000 W was supplied to parallel plate electrodes.

Then, the sample C1 and the sample C2 were evaluated. The results of RBS are shown in Table 1.

TABLE 1

| Silicon nitride film formation temperature | | 220° C. | 350° C. |
|---|---|---|---|
| Composition [%] | Si | 26.5% | 40.0% |
| | N | 45.5% | 49.2% |
| | H | 28.1% | 10.8% |
| RBS density [g/cm$^3$] | | 2.1 | 2.6 |

In the sample C1, silicon, nitrogen, and hydrogen are contained at 26.5 atomic %, 45.5 atomic %, and 28.1 atomic %, respectively. In the sample C2, silicon, nitrogen, and hydrogen are contained at 40.0 atomic %, 49.2 atomic %, and 10.8 atomic %, respectively. Thus, the proportion of hydrogen in the sample C2 is lower than in the sample C1.

Figure 22A:
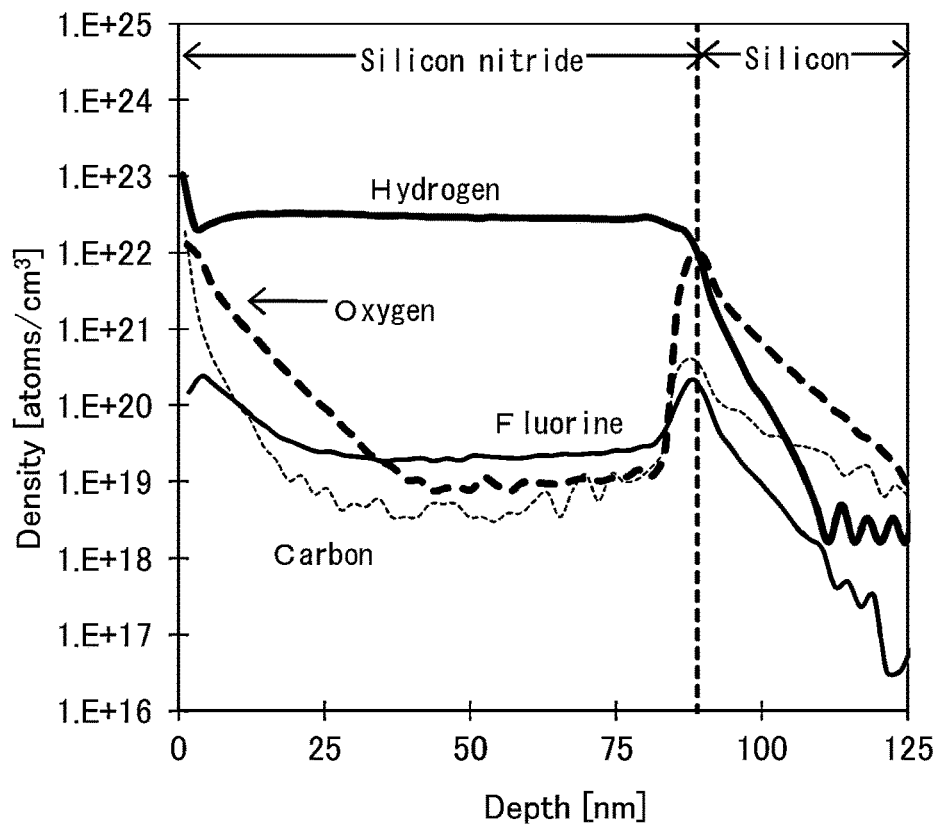
FIGS. 22A and 22B show SIMS data of example samples in Example.
Figure 22B:
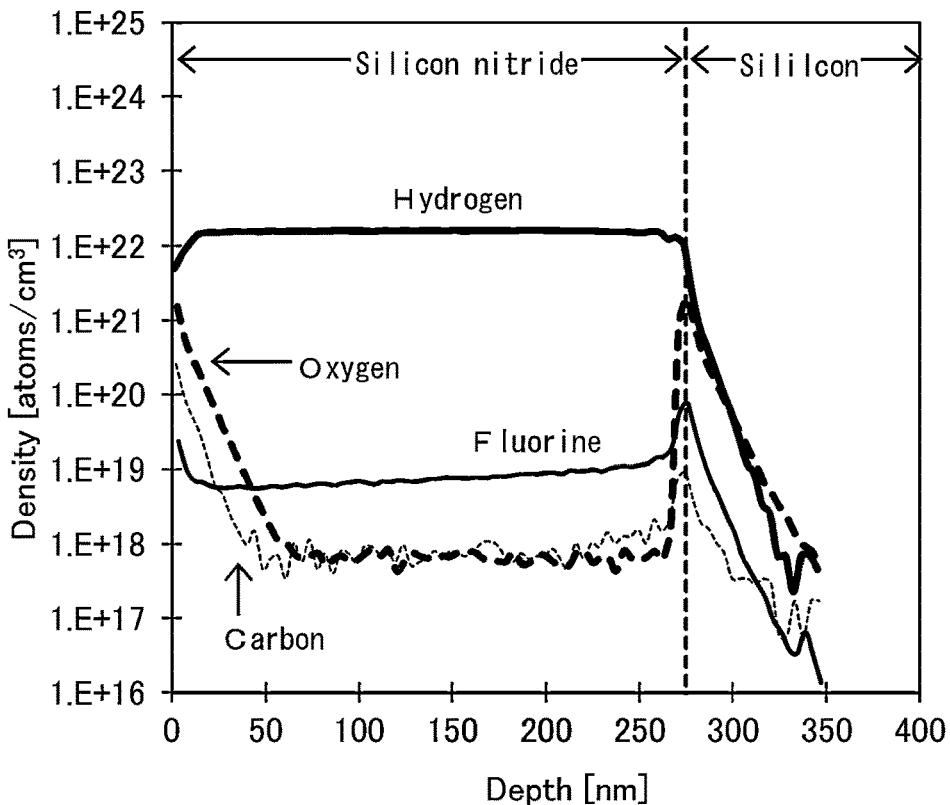

Next, FIGS. 22A and 22B show SIMS analysis results.

FIG. 22A shows concentration profiles of hydrogen, oxygen, fluorine, and carbon in the sample C 1 obtained by SIMS and FIG. 22B shows concentration profiles of hydrogen, oxygen, fluorine, and carbon in the sample C2 obtained by SIMS.

Further, details of results of SIMS analysis in FIGS. 22A and 22B are shown in Table 2.

TABLE 2

| Atom density in the silicon nitride film [atoms/cm$^3$] | | | |
|---|---|---|---|
| Silicon nitride film formation temperature | | 220° C. | 350° C. |
| Quantitative elemental analysis results. | H | 2.8 × 10$^{22}$ | 1.6 × 10$^{22}$ |
| | O | 1.0 × 10$^{19}$ | 6.8 × 10$^{17}$ |
| | F | 2.3 × 10$^{19}$ | 7.4 × 10$^{18}$ |
| | C | 5.5 × 10$^{18}$ | 7.4 × 10$^{17}$ |

In the sample C1, hydrogen, oxygen, fluorine, and carbon are contained at 2.8×10$^{22}$ atoms/cm$^3$, 1.0×10$^{19}$ atoms/cm$^3$, 2.3×10$^{19}$ atoms/cm$^3$, and 5.5×10$^{18}$ atoms/cm$^3$, respectively. In the sample C2, hydrogen, oxygen, fluorine, and carbon are contained at 1.6×10$^{22}$ atoms/cm$^3$, 6.8×10$^{17}$ atoms/cm$^3$, 7.4×10$^{18}$ atoms/cm$^3$, and 7.4×10$^{17}$ atoms/cm$^3$, respectively. Thus, like the results of RBS, the results of SIMS analysis indicate that the proportion of hydrogen in the sample C2 is lower than in the sample C1. Further, the concentration of impurities such as hydrogen, oxygen, fluorine, and carbon in the sample C2 is lower than in the sample C1.

Example 5

In this example, verification was conducted to see whether a void portion generated in an insulating film becomes a path through which water, hydrogen, or the like enters. As a method for verification, SIMS was used.

Figure 23A:
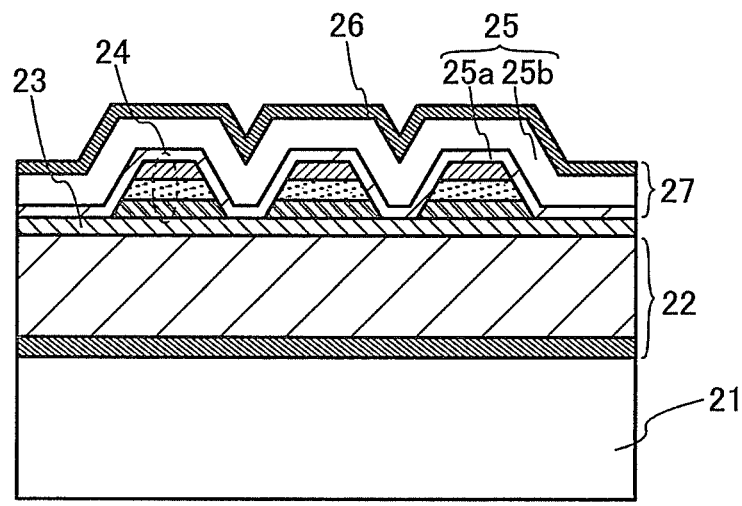
FIGS. 23A and 23B illustrate example samples in Example.
Figure 23B:
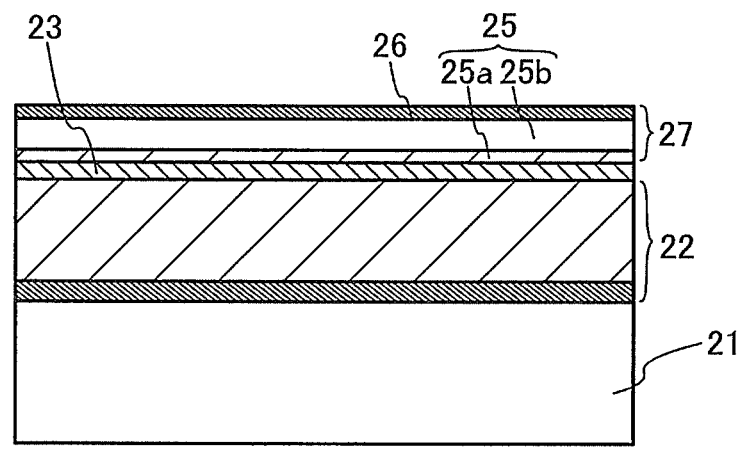

First, samples are described with reference to FIGS. 23A and 23B. Two kinds of samples were prepared: a sample D1 in FIG. 23A, in which a void portion is generated by providing an electrode over an oxide semiconductor film; and a sample D2 in FIG. 23B, in which a void portion is not generated because the electrode is not provided over an oxide semiconductor film.

A gate insulating film 22 and an oxide semiconductor film 23 were formed over a glass substrate 21, and water, hydrogen, and the like contained in the oxide semiconductor film 23 were released by heat treatment. Here, heat treatment at 450° C. for one hour in a nitrogen atmosphere was performed, and then heat treatment at 450° C. for one hour in an atmosphere of nitrogen and oxygen was performed.

Next, a conductive film was formed over the gate insulating film 22 and the oxide semiconductor film 23, a mask was formed over the conductive film by a photolithography process, and the conductive film was partly etched using the mask, so that electrodes 24 were formed.

Next, after the substrate was moved to a treatment chamber under reduced pressure and heated at 220° C., the substrate was moved to a treatment chamber filled with dinitrogen monoxide. Then, the oxide semiconductor film was exposed to oxygen plasma which was generated in such a manner that an upper electrode provided in the treatment chamber was supplied with a high-frequency power of 150 W with the use of a 27.12 MHz high-frequency power source.

Example 1 can be referred to for the steps up to here.

Next, the insulating film 27 was formed in succession over the oxide semiconductor film 23 and electrodes 24 without exposure to the atmosphere after the above plasma treatment. The insulating film 27 has a stacked-layer structure in which a nitride insulating film 26 is formed over an oxide insulating film 25. The oxide insulating film 25 was formed by stacking a 50-nm-thick first silicon oxynitride film 25*a* and a 400-nm-thick second silicon oxynitride film 25*b*.

The first silicon oxynitride film 25*a* was formed by a plasma CVD method under the following conditions: silane with a flow rate of 30 sccm and dinitrogen monoxide with a flow rate of 4000 sccm were used as the source gas; the pressure in a treatment chamber was 40 Pa; the substrate temperature was 220° C.; and a high-frequency power of 150 W was supplied to parallel plate electrodes.

The second silicon oxynitride film 25*b* was formed by a plasma CVD method under the following conditions: silane with a flow rate of 160 sccm and dinitrogen monoxide with a flow rate of 4000 sccm were used as the source gas; the pressure in a treatment chamber was 200 Pa; the substrate temperature was 220° C.; and a high-frequency power of 1500 W was supplied to parallel plate electrodes. Under the above conditions, it is possible to form a silicon oxynitride film which contains more oxygen than in the stoichiometric composition and from which part of oxygen is released by heating.

Next, water, hydrogen, and the like contained in the oxide insulating film were released by heat treatment. Here, the heat treatment was performed at 350° C. under a mixed atmosphere of nitrogen and oxygen for one hour.

Next, a nitride insulating film 26 was formed over the oxide insulating film 25. As the nitride insulating film 26, a 50-nm-thick silicon nitride film was formed. The silicon nitride film was formed by a plasma CVD method under the following conditions: silane with a flow rate of 50 sccm, nitrogen with a flow rate of 5000 sccm, and ammonia with a flow rate of 100 sccm were used as the source gas; the pressure in a treatment chamber was 200 Pa; the substrate temperature was 220° C.; and a high-frequency power of 2000 W was supplied to parallel plate electrodes.

In this manner, the sample D1 was manufactured. Further, the sample D2 in which the electrode is not formed was manufactured (see FIGS. 23A and 23B).

A pressure cooker test (PCT) was performed on the samples D1 and D2. In the PCT in this example, the sample D1 and the sample D2 were held for 15 hours under the following conditions: the temperature was 130° C.; the humidity was 85% (the volume ratio of water to deuterated water of water vapor contained in a gas is $H_2O$ (water):$D_2O$ (deuterated water)=4:1); and the atmospheric pressure was 2.0 atm (0.20 MPa).

In this example, a "D atom", e.g., deuterated water, expresses a hydrogen atom with a mass number of 2 ($^2H$).

As SIMS analysis, substrate side depth profile (SSDP)-SIMS (SIMS measurement from a back side) was used to measure concentrations of an H atom and a D atom in the sample D1 and the sample D2 after the PCT.

Figure 24A:
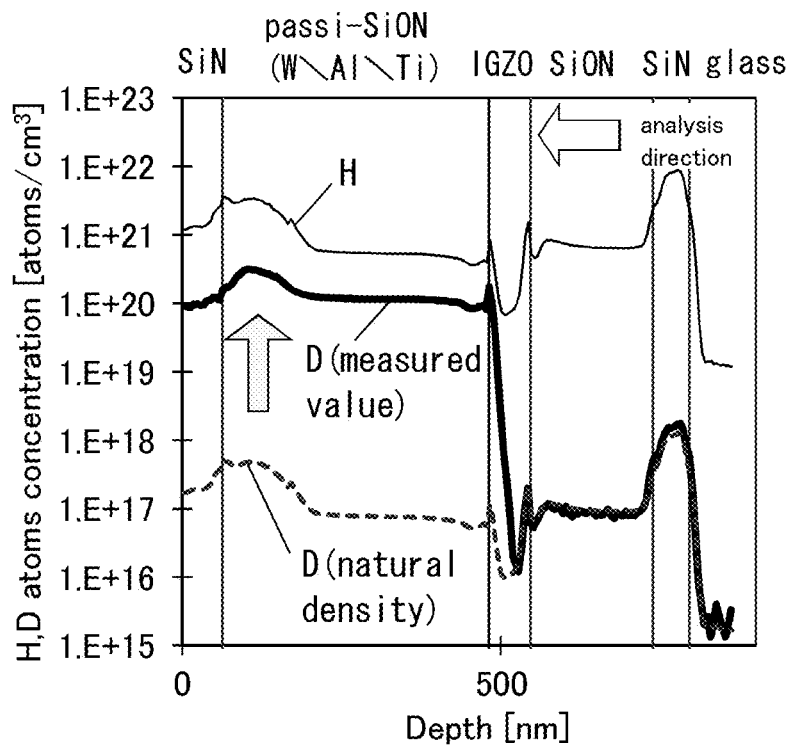
FIGS. 24A and 24B show SIMS data of example samples in Example.
Figure 24B:
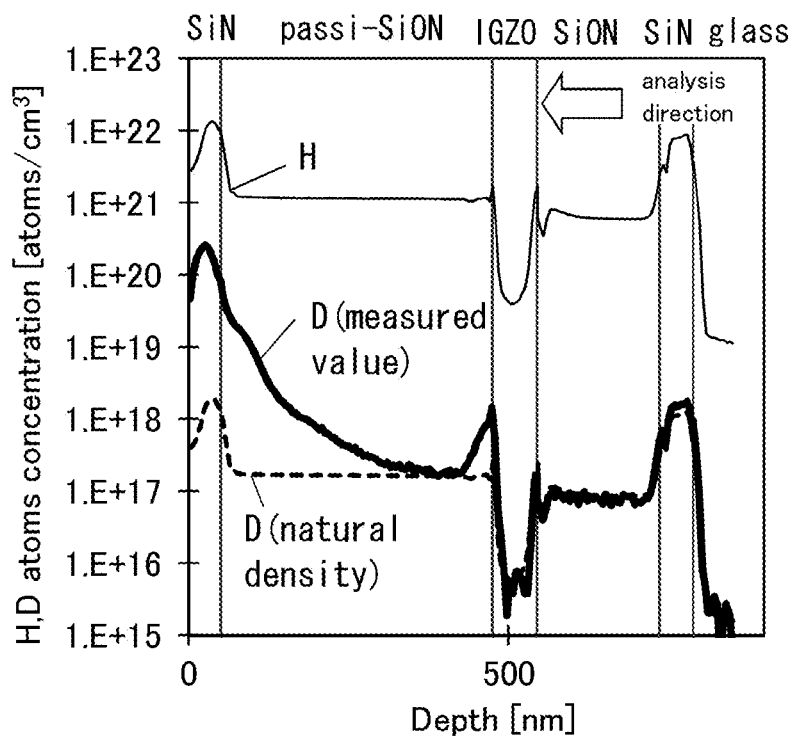

FIG. 24A shows H-atom and D-atom concentration profiles obtained by SIMS after the PCT in the sample D1 and FIG. 24B shows H-atom and D-atom concentration profiles obtained by SIMS after the PCT in the sample D2. In FIGS. 24A and 24B, a D-atom (natural density) concentration profile is a calculated concentration profile of the D atom existing in nature, which was obtained using the H-atom concentration profile on the assumption that the abundance ratio of the D atom thereto is 0.015%. Therefore, the amount of the D atom mixed into the sample by the PCT equals the difference between the measured D atom concentration and the natural D atom density.

Comparing the samples D1 and D2, as shown in FIG. 24A, it is found that the measured D-atom concentration profile in the oxide semiconductor film greatly increases owing to a void portion generated by providing an electrode over the oxide semiconductor film, so that a large number of D atoms enter the oxide semiconductor film. Therefore, it is confirmed that the sample D1 has a low barrier property with respect to water ($H_2O$ and $D_2O$) from the outside.

EXPLANATION OF REFERENCE

11: silicon wafer, 12: silicon nitride film, 21: glass substrate, 22: gate insulating film, 23: oxide semiconductor film, 24: electrode, 25: oxide insulating film, 25*a*: first silicon oxynitride film, 25*b*: second silicon oxynitride film, 26: nitride insulating film, 27: insulating film, 31: oxide semiconductor film, 32: oxide insulating film, 32*a*: oxide insulating film, 32*b*: oxide insulating film, 400: substrate, 401: base insulating film, 402: gate electrode, 404: gate insulating film, 404*a*: gate insulating film, 404*b*: gate insulating film, 406: semiconductor film, 407*a*: conductive film, 407*b*: conductive film, 407*c*: conductive film, 408*b*: drain electrode, 410: oxide insulating film, 410*a*: oxide insulating film, 410*b*: oxide insulating film, 410*c*: oxide insulating film, 410*d*: oxide insulating film, 410*e*: oxide insulating film, 411: nitride insulating film, 412: insulating film, 413: void portion, 414: interlayer insulating film, 416: electrode, 450: transistor, 510: oxide insulating film, 510*a*: oxide insulating film, 510*b*: oxide insulating film, 511: nitride insulating film, 512: gate insulating film, 530: insulating film, 550: transistor, 552: gate electrode, 560: transistor, 570: transistor, 580: transistor, 601: substrate, 602: photodiode, 606*a*: semiconductor film, 606*b*: semiconductor film, 606*c*: semiconductor film, 608: adhesive layer, 613: substrate, 632: insulating film, 633: planarization film, 634: planarization film, 640: transistor, 641*a*: electrode, 641*b*: electrode, 642: electrode, 643: conductive film, 645: conductive film, 656: transistor, 658: photodiode reset signal line, 659: gate signal line, 671: photo sensor output signal line, 672: photo sensor reference signal line, 901: substrate, 902: pixel portion, 903: signal line driver circuit, 904: scan line driver circuit, 905: sealant, 906: substrate, 908: liquid crystal layer, 910: transistor, 911: transistor, 913: liquid crystal element, 915: connection terminal electrode, 915*a*: connection terminal electrode, 915*b*: connection terminal electrode, 916: terminal electrode, 917: conductive film, 918: FPC, 918*a*: FPC, 918*b*: FPC, 919: anisotropic conductive agent, 921: interlayer insulating film, 922: gate insulating film, 923: insulating film, 924: insulating film, 925: sealant, 930: electrode, 931: electrode, 932: insulating film, 933: insulating film, 935: spacer, 936: sealant, 941: electrode, 943: liquid crystal element, 944: insulating film, 950: silicon nitride film, 951: electrode, 955: connection terminal electrode, 960: partition wall, 963: light-emitting element, 964: filler, 971: source electrode, 973: drain electrode, 975: common potential line, 977: common electrode, 985: common potential line, 987: common electrode, 9000: table, 9001: housing, 9002: leg portion, 9003: display portion, 9004: displayed button, 9005: power cord, 9033: clip, 9034: switch, 9035: power button, 9036: switch, 9038: operation button, 9100: television set, 9101: housing, 9103: display portion, 9105: stand, 9107: display portion, 9109: operation key, 9110: remote controller, 9201: main body, 9202: housing, 9203: display portion, 9204: keyboard, 9205: external connection port, 9206: pointing device, 9630: housing, 9631: display portion, 9631*a*: display portion, 9631*b*: display portion, 9632*a*: region, 9632*b*: region, 9633: solar battery, 9634: charge and discharge control circuit, 9635: battery, 9636: DCDC converter, 9637: converter, 9638: operation key, 9639: button.

This application is based on Japanese Patent Application serial no. 2012-161688 filed with Japan Patent Office on Jul. 20, 2012, the entire contents of which are hereby incorporated by reference.

The invention claimed is:

1. A semiconductor device comprising:
a glass substrate;
a gate electrode over the glass substrate;
a gate insulating film over the gate electrode, the gate insulating film comprising a first insulating layer and a second insulating layer;
an oxide semiconductor film over the second insulating layer;
a source electrode and a drain electrode over and electrically connected to the oxide semiconductor film;
an oxide insulating film over the oxide semiconductor film, the source electrode, and the drain electrode;
a nitride insulating film over the oxide insulating film; and
a pixel electrode over the nitride insulating film,
wherein the oxide semiconductor film comprises a first oxide semiconductor layer, comprising a nanocrystal having a size greater than or equal to 1 nm and less than 10 nm, and a second oxide semiconductor layer, comprising a plurality of crystals whose c-axes are aligned in a direction substantially perpendicular to a formation surface of the second oxide semiconductor layer,
wherein each of the first oxide semiconductor layer and the second oxide semiconductor layer comprises indium, gallium, and zinc,
wherein one of the source electrode and the drain electrode is in contact with a side surface of the oxide semiconductor film,
wherein the pixel electrode is electrically connected to the one of the source electrode and the drain electrode via an opening provided in the oxide insulating film and the nitride insulating film,
wherein the oxide insulating film is in contact with the oxide semiconductor film,
wherein the oxide insulating film comprises a void region, and
wherein the nitride insulating film is in contact with the oxide insulating film and covers the void region of the oxide insulating film.

2. A semiconductor device comprising:
a substrate;
a gate electrode over the substrate;
a gate insulating film over the gate electrode, the gate insulating film comprising a first insulating layer and a second insulating layer;
an oxide semiconductor film over the gate insulating film, the oxide semiconductor film comprising a nanocrystal having a size greater than or equal to 1 nm and less than 10 nm;
a source electrode and a drain electrode over and electrically connected to the oxide semiconductor film;
an oxide insulating film over the oxide semiconductor film, the source electrode, and the drain electrode;
a nitride insulating film over the oxide insulating film; and
a pixel electrode over the nitride insulating film,
wherein the oxide semiconductor film comprises indium, gallium, and zinc,
wherein one of the source electrode and the drain electrode is in contact with a side surface of the oxide semiconductor film,
wherein the pixel electrode is electrically connected to the one of the source electrode and the drain electrode via an opening provided in the oxide insulating film and the nitride insulating film,
wherein the oxide insulating film is in contact with the oxide semiconductor film,
wherein the oxide insulating film comprises a plurality of void regions, and wherein the nitride insulating film is in contact with the oxide insulating film and covers at least one of the plurality of void regions of the oxide insulating film.

3. A semiconductor device comprising:
a glass substrate;
a gate electrode over the glass substrate;
a gate insulating film over the gate electrode, the gate insulating film comprising a first insulating layer and a second insulating layer;
an oxide semiconductor film over the second insulating layer, the oxide semiconductor film comprising a first oxide semiconductor layer having a first crystal state and a second oxide semiconductor layer having a second crystal state different from the first crystal state;
a source electrode and a drain electrode over and electrically connected to the oxide semiconductor film;
an oxide insulating film over the oxide semiconductor film, the source electrode, and the drain electrode;
a nitride insulating film over the oxide insulating film; and
a pixel electrode over the nitride insulating film, wherein each of the first oxide semiconductor layer and the second oxide semiconductor layer comprises indium, gallium, and zinc, wherein one of the source electrode and the drain electrode is in contact with a side surface of the oxide semiconductor film, wherein the pixel electrode is electrically connected to the one of the source electrode and the drain electrode via an opening provided in the oxide insulating film and the nitride insulating film, wherein the oxide insulating film is in contact with the oxide semiconductor film, wherein the oxide insulating film comprises a low-density region and regions with a higher density than the low-density region, wherein the low-density region is surrounded by the regions with a higher density than the low-density region, wherein the nitride insulating film is in contact with the oxide insulating film and covers the low-density region of the oxide insulating film, wherein the oxide insulating film comprises silicon, wherein the nitride insulating film comprises silicon, and wherein, in a cross-sectional view, the pixel electrode overlaps with the oxide semiconductor film.

4. The semiconductor device according to claim 3, wherein the low-density region has a size in the order of several nanometers.

* * * * *